(12) United States Patent
Nagaya et al.

(10) Patent No.: US 10,996,105 B2
(45) Date of Patent: May 4, 2021

(54) OPTICAL FILTER HAVING LOW INCIDENT ANGLE DEPENDENCE OF INCIDENT LIGHT, AMBIENT LIGHT SENSOR, SENSOR MODULE AND ELECTRONIC DEVICE

(71) Applicant: JSR CORPORATION, Tokyo (JP)

(72) Inventors: Katsuya Nagaya, Tokyo (JP); Toshihiro Otsuki, Tokyo (JP); Daisuke Shigeoka, Tokyo (JP); Takashi Tsubouchi, Tokyo (JP)

(73) Assignee: JSR CORPORATION, Tokyo (JP)

( * ) Notice: Subject to any disclaimer, the term of this patent is extended or adjusted under 35 U.S.C. 154(b) by 79 days.

(21) Appl. No.: 15/779,850

(22) PCT Filed: Nov. 28, 2016

(86) PCT No.: PCT/JP2016/085210
§ 371 (c)(1),
(2) Date: May 30, 2018

(87) PCT Pub. No.: WO2017/094672
PCT Pub. Date: Jun. 8, 2017

(65) Prior Publication Data
US 2018/0364095 A1    Dec. 20, 2018

(30) Foreign Application Priority Data

Nov. 30, 2015  (JP) .............................. JP2015-233852
Aug. 25, 2016  (JP) .............................. JP2016-165192

(51) Int. Cl.
*G01J 1/04*    (2006.01)
*G02B 5/26*    (2006.01)
(Continued)

(52) U.S. Cl.
CPC ............ *G01J 1/0488* (2013.01); *G01J 1/0204* (2013.01); *G01J 1/4204* (2013.01); *G01S 7/4816* (2013.01);
(Continued)

(58) Field of Classification Search
CPC ....... G01J 1/0488; G01J 1/0204; G01J 1/4204; G01J 1/0403; G01J 1/02; G01J 1/04;
(Continued)

(56) References Cited

U.S. PATENT DOCUMENTS 9,201,181 B2    12/2015  Shimmo et al.
2006/0051586 A1*  3/2006  Park .................... H01J 11/10
                                                    428/411.1
(Continued)

FOREIGN PATENT DOCUMENTS

CN    103534705    1/2014
CN    103930806    7/2014
(Continued)

OTHER PUBLICATIONS

"Office Action of China Counterpart Application", dated Nov. 15, 2019, with English translation thereof, p. 1-p. 36.
(Continued)

*Primary Examiner* — Jennifer D Bennett
(74) *Attorney, Agent, or Firm* — JCIPRNET

(57) ABSTRACT

One object of the present disclosure is to show an optical filter capable of realizing both an excellent visible light transmittance and an excellent near-infrared ray-shielding performance even if an incident angle becomes large. The optical filter of the present disclosure has a base material (i) including a light absorbing layer, and transmits visible light, wherein the light absorbing layer has a maximum absorption in a wavelength range of 750 nm to 1,150 nm, and in a wavelength range of 850 nm to 1,050 nm, an average OD
(Continued)

value measured in a direction perpendicular to the optical filter is 2.0 or more, and an average OD value measured at an angle of 60° with respect to the direction perpendicular to the optical filter is 2.0 or more.

29 Claims, 12 Drawing Sheets

(51) Int. Cl.
| | |
|---|---|
| G02B 5/28 | (2006.01) |
| G02B 5/22 | (2006.01) |
| G01J 1/02 | (2006.01) |
| H01L 31/0232 | (2014.01) |
| H01L 31/173 | (2006.01) |
| G01S 7/481 | (2006.01) |
| G01J 1/42 | (2006.01) |
| G01S 17/08 | (2006.01) |
| G02B 1/04 | (2006.01) |
| G02B 5/20 | (2006.01) |

(52) U.S. Cl.
CPC ............... *G01S 17/08* (2013.01); *G02B 1/04* (2013.01); *G02B 5/208* (2013.01); *G02B 5/22* (2013.01); *G02B 5/26* (2013.01); *G02B 5/28* (2013.01); *H01L 31/02325* (2013.01); *H01L 31/173* (2013.01)

(58) Field of Classification Search
CPC ...... G01J 1/0271; G01S 7/4816; G01S 17/08; H01L 31/173; H01L 31/02325; H01L 31/02322; H01L 31/02162; H01L 31/0232; G02B 5/22; G02B 5/28; G02B 5/208; G02B 1/04; G02B 5/26; G02B 5/223

See application file for complete search history.

(56) References Cited

U.S. PATENT DOCUMENTS

| | | | |
|---|---|---|---|
| 2009/0081469 A1* | 3/2009 | Oka ................... | C08F 297/026 428/441 |
| 2012/0099188 A1* | 4/2012 | Akozbek ................ | G02B 5/208 359/360 |
| 2012/0170284 A1* | 7/2012 | Shedletsky ......... | G02F 1/13318 362/355 |
| 2012/0243077 A1* | 9/2012 | Osawa ................. | G02B 3/0056 359/356 |
| 2013/0342518 A1* | 12/2013 | Nakata ................ | H04N 5/2351 345/207 |
| 2014/0063597 A1 | 3/2014 | Shimmo et al. | |
| 2014/0091419 A1* | 4/2014 | Hasegawa ........... | G02B 13/004 257/432 |
| 2014/0231633 A1* | 8/2014 | Parodi-Keravec ....... | G01V 8/14 250/216 |
| 2014/0264202 A1* | 9/2014 | Nagaya ................ | G02B 5/208 252/587 |
| 2015/0146057 A1* | 5/2015 | Konishi ................... | G02B 1/04 348/294 |
| 2015/0285971 A1* | 10/2015 | Nagaya ................. | G03B 11/00 348/294 |
| 2016/0011348 A1* | 1/2016 | Hirakoso ............... | G02B 5/206 359/359 |
| 2016/0018576 A1* | 1/2016 | Yamamoto .............. | C09B 49/12 359/359 |

FOREIGN PATENT DOCUMENTS

| | | | | |
|---|---|---|---|---|
| CN | 104364681 | | 2/2015 | |
| CN | 105074513 | | 11/2015 | |
| CN | 106662686 | | 5/2017 | |
| JP | 2002324910 | | 11/2002 | |
| JP | 2006313974 | | 11/2006 | |
| JP | 2010122414 | | 6/2010 | |
| JP | 2011-060788 | | 3/2011 | |
| JP | 2011100084 | | 5/2011 | |
| JP | 2011118255 | | 6/2011 | |
| JP | 2012520559 | | 9/2012 | |
| JP | 2013156460 | | 8/2013 | |
| JP | 2014517391 | | 7/2014 | |
| TW | 201415091 | | 4/2014 | |
| WO | 2005-037932 | | 4/2005 | |
| WO | WO-2014002864 | A1 * | 1/2014 | .......... H04N 5/2254 |
| WO | 2014168189 | | 10/2014 | |

OTHER PUBLICATIONS

"International Search Report (Form PCT/ISA/210)" of PCT/JP2016/085210, dated Feb. 28, 2017, with English translation thereof, pp. 1-4.
Office Action of Japan Counterpart Application, with English translation thereof, dated May 26, 2020, pp. 1-10.
"Office Action of Taiwan Counterpart Application", dated Mar. 16, 2020, with English translation thereof, p. 1-p. 21.
"Office Action of China Counterpart Application", dated Jul. 3, 2020, with English translation thereof, pp. 1-35.
"Office Action of Japan Counterpart Application", dated Sep. 8, 2020, with English translation thereof, pp. 1-8.
"Office Action of Taiwan Counterpart Application", dated Sep. 22, 2020, with English translation thereof, pp. 1-8.
Office Action of China Counterpart Application, with English translation thereof, dated Feb. 2, 2021, pp. 1-14.

* cited by examiner

OPTICAL FILTER HAVING LOW INCIDENT ANGLE DEPENDENCE OF INCIDENT LIGHT, AMBIENT LIGHT SENSOR, SENSOR MODULE AND ELECTRONIC DEVICE

CROSS-REFERENCE TO RELATED APPLICATION

This application is a 371 application of the international PCT application serial no. PCT/JP2016/085210, filed on Nov. 28, 2016, which claims the priority benefits of Japan application no. 2015-233852, filed on Nov. 30, 2015, and Japan application no. 2016-165192, filed on Aug. 25, 2016. The entirety of each of the abovementioned patent applications is hereby incorporated by reference herein and made a part of this specification.

TECHNICAL FIELD

The present invention relates to an optical filter, an ambient light sensor and a sensor module, and particularly, to an optical filter containing a dye compound that has absorption in a specific wavelength range, an ambient light sensor using the optical filter, and a sensor module including the optical filter.

BACKGROUND ART

In recent years, the development of ambient light sensors that are applied to information terminal devices such as smartphones and tablet terminals has progressed. The ambient light sensors in the information terminal devices are used as an illuminance sensor configured to detect an illuminance of an environment in which the information terminal device is placed and dim the brightness of a display, and a color sensor configured to detect a color tone of an environment in which the information terminal device is placed and adjust a color tone of a display.

In order to naturally match human vision sensitivity and a luminance and a color tone of a display, it is important to allow only visible light to reach the ambient light sensor. For example, in the ambient light sensor, when an optical filter such as a near infrared cut filter is installed, spectral sensitivity characteristics thereof are caused to approach those of vision sensitivity.

On the other hand, according to demand for emphasis on design properties of information terminal devices, it is necessary to lower a transmittance of a transmission window through which light passes before it is incident on the ambient light sensor (to darken an external appearance), and there are problems that, when an incident amount of visible light with respect to infrared light decreases, it is difficult to accurately detect an illuminance and a color tone, and an erroneous operation may occur. In addition, with a reduction in height of an information terminal device, a distance from a light incidence window to the ambient light sensor becomes shorter. Therefore, for example, a proportion of incident light from a large incident angle such as an incident angle of 60° is high, and it is necessary for spectral characteristics (in particular, an intensity of near infrared rays) of light that reaches the ambient light sensor not to change even for incident light with a large incident angle.

As a device for matching spectral characteristics of the ambient light sensor and human vision sensitivity, a device including an infrared cut filter in which a metal multilayer film is formed on a glass plate has been disclosed (for example, refer to Patent Literature 1). However, since optical characteristics of a near infrared cut filter in which a metal multilayer thin film is formed on a glass plate greatly change according to an incident angle of incident light, there is a problem of detection accuracy of the ambient light sensor decreasing.

On the other hand, as a material that can cut near infrared rays in a broad band regardless of an incident angle, various near infrared absorbing particles are known (for example, refer to Patent Literature 2 and Patent Literature 3). In order to achieve sufficient near infrared cut performance in an ambient light sensor application using such near infrared absorbing particles, it is necessary to increase an amount of near infrared absorbing particles added. However, in a near infrared cut filter, when an amount of near infrared absorbing particles added increases, there is a problem of a visible light transmittance decreasing.

On the other hand, a near infrared cut filter having a norbornene resin substrate, a near infrared absorbing dye having a maximum absorption at a specific wavelength, and a near infrared reflective film has characteristics that, when light is incident in an oblique direction, a change in transmittance in a visible range is small (refer to Patent Literature 4). When this near infrared cut filter is used in an ambient light sensor application, it is considered desirable to able to further improve infrared cut performance at a large incident angle such as an incident angle of 60°.

CITATION LIST

Patent Literature

[Patent Literature 1]
Japanese Unexamined Patent Application Publication No. 2011-060788
[Patent Literature 2]
WO 2005/037932
[Patent Literature 3]
Japanese Unexamined Patent Application Publication No. 2011-118255
[Patent Literature 4]
Japanese Unexamined Patent Application Publication No. 2011-100084

SUMMARY OF INVENTION

Technical Problem

The present invention provides an optical filter capable of achieving both excellent visible light transmittance and near infrared cut performance even if an incident angle is large with a reduction in height of a device in which various ambient light sensors are provided.

Solution to Problem

[1] An optical filter that includes a base material (i) having a light absorbing layer and transmits visible light,
wherein the light absorbing layer has a maximum absorption in a wavelength range of 750 to 1,150 nm,
wherein, in a wavelength range of 850 to 1,050 nm, an average OD value measured in a direction perpendicular to the optical filter is 2.0 or more, and an average OD value measured at an angle of 60° with respect to the direction perpendicular to the optical filter is 2.0 or more.

[2] The optical filter according to [1], wherein, in a wavelength range of 430 to 580 nm, an average value of transmittance measured in the direction perpendicular to the optical filter is 30% or more and 80% or less.

[3] The optical filter according to [1] or [2], wherein the light absorbing layer contains a compound (S) that has a maximum absorption in a wavelength range of 750 to 1,150 nm.

[4] The optical filter according to [3], wherein the compound (S) is at least one compound selected from the group consisting of a squarylium compound, a phthalocyanine compound, a naphthalocyanine compound, a croconium compound, a cyanine compound, a diimmonium compound, a metal dithiolate compound, a copper phosphate complex-based compound and a pyrrolopyrrole compound.

[5] The optical filter according to any one of [1] to [4], wherein, in a wavelength range of 850 to 1,050 nm, an average OD value measured in a direction perpendicular to the base material (i) is 1.0 or more.

[6] The optical filter according to any one of [1] to [5], wherein the light absorbing layer further contains a compound (A) that has a maximum absorption in a wavelength range of 650 to 750 nm.

[7] The optical filter according to [6], wherein the compound (A) is at least one compound selected from the group consisting of a squarylium compound, a phthalocyanine compound, a naphthalocyanine compound, a croconium compound and a cyanine compound.

[8] The optical filter according to any one of [1] to [7], wherein the light absorbing layer contains at least one resin selected from the group consisting of a cyclic polyolefin resin, an aromatic polyether resin, a polyimide resin, a fluorene polycarbonate resin, a fluorene polyester resin, a polycarbonate resin, a polyamide resin, a polyarylate resin, a polysulfone resin, a polyethersulfone resin, a polyparaphenylene resin, a polyamide imide resin, a polyethylene naphthalate resin, a fluorinated aromatic polymer resin, a (modified) acrylic resin, an epoxy resin, an allyl ester curable resin, a silsesquioxane ultraviolet curable resin, an acrylic ultraviolet curable resin, a vinyl ultraviolet curable resin and a resin containing silica formed by a sol-gel method as a main component.

[9] The optical filter according to any one of [1] to [8], wherein a dielectric multilayer film is provided on at least one surface of the base material (i).

[10] The optical filter according to any one of [1] to [9], wherein the optical filter is for an ambient light sensor.

[11] An ambient light sensor including the optical filter according to any one of [1] to [9].

[12] An ambient light sensor including:

a photoelectric conversion element configured to generate a photocurrent according to light incident on a light receiving surface and measure an illuminance and a color temperature; and the optical filter according to any one of [1] to [9] that is disposed on the side of the light receiving surface of the photoelectric conversion element.

[13] An ambient light sensor including:

a photoelectric conversion element configured to generate a photocurrent according to light incident on a light receiving surface and measure an illuminance and a color temperature; and an optical filter that is disposed on the side of the light receiving surface of the photoelectric conversion element, wherein the optical filter includes a near infrared absorbing layer and a near infrared reflective layer.

[14] The ambient light sensor according to [13], wherein the near infrared absorbing layer is a resin layer containing a near infrared absorbing dye.

[15] The ambient light sensor according to [14], wherein a resin of the resin layer contains at least one resin selected from the group consisting of a cyclic polyolefin resin, an aromatic polyether resin, a polyimide resin, a fluorene polycarbonate resin, a fluorene polyester resin, a polycarbonate resin, a polyamide resin, a polyarylate resin, a polysulfone resin, a polyethersulfone resin, a polyparaphenylene resin, a polyamide imide resin, a polyethylene naphthalate resin, a fluorinated aromatic polymer resin, a (modified) acrylic resin, an epoxy resin, an allyl ester curable resin, a silsesquioxane ultraviolet curable resin, an acrylic ultraviolet curable resin, a vinyl ultraviolet curable resin and a resin containing silica formed by a sol-gel method as a main component.

[16] The ambient light sensor according to [13], wherein the near infrared absorbing layer is a fluorophosphate glass layer or a phosphate glass layer that contains a copper component.

[17] The ambient light sensor according to any one of [13] to [15], wherein the optical filter includes a glass substrate, and the near infrared absorbing layer is provided on at least one surface of the glass substrate.

[18] The ambient light sensor according to any one of [13] to [15], wherein the optical filter includes a resin substrate and the near infrared absorbing layer is provided on at least one surface of the resin substrate.

[19] The ambient light sensor according to any one of [13] to [18], wherein the near infrared reflective layer is a dielectric multilayer film.

[20] The ambient light sensor according to any one of [13] to [19] in which the optical filter has a transmittance that satisfies the following conditions (A) to (C):

(A) in a wavelength range of 430 to 580 nm, an average value of transmittance measured in a direction perpendicular to the optical filter is 50% or more;

(B) in a wavelength range of 800 to 1,000 nm, an average value of transmittance measured in the direction perpendicular to the optical filter is 15% or less; and (C) in a wavelength range of 560 to 800 nm, an absolute value (|Xa−Xb|) of a difference between a value (Xa) of a wavelength at which a transmittance measured in the direction perpendicular to the optical filter becomes 50% and a value (Xb) of a wavelength at which a transmittance measured at an angle of 30° with respect to the direction perpendicular to the optical filter becomes 50% is less than 20 nm.

[21] The ambient light sensor according to any one of [13] to [20], wherein the optical filter has a structure in which the near infrared reflective layer and the near infrared absorbing layer are disposed in that order from the side of a light incident surface.

[22] The ambient light sensor according to any one of [13] to [21], wherein the near infrared absorbing layer has a maximum absorption in a wavelength range of 750 to 1,150 nm, and wherein, in a wavelength range of 850 to 1,050 nm, an average OD value measured in the direction perpendicular to the optical filter is 2.0 or more, and an average OD value measured at an angle of 60° with respect to the direction perpendicular to the optical filter is 2.0 or more.

[23] The ambient light sensor according to any one of [12] to [22], further including
a proximity sensor that includes a light emitting element configured to emit near infrared rays and a second photoelectric conversion element configured to detect near infrared rays.

[24] The ambient light sensor according to any one of [11] to [23], further including a light scattering film.

[25] A sensor module including the optical filter according to any one of [1] to [10].

[26] An electronic device including the ambient light sensor according to any one of [11] to [24].

Advantageous Effects of Invention

According to the present invention, it is possible to provide an optical filter which has high visible light transmittance and near infrared cut performance for both incident light in a perpendicular direction and incident light in an oblique direction and can be suitably used for an ambient light sensor application. An ambient light sensor using such an optical filter has low dependence to incident angle of incident light and can measure an illuminance and a color temperature with high accuracy.

DESCRIPTION OF EMBODIMENTS

Figure 1:
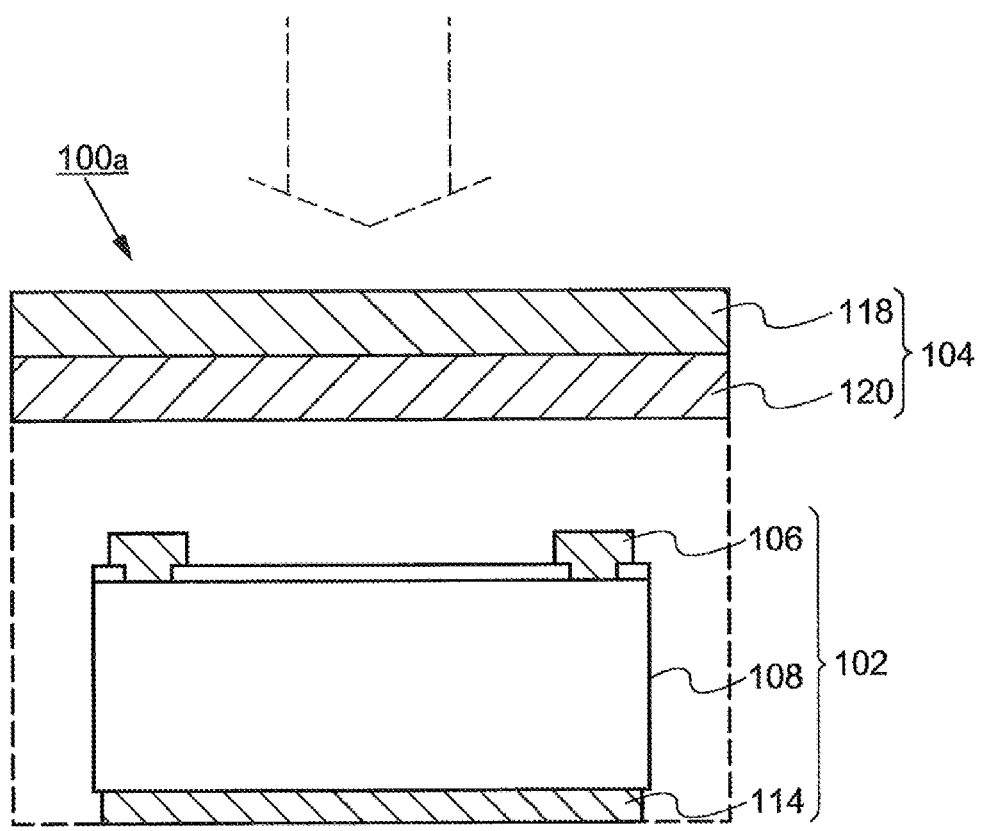
FIG. 1 is a diagram showing a configuration of an ambient light sensor according to an embodiment of the present invention.

Embodiments of the present invention will be described below with reference to the drawings as necessary. However, the present invention can be realized in many different forms, and should not be regarded as being limited to the details of description of the embodiments exemplified below. In order for clearer descriptions, widths, thicknesses, shapes and the like of components are schematically shown in the drawings compared with actual forms in some cases, but these are only examples, and do not limit the interpretation of the present invention. In addition, in this specification and drawings, elements similar to those described previously with reference to preceding drawings are denoted with the same reference numerals or signs similar thereto (reference numerals with A, B following numerals), and detailed descriptions may be appropriately omitted.

In this specification, "above" indicates a relative position based on a main surface (light receiving surface of a sensor) of a support substrate, and a direction away from the main surface of the support substrate is "up." In the drawings in this specification, the upper side of the plane of the paper is directed "up." In addition, "above" includes contact with an upper surface of an object (that is, "on") and positioning above an object (that is, "over"). Conversely, "down" indicates a relative position based on the main surface of the support substrate and a direction of approaching the main surface of the support substrate is "down." In the drawings in this specification, the side below the plane of the paper is directed "down."

An optical filter of the present invention has a configuration to be described below, and an application thereof is not particularly limited, but it is suitable for an ambient light sensor. The ambient light sensor of the present invention is not particularly limited as long as it includes an optical filter to be described below. As a specific configuration, a configuration including a photoelectric conversion element configured to generate a photocurrent according to light incident on a light receiving surface and measure an illuminance and a color temperature and an optical filter that is disposed on the side of the light receiving surface of the photoelectric conversion element may be exemplified.

Hereinafter, the optical filter of the present invention will be described as a first form (hereinafter referred to as a "first optical filter") and a second form (hereinafter referred to as a "second optical filter") separately. However, regarding the configuration and the like common to both forms, descriptions related to one form can be applied to the other form as long as the effects of the present invention are not impaired. Here, when "an optical filter of the present invention" is simply described, this in principle includes both the first optical filter and the second optical filter.

[First Optical Filter]

The first optical filter according to the present invention is an optical filter that includes a base material (i) having a light absorbing layer and transmits visible light. The light absorbing layer has a maximum absorption in a wavelength range of 750 to 1,150 nm. At a wavelength of 850 to 1,050 nm, an average OD value (hereinafter referred to as an "$OD_A$") measured in a direction perpendicular to the optical filter is 2.0 or more, and an average OD value (hereinafter referred to as an "$OD_B$") measured at an angle of 60° with respect to the direction perpendicular to the optical filter is 2.0 or more.

The OD value is a common logarithm value of a transmittance, and can be calculated by the following Formula (1). A higher average OD value in a specified wavelength range indicates that the optical filter has greater cut characteristics for light in that wavelength range.

Average $OD$ value in a certain wavelength range=−$\text{Log}_{10}$(average transmittance (%) in a certain wavelength range/100)   Formula (1)

The $OD_A$ is preferably 2.3 or more and 10 or less, and more preferably 2.5 or more and 9 or less. The $OD_B$ is preferably 2.3 or more and 10 or less, and more preferably 2.5 or more and 9 or less.

In addition, at a wavelength of 850 to 1,050 nm, an average OD value (hereinafter referred to as an "$OD_D$") measured at an angle of 30° with respect to the direction perpendicular to the optical filter is preferably 2.0 or more, more preferably 2.3 or more and 10 or less, and most preferably 2.5 or more and 9 or less.

When the $OD_A$, $OD_B$, and $OD_D$ are 2.0 or more, the optical filter can sufficiently cut not only near infrared rays that are transmitted in the perpendicular direction but also near infrared rays that are transmitted with a large incident angle. When such an optical filter is used in a light sensor of a mobile phone or a tablet, it is possible to prevent an erroneous operation of a screen luminance and color correction function. In particular, in a light sensor module, it is possible to suitably cut near infrared rays even if a light diffusing film is provided above the optical filter of the present invention.

In order to prevent an erroneous operation of the ambient light sensor, it is desirable that changes between an RGB balance of visible light incident in the direction perpendicular to the optical filter, an RGB balance of visible light incident in a direction of 30° with respect to the direction perpendicular to the optical filter, and an RGB balance of visible light incident in a direction of 60° with respect to the direction perpendicular to the optical filter be small. When an R (red) transmittance is set as an average transmittance at a wavelength of 580 to 650 nm, a G (green) transmittance is set as an average transmittance at a wavelength of 500 to 580 nm, and a B (blue) transmittance is set as an average transmittance at a wavelength of 420 to 500 nm, a proportion of the R transmittance, a proportion of the G transmittance, and a proportion of the B transmittance can be derived by the following Formulae (2) to (4).

(Proportion of $R$ transmittance)=($R$ transmittance)× 100/(($R$ transmittance)+($G$ transmittance)+($B$ transmittance))   Formula (2)

(Proportion of $G$ transmittance)=($G$ transmittance)× 100/(($R$ transmittance)+($G$ transmittance)+($B$ transmittance))   Formula (3)

(Proportion of $B$ transmittance)=($B$ transmittance)× 100/(($R$ transmittance)+($G$ transmittance)+($B$ transmittance))   Formula (4)

A value (ratio of change in the proportion of the R transmittance in the case of 0°→30°) obtained by dividing a proportion of the R transmittance measured at an angle of 30° with respect to the direction perpendicular to the optical filter by a proportion of the R transmittance measured from the direction perpendicular to the optical filter can be derived by the following Formula (5).

(Ratio of change in the proportion of the $R$ transmittance in the case of 0°→30°)=(proportion of the $R$ transmittance when light is incident at an angle of 30° with respect to the direction perpendicular to the optical filter)/(proportion of the $R$ transmittance when light is incident from the direction perpendicular to the optical filter)   Formula (5)

The ratio of change in the proportion of the R transmittance in the case of 0°→30° is preferably 0.5 or more and 2.0 or less, more preferably 0.6 or more and 1.8 or less, and most preferably 0.8 or more and 1.4 or less. When the ratio of change approaches 1.0, an incident angle dependent change of the RGB balance is smaller.

In addition, a value (ratio of change in the proportion of the G transmittance in the case of 0°→30°) obtained by dividing a proportion of the G transmittance measured at an angle of 30° with respect to the direction perpendicular to the optical filter by a proportion of the G transmittance measured from the direction perpendicular to the optical filter can be derived by the following Formula (6).

(Ratio of change in the proportion of the $G$ transmittance in the case of 0°→30°)=(proportion of the $G$ transmittance when light is incident at an angle of 30° with respect to the direction perpendicular to the optical filter)/(proportion of the $G$ transmittance when light is incident from the direction perpendicular to the optical filter)   Formula (6)

The ratio of change in the proportion of the G transmittance in the case of 0°→30° is preferably 0.5 or more and 2.0 or less, more preferably 0.6 or more and 1.8 or less, and most preferably 0.8 or more and 1.4 or less. When the ratio of change approaches 1.0, an incident angle dependent change of the RGB balance is smaller.

In addition, a value (ratio of change in the proportion of the B transmittance in the case of 00°→30°) obtained by dividing a proportion of the B transmittance measured at an angle of 30° with respect to the direction perpendicular to the optical filter by a proportion of the B transmittance measured from the direction perpendicular to the optical filter can be derived by the following Formula (7).

(Ratio of change in the proportion of the $B$ transmittance in the case of 0°→30°)=(proportion of the $B$ transmittance when light is incident at an angle of 30° with respect to the direction perpendicular to the optical filter)/(proportion of the $B$ transmittance when light is incident from the direction perpendicular to the optical filter)   Formula (7)

The ratio of change in the proportion of the B transmittance in the case of 0°→30° is preferably 0.5 or more and 2.0 or less, more preferably 0.6 or more and 1.8 or less, and most preferably 0.8 or more and 1.4 or less. When the ratio of change approaches 1.0, an incident angle dependent change of the RGB balance is smaller.

Similarly, a value (ratio of change in the proportion of the R transmittance in the case of 00°→60°) obtained by dividing a proportion of the R transmittance measured at an angle of 60° with respect to the direction perpendicular to the optical filter by a proportion of the R transmittance measured from the direction perpendicular to the optical filter can be derived by the following Formula (8).

(Ratio of change in the proportion of the R transmittance in the case of 0°→60°)=(proportion of the R transmittance when light is incident at an angle of 60° with respect to the direction perpendicular to the optical filter)/(proportion of the R transmittance when light is incident from the direction perpendicular to the optical filter)       Formula (8)

The ratio of change in the proportion of the R transmittance in the case of 0°→60° is preferably 0.4 or more and 2.0 or less, more preferably 0.5 or more and 1.8 or less, and most preferably 0.6 or more and 1.6 or less. When the ratio of change approaches 1.0, an incident angle dependent change of the RGB balance is smaller.

In addition, a value (ratio of change in the proportion of the G transmittance in the case of 0°→60°) obtained by dividing a proportion of the G transmittance measured at an angle of 60° with respect to the direction perpendicular to the optical filter by a proportion of the G transmittance measured from the direction perpendicular to the optical filter can be derived by the following Formula (9).

(Ratio of change in the proportion of the G transmittance in the case of 0°→60°)=(proportion of the G transmittance when light is incident at an angle of 60° with respect to the direction perpendicular to the optical filter/(proportion of the G transmittance when light is incident from the direction perpendicular to the optical filter)        Formula (9)

The ratio of change in the proportion of the G transmittance in the case of 0°→60° is preferably 0.4 or more and 2.0 or less, more preferably 0.5 or more and 1.8 or less, and most preferably 0.6 or more and 1.6 or less. When the ratio of change approaches 1.0, an incident angle dependent change of the RGB balance is smaller.

In addition, a value (ratio of change in the proportion of the B transmittance in the case of 0°→60° obtained by dividing a proportion of the B transmittance measured at an angle of 60° with respect to the direction perpendicular to the optical filter by a proportion of the B transmittance measured from the direction perpendicular to the optical filter can be derived by the following Formula (10).

(Ratio of change in the proportion of the B transmittance in the case of 0°→60°)=(proportion of the B transmittance when light is incident at an angle of 60° with respect to the direction perpendicular to the optical filter)/(proportion of the B transmittance when light is incident from the direction perpendicular to the optical filter)       Formula (10)

The ratio of change in the proportion of the B transmittance in the case of 0°→60° is preferably 0.4 or more and 2.0 or less, more preferably 0.5 or more and 1.8 or less, and most preferably 0.6 or more and 1.6 or less. When the ratio of change approaches 1.0, an incident angle dependent change of the RGB balance is smaller.

When such an optical filter is used in an ambient light sensor of a mobile phone or a tablet, since correction of a screen luminance and color becomes easier, it is possible to solve problems of low visibility due to a luminance of a display is insufficient in a bright environment and a specific color cannot be displayed normally on a screen.

In the first optical filter of the present invention, in a wavelength range of 430 to 580 nm, desirably, an average value (hereinafter referred to as a "$T_A$") of transmittance measured from the direction perpendicular to the optical filter is preferably 30% or more and 80% or less, more preferably 30% or more and 75% or less, and most preferably 33% or more and 70% or less. In addition, in a wavelength range of 430 to 580 nm, desirably, an average value (hereinafter referred to as a "$T_B$") of transmittance measured at an angle of 30° with respect to the direction perpendicular to the optical filter is preferably 30% or more and 80% or less, more preferably 30% or more and 75% or less, and most preferably 33% or more and 70% or less. In addition, in a wavelength range of 430 to 580 nm, desirably, an average value (hereinafter referred to as a "$T_C$") of transmittance measured at an angle of 60° with respect to the direction perpendicular to the optical filter is preferably 20% or more and 78% or less, more preferably 25% or more and 75% or less, and most preferably 30% or more and 70% or less.

In a wavelength range of 430 to 580 nm, when an average value ($T_A$) of transmittance is too high, an intensity of light incident on a light receiving unit of the light sensor becomes excessively strong, and saturation occurs in the light sensor so the light sensor may not function normally. In addition, when an average value ($T_A$) of transmittance is too low, an intensity of light incident on the light receiving unit of the light sensor becomes weak, a sufficient intensity of light that passes through the filter is not secured, and it may not be suitable for use for the above application.

The thickness of the optical filter of the present invention is not particularly limited, but is preferably 40 to 1,000 μm, more preferably 50 to 800 μm, still more preferably 80 to 500 μm, and most preferably 90 to 250 μm. When the thickness of the optical filter is within the above range, it is possible to reduce the size and weight of the optical filter, and it can be suitably used for various applications such as a light sensor. In particular, when it is used on an upper surface of the light receiving unit of the light sensor, this is preferable because the height of the light sensor module can be reduced.

<Base Material (i)>

The base material (i) may have a single layer or multiple layers and may contain a light absorbing layer that has a maximum absorption in a wavelength range of 750 to 1,150 nm. In addition, the light absorbing layer preferably contains a compound (S) having a maximum absorption in a wavelength range of 750 to 1,150 nm. When the base material (i) has a single layer, for example, a base material formed of a transparent resin substrate (ii) containing the compound (S) and a base material formed of a near infrared rays absorbing glass substrate (iii) that contains a copper component can be exemplified, and the transparent resin substrate (ii) or the glass substrate (iii) becomes the light absorbing layer. In the case of the multiple layers, for example, a base material in which a transparent resin layer such as an overcoat layer made of a curable resin containing the compound (S) is laminated on a support such as a glass support or a resin support serving as a base, a base material in which a resin layer such as an overcoat layer made of a curable resin or the like is laminated on the transparent resin substrate (ii) containing the compound (S), and the like can be exemplified. In consideration of production costs, ease of adjustment of optical characteristics, and additionally, an ability to obtain an effect of removing scratches on the resin support or the transparent resin substrate (ii), improvement in scratch resistance of the base material (i), and the like, a base material in which a resin layer such as an overcoat layer made of a curable resin is laminated on the transparent resin substrate (ii) containing the compound (S) is particularly preferable.

<Light Absorbing Layer>

The light absorbing layer is not particularly limited as long as it has a maximum absorption in a wavelength range of 750 to 1,150 nm. In a wavelength range of 850 to 1,050 nm, desirably, an average OD value (hereinafter referred to as an "$OD_C$") measured from the direction perpendicular to the base material (i) is preferably 1.0 or more, more preferably 1.1 or more and 10 or less, and most preferably 1.3 or more and 9 or less.

In addition, when an optical filter using such a light absorbing layer is used in an ambient light sensor and an illuminance sensor, since it is possible to absorb multiple-reflected light in the light sensor module, it is possible to prevent an erroneous operation of the ambient light sensor and the illuminance sensor, and it is possible to obtain a highly functional ambient light sensor and illuminance sensor.

The thickness of the light absorbing layer is not particularly limited, but is preferably 50 to 500 μm, more preferably 50 to 300 μm, and most preferably 50 to 200 μm. When the thickness of the light absorbing layer is within the above range, it is possible to reduce the size and weight of the optical filter using the light absorbing layer, and it can be suitably used for various applications such as a light sensor. In particular, when it is used on an upper surface of the light receiving unit of the light sensor, this is preferable because the height of the light sensor module can be reduced.

<Compound (S)>

As the compound (S), a metal complex compound, a dye or a pigment that can function as a dye that absorbs near infrared rays can be used. Specifically, at least one compound selected from the group consisting of a squarylium compound, a phthalocyanine compound, a naphthalocyanine compound, a croconium compound, a cyanine compound, a diimmonium compound, a metal dithiolate complex compound, a copper phosphate complex-based compound and a pyrrolopyrrole compound can be used. In particular, a diimmonium compound represented by the following Formula (s1) and a metal dithiolate complex compound represented by the following Formula (s2) are preferable. When such a compound (S) is used, it is possible to achieve absorption characteristics in a wide near infrared wavelength range and an excellent visible light transmittance. In addition, the compounds (S) contained in the light absorbing layer may be used alone or in a mixture of two or more thereof.

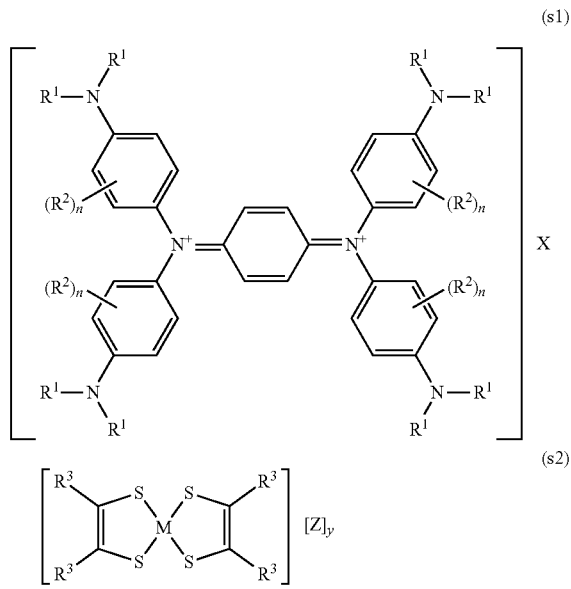

In Formula (s1) and Formula (s2), $R^1$ to $R^3$ each independently represent a hydrogen atom, a halogen atom, a sulfo group, a hydroxyl group, a cyano group, a nitro group, a carboxy group, a phosphate group, an —$NR^gR^h$ group, an —$SR^i$ group, an —$SO_2R^i$ group, an —$OSO_2R^i$ group or any of the following $L^a$ to $L^h$, $R^g$ and $R^h$ each independently represent a hydrogen atom, a —C(O)R' group or any of the following $L^a$ to $L^e$, and $R^i$ represents any of the following $L^a$ to $L^e$.

($L^a$) Aliphatic hydrocarbon group having 1 to 12 carbon atoms ($L^b$) Halogen-substituted alkyl group having 1 to 12 carbon atoms ($L^c$) Alicyclic hydrocarbon group having 3 to 14 carbon atoms ($L^d$) Aromatic hydrocarbon group having 6 to 14 carbon atoms ($L^e$) Heterocyclic group having 3 to 14 carbon atoms ($L^f$) Alkoxy group having 1 to 12 carbon atoms ($L^g$) Acyl group having 1 to 12 carbon atoms which may have a substituent L ($L^h$) Alkoxycarbonyl group having 1 to 12 carbon atoms which may have a substituent L The substituent L is at least one selected from the group consisting of an aliphatic hydrocarbon group having 1 to 12 carbon atoms, a halogen-substituted alkyl group having 1 to 12 carbon atoms, an alicyclic hydrocarbon group having 3 to 14 carbon atoms, an aromatic hydrocarbon group having 6 to 14 carbon atoms and a heterocyclic group having 3 to 14 carbon atoms. Adjacent $R^3$ groups may form a ring that may have the substituent L. n is an integer of 0 to 4, and X represents an anion necessary for neutralizing a charge. M represents a metal atom. Z represents $D(R^i)_4$, D represents a nitrogen atom, a phosphorus atom or a bismuth atom, and y represents 0 or 1.

In the diimmonium compound represented by the above Formula (s1), $R^1$ is preferably a hydrogen atom, a methyl group, an ethyl group, an n-propyl group, an isopropyl group, an n-butyl group, a sec-butyl group, a tert-butyl group, a cyclohexyl group, a phenyl group, or a benzyl group, and more preferably an isopropyl group, a sec-butyl group, a tert-butyl group, or a benzyl group.

In the diimmonium compound represented by the above Formula (s1), $R^2$ is preferably a chlorine atom, a fluorine atom, a methyl group, an ethyl group, an n-propyl group, an isopropyl group, an n-butyl group, a sec-butyl group, a tert-butyl group, a cyclohexyl group, a phenyl group, a hydroxyl group, an amino group, a dimethylamino group, a cyano group, a nitro group, a methoxy group, an ethoxy group, an n-propoxy group, an n-butoxy group, an acetylamino group, a propionylamino group, an N-methylacetylamino group, a trifluoromethanoylamino group, a pentafluoroethanoylamino group, a t-butanoylamino group, a cyclohexanoylamino group, an n-butylsulfonyl group, a methylthio group, an ethylthio group, an n-propylthio group, or an n-butylthio group, more preferably a chlorine atom, a fluorine atom, a methyl group, an ethyl group, an n-propyl group, an isopropyl group, a tert-butyl group, a hydroxyl group, a dimethylamino group, a methoxy group, an ethoxy group, an acetylamino group, a propionylamino group, a trifluoromethanoylamino group, a pentafluoroethanoylamino group, a t-butanoylamino group, or a cyclohexanoylamino group, and particularly preferably a methyl group, an ethyl group, an n-propyl group, or an isopropyl group. The number of $R^2$ groups (value of n) bonded to the same aromatic ring is not particularly limited as long as it is 0 to 4, and it is preferably 0 or 1.

X is an anion necessary for neutralizing a charge, and when an anion is divalent, one molecule is necessary, and when an anion is monovalent, two molecules are necessary. In the latter case, two anions may be the same or different from each other, and preferably two anions are the same in consideration of synthesis. X is not particularly limited as long as it is such an anion, and as an example, those shown in the following Table 1 can be exemplified.

TABLE 1

| Anion | Structure |
|---|---|
| (X-1) | $Cl^-$ |
| (X-2) | $F^-$ |
| (X-3) | $Br^-$ |
| (X-4) | $PF_6^-$ |
| (X-5) | $ClO_4^-$ |
| (X-6) | $NO_3^-$ |
| (X-7) | $BF_4^-$ |
| (X-8) | $SCN^-$ |
| (X-9) | $CH_3COO^-$ |
| (X-10) | $CF_3COO^-$ |
| (X-11) | $CH_3CH_2COO^-$ |
| (X-12) | $CF_3CF_2COO^-$ |
| (X-13) | benzoate |
| (X-14) | succinate dianion |
| (X-15) | $CH_3SO_3^-$ |
| (X-16) | $CF_3SO_3^-$ |
| (X-17) | p-toluenesulfonate |

TABLE 1-continued

| Anion | Structure |
|---|---|
| (X-18) | naphthalene-2-sulfonate |
| (X-19) | naphthalene-2,7-disulfonate |
| (X-20) | bis(phenylsulfonyl)imide |
| (X-21) | bis(trifluoromethanesulfonyl)imide |
| (X-22) | bis(pentafluoroethanesulfonyl)imide |
| (X-23) | bis(oxalato)borate |
| (X-24) | tetrakis(pentafluorophenyl)borate |
| (X-25) | (pentafluorophenyl)(dicyanomethyl)sulfonate |
| (X-26) | (pentafluorophenyl)bis(trifluoromethanesulfonyl)methide |

TABLE 1-continued

| Anion | Structure |
|---|---|
| (X-27) | ![structure] |
| (X-28) | ![structure] |

X tends to improve heat resistance of a diimmonium compound when it is an anion of a diimmonium compound as long as it has high acidity when it is an acid, and (X-10), (X-16), (X-17), (X-21), (X-22), (X-24), and (X-28) in the above Table 1 are particularly preferable.

In the metal dithiolate complex compound represented by the above Formula (s2), $R^3$ is preferably a methyl group, an ethyl group, an n-propyl group, an isopropyl group, an n-butyl group, a sec-butyl group, a tert-butyl group, a cyclohexyl group, an n-pentyl group, an n-hexyl group, an n-heptyl group, an n-octyl group, an n-nonyl group, an n-decyl group, a phenyl group, a methylthio group, an ethylthio group, an n-propylthio group, an n-butylthio group, a phenylthio group, or a benzylthio group. When adjacent $R^3$ groups form a ring, a heterocyclic ring containing at least one sulfur atom or nitrogen atom in the ring is preferable.

In the metal dithiolate complex compound represented by the above Formula (s2), M is preferably a transition metal and more preferably Ni, Pd, or Pt.

In the metal dithiolate complex compound represented by the above Formula (s2), Z represents $D(R^i)_4$, D is preferably a nitrogen atom, or a phosphorus atom, $R^i$ is preferably an ethyl group, an n-propyl group, an isopropyl group, an n-butyl group, a sec-butyl group, a tert-butyl group, an n-pentyl group, an n-hexyl group, an n-heptyl group, or a phenyl group.

The maximum absorption wavelength of the compound (S) is 750 nm or more and 1,150 nm or less, preferably 760 nm or more and 1,140 nm or less, more preferably 770 nm or more and 1,130 nm or less, and most preferably 780 nm or more and 1,120 nm or less. When the maximum absorption wavelength of the compound (S) is in such a range, it is possible to efficiently cut unnecessary near infrared rays and it is possible lower an incident angle dependence of incident light.

The compound (S) may be synthesized by a generally known method, and can be synthesized with reference to methods described, for example, in Japanese Patent No. 4168031, Japanese Patent No. 4252961, Japanese Unexamined Patent Application Publication (Translation of PCT Application) No. 2010-516823, and Japanese Unexamined Patent Application Publication No. S63-165392.

As commercial products of the compound (S), S2058 (commercially available from DKSH), CIR-108x, CIR-96x, CIR-RL, and CIR-1080 (commercially available from Japan Carlit Co., Ltd.), T090821, T091021, T89021, T090721, and T090122 (commercially available from TOSCO Corp.), B4360, D4773, and D5013 (commercially available from Tokyo Chemical Industry Co., Ltd.), S4253, S1426, and S1445 (commercially available from Spectrum Info), and Excolor IR1, IR2, IR3, and IR4 (commercially available from Nippon Shokubai Co., Ltd.) can be exemplified.

An amount of the compound (S) used is appropriately selected according to desired characteristics, and is preferably 0.01 to 20.0 parts by weight, more preferably 0.01 to 15.0 parts by weight, and most preferably 0.01 to 10.0 parts by weight with respect to 100 parts by weight of the transparent resin used in the present invention.

When an amount of the compound (S) used is larger than the above range, there are cases in which it is possible to obtain an optical filter in which characteristics of the compound (S) are exhibited more strongly, but there then may be a case in which a transmittance in a range of 430 to 580 nm is lower than a preferable value for a light sensor or a case in which a strength of a light absorbing layer and an optical filter is lowered. When an amount of the compound (S) used is smaller than the above range, an optical filter with too high a transmittance may be obtained, and it may then be difficult to limit an amount of light incident on the light sensor in some cases.

<Compound (A)>

The light absorbing layer can further contain a compound (A) having a maximum absorption in a wavelength range of 650 to 750 nm. The light absorbing layer containing the compound (S) and the light absorbing layer containing the compound (A) may be the same layer or different layers. In addition, the compounds (A) contained in the light absorbing layer may be used alone or in a mixture of two or more thereof.

The compound (A) is not particularly limited as long as it has a maximum absorption in a wavelength range of 650 to 750 nm, and is preferably at least one compound selected from the group consisting of a squarylium compound, a phthalocyanine compound, a naphthalocyanine compound, a croconium compound and a cyanine compound, and particularly preferably a squarylium compound or a phthalocyanine compound.

<<Squarylium Compound>>

The squarylium compound is not particularly limited, but is preferably at least one compound selected from the group consisting of a squarylium compound represented by the following Formula (I) and a squarylium compound represented by the following Formula (II), which will be referred to as "a compound (I)" and a "compound (II)" below.

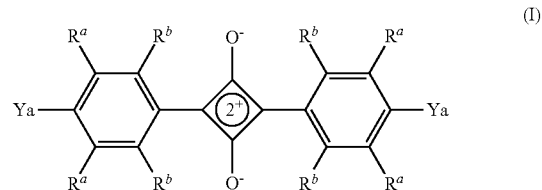

In Formula (I), $R^a$, $R^b$ and Ya satisfy the following condition (α) or (β).

Condition (α):

A plurality of $R^a$ groups each independently represent a hydrogen atom, a halogen atom, a sulfo group, a hydroxyl group, a cyano group, a nitro group, a carboxy group, a phosphate group, or a -$L^1$ or —$NR^eR^f$ group;

A plurality of $R^b$ groups each independently represent a hydrogen atom, a halogen atom, a sulfo group, a hydroxyl group, a cyano group, a nitro group, a carboxy group, a phosphate group, or a -$L^1$ or —$NR^gR^h$ group;

A plurality of Ya groups each independently represent a —$NR^jR^k$ group;

$L^1$ represents $L^a$, $L^b$, $L^c$, $L^d$, $L^e$, $L^f$, $L^g$ or $L^h$;

$R^e$ and $R^f$ each independently represent a hydrogen atom, -$L^a$, -$L^b$, -$L^c$, -$L^d$ or -$L^e$;

$R^g$ and $R^h$ each independently represent a hydrogen atom, -$L^a$, -$L^b$, -$L^c$, -$L^d$, -$L^e$ or —$C(O)R^i$ group ($R^i$ represents -$L^a$, -$L^b$, -$L^c$, -$L^d$ or -$L^e$);

$R^j$ and $R^k$ each independently represent a hydrogen atom, -$L^a$, -$L^b$, -$L^c$, -$L^d$ or -$L^e$;

$L^a$ represents an aliphatic hydrocarbon group having 1 to 12 carbon atoms which may have a substituent L;

$L^b$ represents a halogen-substituted alkyl group having 1 to 12 carbon atoms which may have a substituent L;

$L^c$ represents an alicyclic hydrocarbon group having 3 to 14 carbon atoms which may have a substituent L;

$L^d$ represents an aromatic hydrocarbon group having 6 to 14 carbon atoms which may have a substituent L;

$L^e$ represents a heterocyclic group having 3 to 14 carbon atoms which may have a substituent L;

$L^f$ represents an alkoxy group having 1 to 9 carbon atoms which may have a substituent L;

$L^g$ represents an acyl group having 1 to 9 carbon atoms which may have a substituent L;

$L^h$ represents an alkoxycarbonyl group having 1 to 9 carbon atoms which may have a substituent L;

L represents at least one substituent selected from the group consisting of an aliphatic hydrocarbon group having 1 to 12 carbon atoms, a halogen-substituted alkyl group having 1 to 12 carbon atoms, an alicyclic hydrocarbon group having 3 to 14 carbon atoms, an aromatic hydrocarbon group having 6 to 14 carbon atoms, a heterocyclic group having 3 to 14 carbon atoms, a halogen atom, a sulfo group, a hydroxyl group, a cyano group, a nitro group, a carboxy group, a phosphate group and an amino group.

Condition (β):

At least one of two $R^a$ groups on one benzene ring is bonded to Y on the same benzene ring to form a heterocyclic ring including 5 or 6 constituent atoms containing at least one nitrogen atom.

The heterocyclic ring may have a substituent, and $R^b$ and $R^a$ not involved in formation of the heterocyclic ring are each independently the same as $R^b$ and $R^a$ in the condition (α).

In $L^a$ to $L^h$, the total number of carbon atoms including the substituent is preferably 50 or less, more preferably 40 or less, and most preferably 30 or less. When the number of carbon atoms is larger than this range, it may be difficult to synthesize a compound and a light absorption intensity per unit weight tends to decrease.

As the aliphatic hydrocarbon group having 1 to 12 carbon atoms in $L^a$ and L, for example, an alkyl group such as a methyl group (Me), an ethyl group (Et), an n-propyl group (n-Pr), an isopropyl group (i-Pr), an n-butyl group (n-Bu), a sec-butyl group (s-Bu), a tert-butyl group (t-Bu), a pentyl group, a hexyl group, an octyl group, a nonyl group, a decyl group and a dodecyl group; an alkenyl group such as a vinyl group, a 1-propenyl group, a 2-propenyl group, a butenyl group, a 1,3-butadienyl group, a 2-methyl-1-propenyl group, a 2-pentenyl group, a hexenyl group and an octenyl group; and an alkynyl group such as an ethynyl group, a propynyl group, a butynyl group, a 2-methyl-1-propynyl group, a hexynyl group and an octynyl group can be exemplified.

As the halogen-substituted alkyl group having 1 to 12 carbon atoms in $L^b$ and L, for example, a trichloromethyl group, a trifluoromethyl group, a 1,1-dichloroethyl group, a pentachloroethyl group, a pentafluoroethyl group, a heptachloropropyl group and a heptafluoropropyl group can be exemplified.

As the alicyclic hydrocarbon group having 3 to 14 carbon atoms in $L^c$ and L, for example, a cycloalkyl group such as a cyclobutyl group, a cyclopentyl group, a cyclohexyl group, a cycloheptyl group and a cyclooctyl group; and a polycyclic alicyclic group such as a norbornane group and an adamantane group can be exemplified.

As the aromatic hydrocarbon group having 6 to 14 carbon atoms in $L^d$ and L, for example, a phenyl group, a tolyl group, a xylyl group, a mesityl group, a cumenyl group, a 1-naphthyl group, a 2-naphthyl group, an anthracenyl group, a phenanthryl group, an acenaphthyl group, a phenalenyl group, a tetrahydronaphthyl group, an indanyl group and a biphenylyl group can be exemplified.

As the heterocyclic group having 3 to 14 carbon atoms in $L^e$ and L, for example, groups including a heterocyclic ring such as furan, thiophene, pyrrole, pyrazole, imidazole, triazole, oxazole, oxadiazole, thiazole, thiadiazole, indole, indoline, indolenine, benzofuran, benzothiophene, carbazole, dibenzofuran, dibenzothiophene, pyridine, pyrimidine, pyrazine, pyridazine, quinoline, isoquinoline, acridine, morpholine and phenazine can be exemplified.

As the alkoxy group having 1 to 12 carbon atoms in $L^f$, for example, a methoxy group, an ethoxy group, an n-propoxy group, an isopropoxy group, a butoxy group, a pentyloxy group, a hexyloxy group, and an octyloxy group can be exemplified.

As the acyl group having 1 to 9 carbon atoms in $L^g$, for example, an acetyl group, a propionyl group, a butyryl group, an isobutyryl group, a valeryl group, an isovaleryl group and a benzoyl group can be exemplified.

As the alkoxycarbonyl group having 1 to 9 carbon atoms in $L^h$, for example, a methoxycarbonyl group, an ethoxycarbonyl group, a propoxycarbonyl group, an isopropoxycarbonyl group, a butoxycarbonyl group, a pentyloxycarbonyl group, a hexyloxycarbonyl group and an octyloxycarbonyl group can be exemplified.

$L^a$ is preferably a methyl group, an ethyl group, an n-propyl group, an isopropyl group, an n-butyl group, a sec-butyl group, a test-butyl group, a pentyl group, a hexyl group, an octyl group, a 4-phenylbutyl group, or 2-cyclohexylethyl group, and more preferably a methyl group, an ethyl group, an n-propyl group, an isopropyl group, an n-butyl group, a sec-butyl group, or a tert-butyl group.

$L^b$ is preferably a trichloromethyl group, a pentachloroethyl group, a trifluoromethyl group, a pentafluoroethyl group, or a 5-cyclohexyl-2,2,3,3-tetrafluoropentyl group, and more preferably a trichloromethyl group, a pentachloroethyl group, a trifluoromethyl group, or a pentafluoroethyl group.

$L^c$ is preferably a cyclobutyl group, a cyclopentyl group, a cyclohexyl group, a 4-ethylcyclohexyl group, a cyclooctyl group, or a 4-phenylcycloheptyl group, and more preferably a cyclopentyl group, a cyclohexyl group, or a 4-ethylcyclohexyl group.

$L^d$ is preferably a phenyl group, a 1-naphthyl group, a 2-naphthyl group, a tolyl group, a xylyl group, a mesityl group, a cumenyl group, a 3,5-di-tert-butylphenyl group, a 4-cyclopentylphenyl group, a 2,3,6-triphenylphenyl group, or a 2,3,4,5,6-pentaphenylphenyl group, and more preferably a phenyl group, a tolyl group, a xylyl group, a mesityl group, a cumenyl group, or a 2,3,4,5,6-pentaphenylphenyl group.

$L^e$ is preferably a group including furan, thiophene, pyrrole, indole, indoline, indolenine, benzofuran, benzothiophene, or morpholine, and more preferably a group including furan, thiophene, pyrrole, or morpholine.

$L^f$ is preferably a methoxy group, an ethoxy group, a propoxy group, an isopropoxy group, a butoxy group, a methoxymethyl group, a methoxyethyl group, a 2-phenylethoxy group, a 3-cyclohexylpropoxy group, a pentyloxy group, a hexyloxy group, or an octyloxy group, and more preferably a methoxy group, an ethoxy group, a propoxy group, an isopropoxy group, or a butoxy group.

$L^g$ is preferably an acetyl group, a propionyl group, a butyryl group, an isobutyryl group, a benzoyl group, a 4-propylbenzoyl group, or a trifluoromethylcarbonyl group, and more preferably an acetyl group, a propionyl group, or a benzoyl group.

$L^h$ is preferably a methoxycarbonyl group, an ethoxycarbonyl group, a propoxycarbonyl group, an isopropoxycarbonyl group, a butoxycarbonyl group, a 2-trifluoromethylethoxycarbonyl group, or a 2-phenylethoxycarbonyl group, and more preferably a methoxycarbonyl group, or an ethoxycarbonyl group.

$L^a$ to $L^b$ may further include at least one atom or group selected from the group consisting of a halogen atom, a sulfo group, a hydroxyl group, a cyano group, a nitro group, a carboxy group, a phosphate group and an amino group. Examples of such groups include a 4-sulfobutyl group, a 4-cyanobutyl group, a 5-carboxypentyl group, a 5-aminopentyl group, a 3-hydroxypropyl group, a 2-phosphorylethyl group, a 6-amino-2,2-dichlorohexyl group, a 2-chloro-4-hydroxybutyl group, a 2-cyanocyclobutyl group, a 3-hydroxycyclopentyl group, a 3-carboxycyclopentyl group, a 4-aminocyclohexyl group, a 4-hydroxycyclohexyl group, a 4-hydroxyphenyl group, a pentafluorophenyl group, a 2-hydroxynaphthyl group, a 4-aminophenyl group, a 4-nitrophenyl group, a 3-methylpyrrole group, a 2-hydroxyethoxy group, a 3-cyanopropoxy group, a 4-fluorobenzoyl group, a 2-hydroxycthoxycarbonyl group, and a 4-cyanobutoxycarbonyl group.

In the condition (α), $R^a$ is preferably a hydrogen atom, a chlorine atom, a fluorine atom, a methyl group, an ethyl group, an n-propyl group, an isopropyl group, an n-butyl group, a sec-butyl group, a tert-butyl group, a cyclohexyl group, a phenyl group, a hydroxyl group, an amino group, a dimethyl amino group, or a nitro group, and more preferably a hydrogen atom, a chlorine atom, a fluorine atom, a methyl group, an ethyl group, an n-propyl group, an isopropyl group, or a hydroxyl group.

In the condition (α), $R^b$ is preferably a hydrogen atom, a chlorine atom, a fluorine atom, a methyl group, an ethyl group, an n-propyl group, an isopropyl group, an n-butyl group, a sec-butyl group, a tert-butyl group, a cyclohexyl group, a phenyl group, a hydroxyl group, an amino group, a dimethylamino group, a cyano group, a nitro group, an acetylamino group, a propionylamino group, an N-methylacetylamino group, a trifluoromethanoylamino group, a pentafluoroethanoylamino group, a t-butanoylamino group, or a cyclohexanoylamino group, and more preferably a hydrogen atom, a chlorine atom, a fluorine atom, a methyl group, an ethyl group, an n-propyl group, an isopropyl group, a hydroxyl group, a dimethylamino group, a nitro group, an acetylamino group, a propionylamino group, a trifluoromethanoylamino group, a pentafluoroethanoylamino group, a t-butanoylamino group, or a cyclohexanoylamino group.

Ya is preferably an amino group, a methylamino group, a dimethylamino group, a diethylamino group, a di-n-propylamino group, a diisopropylamino group, a di-n-butylamino group, a di-t-butylamino group, an N-ethyl-N-methylamino group, or an N-cyclohexyl-N-methylamino group, and more preferably a dimethylamino group, a diethylamino group, a di-n-propylamino group, a diisopropylamino group, a di-n-butylamino group, or a di-t-butylamino group.

As a heterocyclic ring including 5 or 6 constituent atoms containing at least one nitrogen atom, which is formed by bonding at least one of two $R^a$ groups on one benzene ring to Y on the same benzene ring in the condition (β) in Formula (I), for example, pyrrolidine, pyrrole, imidazole, pyrazole, piperidine, pyridine, piperazine, pyridazine, pyrimidine and pyrazine can be exemplified. Among these heterocyclic rings, a heterocyclic ring in which one atom adjacent to carbon atoms that constitute the heterocyclic ring and constitute the benzene ring is a nitrogen atom is preferable and pyrrolidine is more preferable.

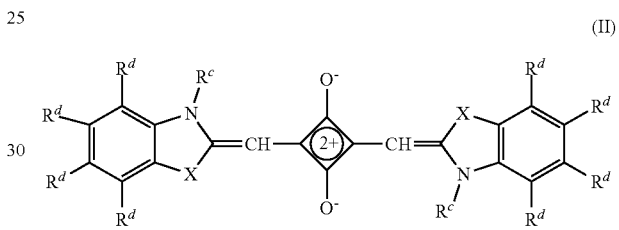

(II)

In Formula (II), X independently represents O, S, Se, N—$R^c$ or C($R^dR^d$); a plurality of $R^c$ groups each independently represent a hydrogen atom, $L^a$, $L^b$, $L^c$, $L^d$ or $L^e$; a plurality of $R^d$ groups each independently represent a hydrogen atom, a halogen atom, a sulfo group, a hydroxyl group, a cyano group, a nitro group, a carboxy group, a phosphate group, and a -$L^1$ or —$NR^eR^f$ group, adjacent $R^d$ groups may be linked to each other to form a ring that may have a substituent; and $L^a$ to $L^e$, $L^1$, $R^e$ and $R^f$ are the same as $L^a$ to $L^e$, $L^1$, $R^e$ and $R^f$ defined in Formula (I).

In Formula (II), $R^e$ is preferably a hydrogen atom, a methyl group, an ethyl group, an n-propyl group, an isopropyl group, an n-butyl group, a sec-butyl group, a tert-butyl group, an n-pentyl group, an n-hexyl group, a cyclohexyl group, a phenyl group, a trifluoromethyl group, or a pentafluoroethyl group, and more preferably a hydrogen atom, a methyl group, an ethyl group, an n-propyl group, or an isopropyl group.

In Formula (II), $R^d$ is preferably a hydrogen atom, a chlorine atom, a fluorine atom, a methyl group, an ethyl group, an n-propyl group, an isopropyl group, an n-butyl group, a sec-butyl group, a tert-butyl group, an n-pentyl group, an n-hexyl group, a cyclohexyl group, a phenyl group, a methoxy group, a trifluoromethyl group, a pentafluoroethyl group, or a 4-aminocyclohexyl group, and more preferably a hydrogen atom, a chlorine atom, a fluorine atom, a methyl group, an ethyl group, an n-propyl group, an isopropyl group, a trifluoromethyl group, or a pentafluoroethyl group.

X is preferably O, S, Se, N-Me, N-Et, $CH_2$, C-$Me_2$, or C-$Et_2$, and more preferably S, C-$Me_2$, or C-$Et_2$.

In Formula (II), adjacent $R^d$ groups may be linked to each other to form a ring. As such a ring, for example, a benzoindolenine ring, an α-naphthoimidazole ring, a β-naphthoimidazole ring, an α-naphthoxazole ring, a β-naphthoxazole ring, an α-naphthothiazole ring, a β-naphthothiazole ring, an oa-naphthoselenazole ring, and a β-naphthoselenazole ring can be exemplified.

The structures of the compound (I) and the compound (II) can be represented by a method of illustration of a resonance structure as in the following Formula (I-2) and the following Formula (II-2) in addition to methods of illustration as in the following Formula (I-1) and the following Formula (II-1). That is, a difference between the following Formula (I-1) and the following Formula (I-2), and a difference between the following Formula (II-1) and the following Formula (II-2) are only the method of illustration of the structure, and they represent the same compound. In the present invention, unless otherwise specified, a structure of a squarylium compound is represented by the method of illustration as in the following Formula (I-1) and the following Formula (II-1).

(I-1)

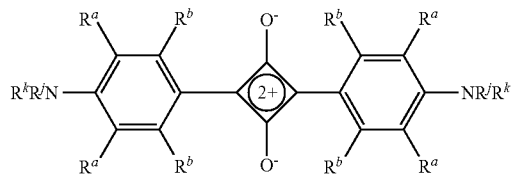

(II-1)

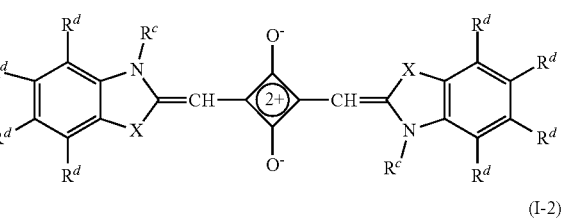

(I-2)

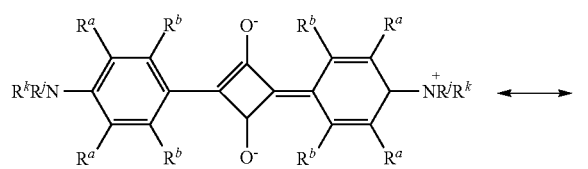

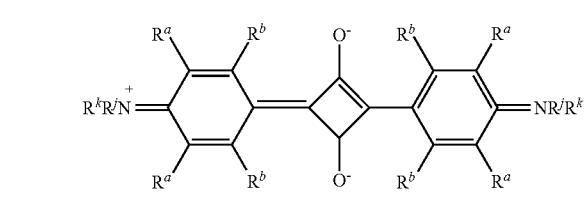

(II-2)

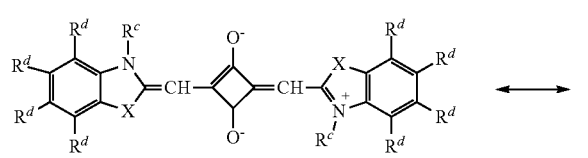

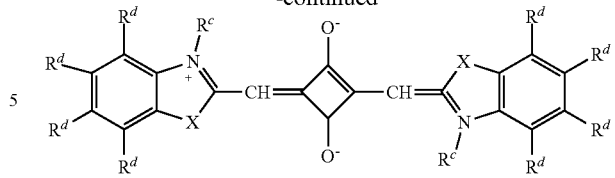

In addition, for example, a compound represented by the following Formula (I-3) and a compound represented by the following Formula (I-4) can be regarded as the same compound.

(I-3)

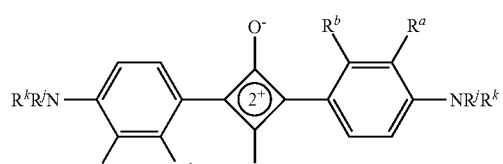

(I-4)

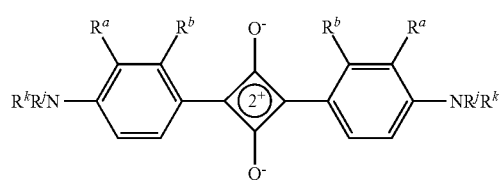

The structures of the compounds (I) and (II) are not particularly limited as long as requirements of Formulae (I) and (II) are satisfied. For example, when structures are represented as in Formulae (I-1) and (II-1), left and right substituents bonded to the central four-membered ring may be the same or different from each other, and are preferably the same so that synthesis is easy.

As specific examples of the compounds (I) and (II), compounds (a-1) to (a-36) shown in the following Tables 2 to 4 which have basic frameworks represented by the following Formulae (I-A) to (I-H) can be exemplified.

(I-A)

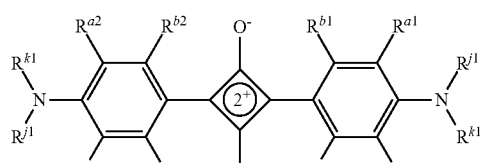

(I-B)

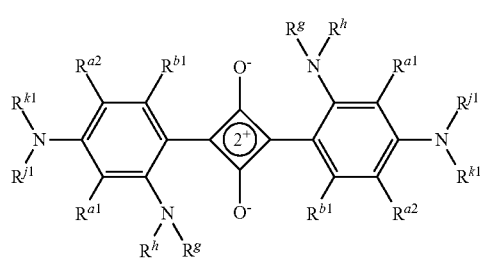

-continued
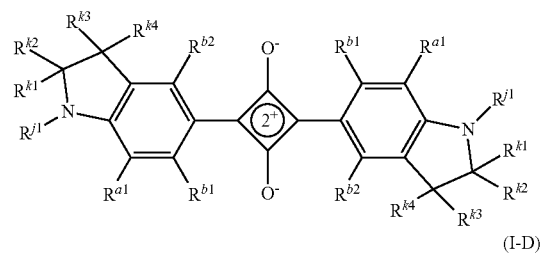
(I-C)
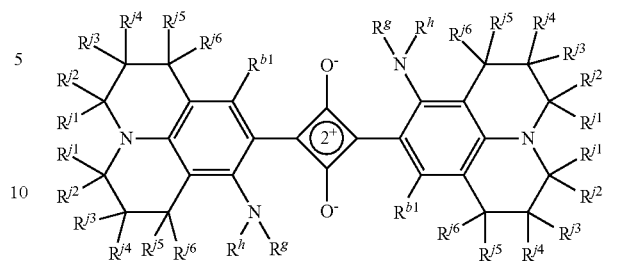
(I-F)
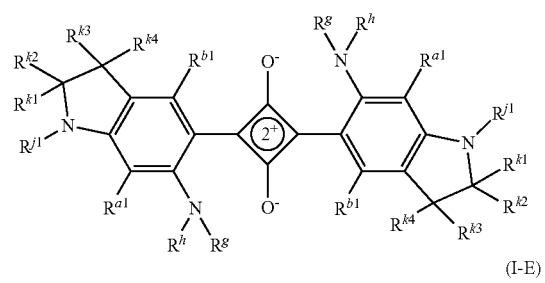
(I-D)
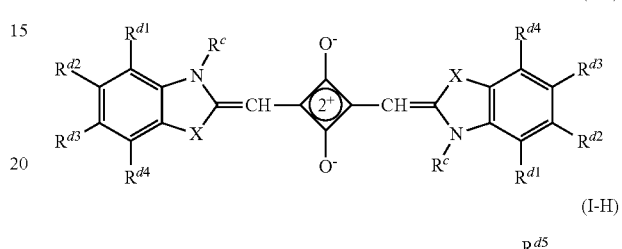
(I-G)
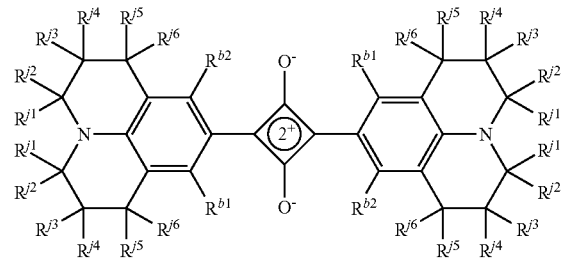
(I-E)
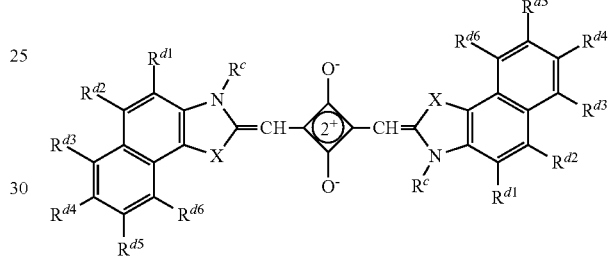
(I-H)
TABLE 2
| Compound | Basic framework | $R^{a1}$ | $R^{a2}$ | $R^{b1}$ | $R^{b2}$ | $R^g$ | $R^h$ | $R^{j1}$ | $R^{k1}$ | $R^{k2}$ | $R^{k3}$ | $R^{k4}$ |
|---|---|---|---|---|---|---|---|---|---|---|---|---|
| (a-1) | (I-A) | H | H | Me | H | — | — | Et | n-Pr | — | — | — |
| (a-2) | | H | H | OH | H | — | — | n-Bu | n-Bu | — | — | — |
| (a-3) | | Me | H | OH | H | — | — | t-Bu | t-Bu | — | — | — |
| (a-4) | (I-B) | H | H | H | — | Me | Me | n-Pr | n-Pr | — | — | — |
| (a-5) | | H | H | H | — | H | C(=O)Me | Et | Et | — | — | — |
| (a-6) | | H | H | H | — | Me | C(=O)Me | n-Bu | n-Bu | — | — | — |
| (a-7) | | H | H | H | — | H | C(=O)H | Me | Et | — | — | — |
| (a-8) | | H | H | H | — | H | C(=O)t-Bu | n-Bu | n-Bu | — | — | — |
| (a-9) | | Me | H | H | — | H | C(=O)CF$_3$ | i-Pr | i-Pr | — | — | — |
| (a-10) | (I-C) | H | — | OH | H | — | — | Me | Me | H | H | H |
| (a-11) | | Me | — | Me | H | — | — | Me | Me | H | Me | Me |

TABLE 2-continued

| Compound | Basic framework | $R^{a1}$ | $R^{a2}$ | $R^{b1}$ | $R^{b2}$ | $R^g$ | $R^h$ | $R^{j1}$ | $R^{k1}$ | $R^{k2}$ | $R^{k3}$ | $R^{k4}$ |
|---|---|---|---|---|---|---|---|---|---|---|---|---|
| (a-12) | | H | — | OH | H | — | — | Me | Me | H | Me | Me |
| (a-13) | | H | — | H | H | — | — | n-Bu | H | H | Et | H |
| (a-14) | | H | — | OH | H | — | — | 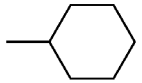 | Me | H | Me | Me |
| (a-15) | (I-D) | H | — | H | — | H | H | Me | H | H | Me | Me |
| (a-16) | | H | — | H | — | H | 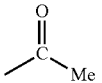 | Me | Me | H | Me | Me |
| (a-17) | | Et | — | H | — | H | 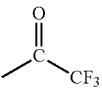 | n-Bu | H | H | H | H |
| (a-18) | | H | — | H | — | H | 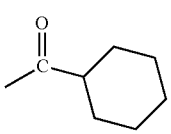 | Me | Me | H | Me | Me |
| (a-19) | | Me | — | H | — | H | 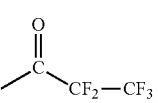 | Et | Me | H | Me | Me |
| (a-20) | | H | — | H | — | H | 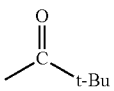 | Me | Me | H | Me | Me |

TABLE 3

| Compound | Basic framework | $R^{b1}$ | $R^{b2}$ | $R^g$ | $R^h$ | $R^{j1}$ | $R^{j2}$ | $R^{j3}$ | $R^{j4}$ | $R^{j5}$ | $R^{j6}$ |
|---|---|---|---|---|---|---|---|---|---|---|---|
| (a-21) | (I-E) | OH | H | — | — | H | H | H | H | H | H |
| (a-22) | | OH | H | — | — | H | H | H | H | Me | Me |
| (a-23) | | OH | H | — | — | Me | H | Me | H | Me | Me |
| (a-24) | | OH | Me | — | — | H | H | H | H | n-Bu | n-Bu |
| (a-25) | (I-F) | H | — | H | 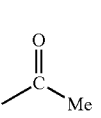 | H | H | H | H | Me | Me |
| (a-26) | | H | — | Me | 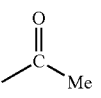 | Me | H | Me | H | Me | Me |
| (a-27) | | H | — | H | 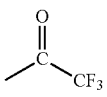 | H | H | Me | Me | Et | Et |
| (a-28) | | H | — | H | 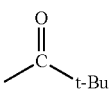 | H | H | H | H | Me | Me |

TABLE 4

| Compound | Basic framework | Substituents | | | | | | | |
|---|---|---|---|---|---|---|---|---|---|
| | | X | $R^o$ | $R^{d1}$ | $R^{d2}$ | $R^{d3}$ | $R^{d4}$ | $R^{d5}$ | $R^{d6}$ |
| (a-29) | (I-G) | $C(CH_3)_2$ | Et | H | H | H | H | — | — |
| (a-30) | | $CH_2$ | n-Bu | H | H | F | H | — | — |
| (a-31) | | S | Me | H | Me | Me | H | — | — |
| (a-32) | | O | Et | H | $CF_3$ | $CF_3$ | H | — | — |
| (a-33) | (I-H) | $C(CH_3)_2$ | i-Pr | H | H | H | H | H | H |
| (a-34) | | S | n-Bu | H | H | H | $CF_3$ | $CF_3$ | H |
| (a-35) | | $C(CH_3)_2$ | $CF_2CF_3$ | H | H | H | H | —OMe | H |
| (a-36) | | $C(CH_3)_2$ | Et | H | H | H | Me | Me | H |

The compounds (I) and (II) may be synthesized by a generally known method and can be synthesized with reference to methods described, for example, in Japanese Unexamined Patent Application Publication No. H1-228960, Japanese Unexamined Patent Application Publication No. 2001-40234, and Japanese Patent No. 3196383.

<<Phthalocyanine Compound>>

The phthalocyanine compound is not particularly limited, but is preferably a compound represented by the following Formula (III) (hereinafter referred to as a "compound (III)").

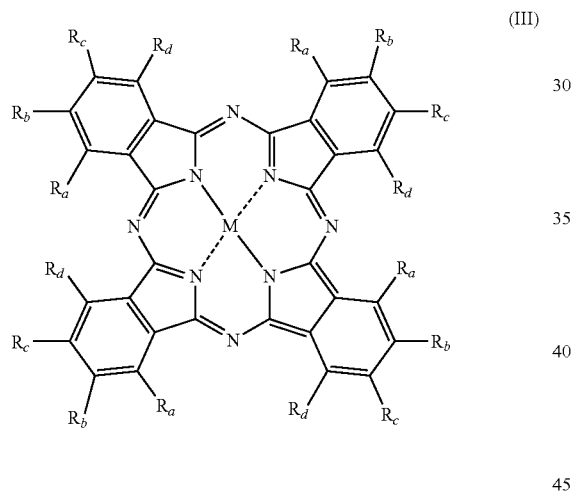

(III)

In Formula (III), M represents a substituted metal atom including two hydrogen atoms, two monovalent metal atoms, a divalent metal atom, or a trivalent or tetravalent metal atom, a plurality of $R_a$, $R_b$, $R_c$ and $R_d$ groups each independently represent a hydrogen atom, a halogen atom, a hydroxyl group, a carboxy group, a nitro group, an amino group, an amide group, an imide group, a cyano group, a silyl group, $-L^1$, $—S-L^2$, $—SS-L^2$, $—SO_2-L^3$, or $—N=N-L^4$, or at least one group selected from the group consisting of groups represented by the following Formulae (A) to (H) to which at least one combination of $R_a$ and $R_b$, $R_b$ and $R_c$ and $R_c$ and $R_d$ is bonded. However, at least one of $R_a$, $R_b$, $R_c$ and $R_d$ bonded to the same aromatic ring is not a hydrogen atom.

The amino group, amide group, imide group and silyl group may have the substituent L defined in Formula (I), $L^1$ is the same as $L^1$ defined in Formula (I), $L^2$ represents a hydrogen atom or any of $L^a$ to $L^e$ defined in Formula (I), $L^3$ represents a hydroxyl group or any of $L^a$ to $L^e$, and $L^4$ represents any of $L^a$ to $L^e$.

(A)

(B)

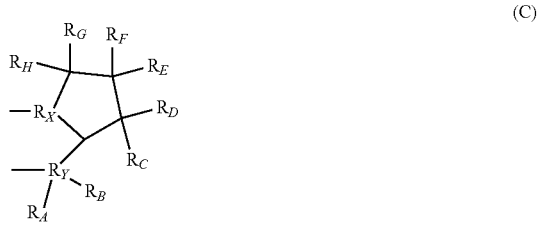

(C)

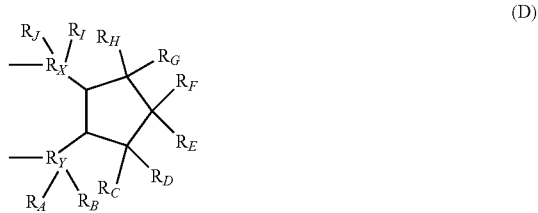

(D)

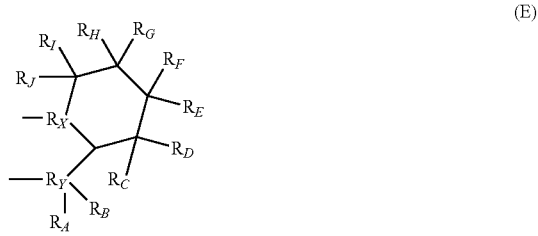

(E)

-continued

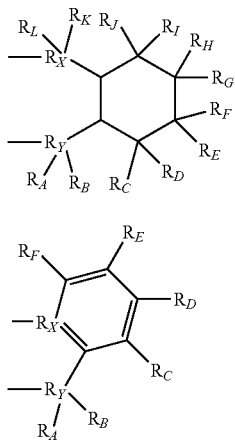

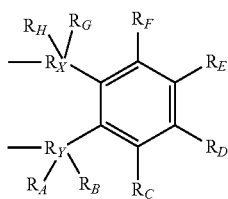

In Formulae (A) to (H), $R_x$ and $R_y$ represent a carbon atom, a plurality of $R_A$ to $R_L$ groups each independently represent a hydrogen atom, a halogen atom, a hydroxyl group, a nitro group, an amino group, an amide group, an imide group, a cyano group, a silyl group, $-L^1$, $-S-L^2$, $-SS-L^2$, $-SO_2-L^3$, and $-N=N-L^4$, the amino group, amide group, imide group and silyl group may have the substituent L defined in Formula (I), and $L^1$ to $L^4$ are the same as $L^1$ to $L^4$ defined in Formula (III).

In $R_a$ to $R_d$ and $R_A$ to $R_L$, as the amino group that may have the substituent L, an amino group, an ethylamino group, a dimethylamino group, a methylethylamino group, a dibutylamino group, and a diisopropylamino group are exemplified.

In $R_a$ to $R_d$ and $R_A$ to $R_L$, as the amide group that may have the substituent L, an amide group, a methylamide group, a dimethylamide group, a diethylamide group, a dipropylamide group, a diisopropylamide group, a dibutylamide group, an α-lactam group, a β-lactam group, a γ-lactam group, and a δ-lactam group are exemplified.

In $R_a$ to $R_d$ and $R_A$ to $R_L$, as the imide group that may have the substituent L, an imide group, a methylimide group, an ethylimide group, a diethylimide group, a dipropylimide group, a diisopropylimide group, and a dibutylimide group are exemplified.

In $R_a$ to $R_d$ and $R_A$ to $R_L$, as the silyl group that may have the substituent L, a trimethylsilyl group, a tert-butyldimethylsilyl group, a triphenylsilyl group, and a triethylsilyl group are exemplified.

In $R_a$ to $R_d$ and $R_A$ to $R_L$, as $-S-L^2$, a thiol group, a methylsulfide group, an ethylsulfide group, a propylsulfide group, a butylsulfide group, an isobutylsulfide group, a sec-butylsulfide group, a tert-butylsulfide group, a phenylsulfide group, a 2,6-di-tert-butylphenylsulfide group, a 2,6-diphenylphenylsulfide group, and a 4-cumylphenylsulfide group are exemplified.

In $R_a$ to $R_d$ and $R_A$ to $R_L$, as $-SS-L^2$, a disulfide group, a methyldisulfide group, an ethyldisulfide group, a propyldisulfide group, a butyldisulfide group, an isobutyldisulfide group, a sec-butyldisulfide group, a tert-butyldisulfide group, a phenyldisulfide group, a 2,6-di-tert-butylphenyldisulfide group, a 2,6-diphenylphenyldisulfide group, and a 4-cumylphenyldisulfide group are exemplified.

In $R_a$ to $R_d$ and $R_A$ to $R_L$, as $-SO_2-L^3$, a sulfo group, a mesyl group, an ethylsulfonyl group, an n-butylsulfonyl group, and a p-toluenesulfonyl group are exemplified.

In $R_a$ to $R_d$ and $R_A$ to $R_L$, as $-N=N-L^4$, a methylazo group, a phenylazo group, a p-methylphenylazo group, and a p-dimethylaminophenylazo group are exemplified.

In M, as the monovalent metal atom, Li, Na, K, Rb, and Cs are exemplified.

In M, as the divalent metal atom, Be, Mg, Ca, Ba, Ti, Cr, Mn, Fe, Ru, Co, Rh, Ni, Pd, Pt, Cu, Zn, Cd, Hg, Sn, and Pb are exemplified.

In M, as the substituted metal atom including a trivalent metal atom, Al—F, Al—Cl, Al—Br, Al—I, Ga—F, Ga—Cl, Ga—Br, Ga—I, In—F, In—Cl, In—Br, In—I, Tl—F, Tl—Cl, Tl—Br, Tl—I, Fe—Cl, Ru—Cl, and Mn—OH are exemplified.

In M, as the substituted metal atom including a tetravalent metal atom, $TiF_2$, $TiCl_2$, $TiBr_2$, $TiI_2$, $ZrCl_2$, $HfCl_2$, $CrCl_2$, $SiF_2$, $SiCl_2$, $SiBr_2$, $SiI_2$, $GeF_2$, $GeCl_2$, $GeBr_2$, $GeI_2$, $SnF_2$, $SnCl_2$, $SnBr_2$, $SnI_2$, $Zr(OH)_2$, $Hf(OH)_2$, $Mn(OH)_2$, $Si(OH)_2$, $Ge(OH)_2$, $Sn(OH)_2$, $TiR_2$, $CrR_2$, $SiR_2$, $GeR_2$, $SnR_2$, $Ti(OR)_2$, $Cr(OR)_2$, $Si(OR)_2$, $Ge(OR)_2$, $Sn(OR)_2$ (R represents an aliphatic group or an aromatic group), TiO, VO, and MnO are exemplified.

M is preferably a divalent transition metal, a trivalent or tetravalent metal halide or a tetravalent metal oxide that belongs to Groups 5 to 11 and the fourth to fifth periods in the periodic table. Among them, Cu, Ni, Co and VO are particularly preferable because high visible light transmittance and stability can then be achieved.

While a method of synthesizing the phthalocyanine compound by a cyclization reaction of phthalonitrile derivatives represented by the following Formula (V) is generally known, the obtained phthalocyanine compound is a mixture of isomers of four types represented by the following Formulae (VI-1) to (VI-4). In the present invention, unless otherwise specified, an isomer of only one type of is exemplified for one type of phthalocyanine compound, but isomers of the other three types can be similarly used. Here, such isomers can be used separately as necessary, but in the present invention, isomer mixtures are collectively handled.

(V)

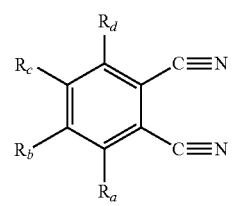

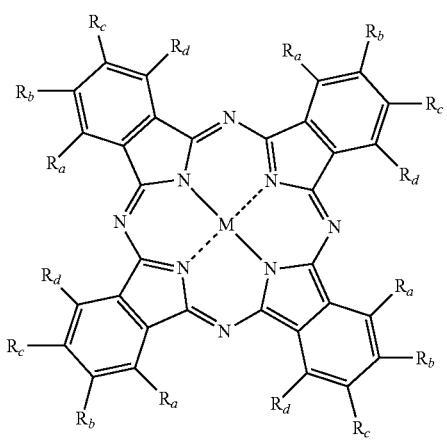
(VI-1)
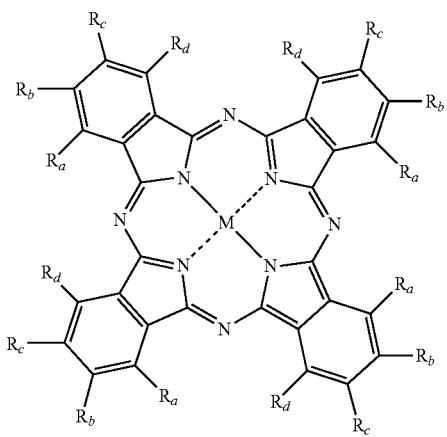
(VI-2)
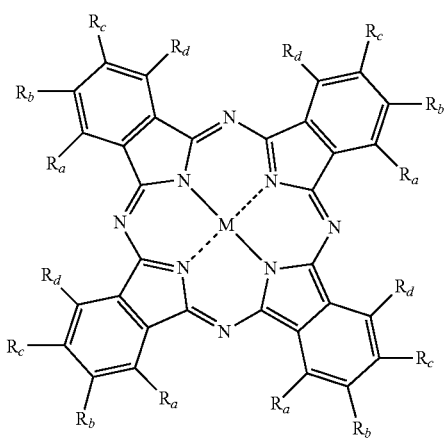
(VI-3)
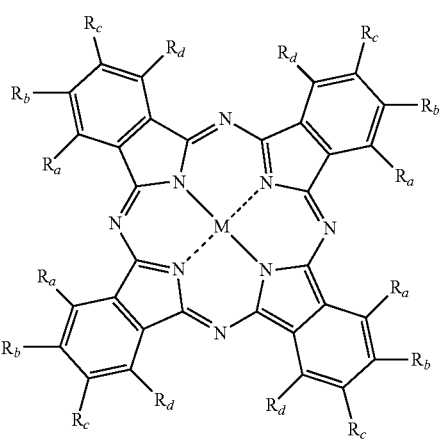
(VI-4)
As specific examples of the compound (III), (b-1) to (b-61) shown in the following Tables 5 to 8 which have basic frameworks represented by the following Formulae (III-A) to (III-J) can be exemplified.
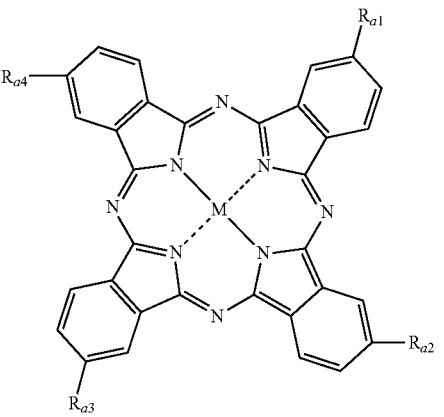
(III-A)
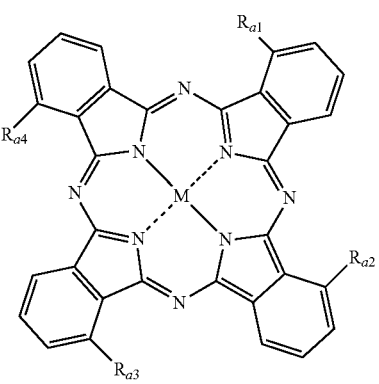
(III-B)

-continued
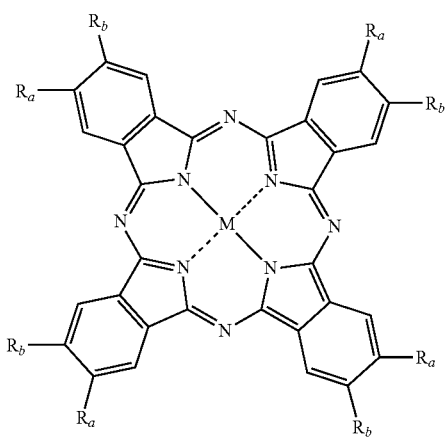
(III-C)
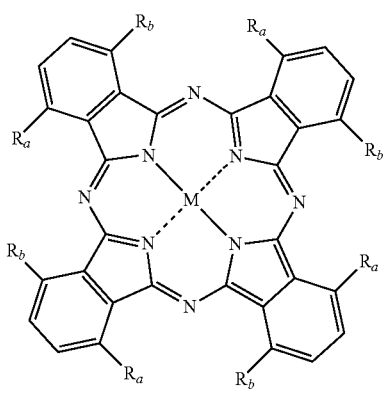
(III-D)
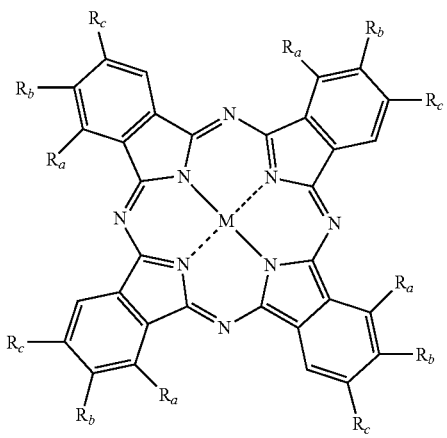
(III-E)
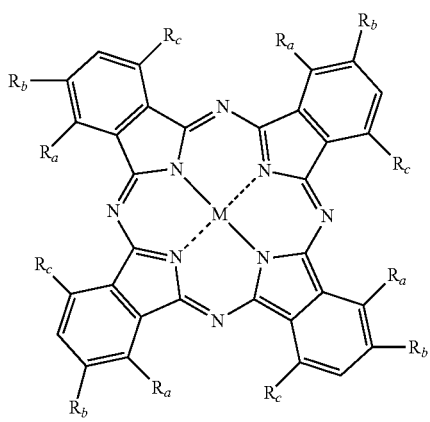
(III-F)
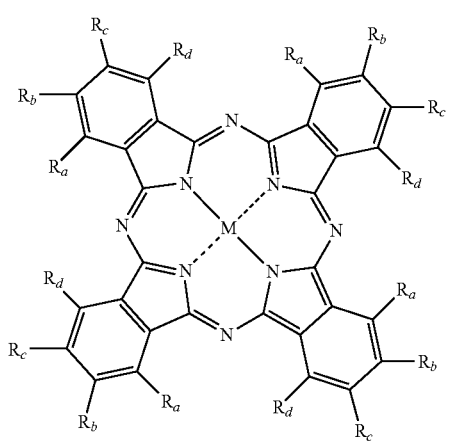
(III-G)
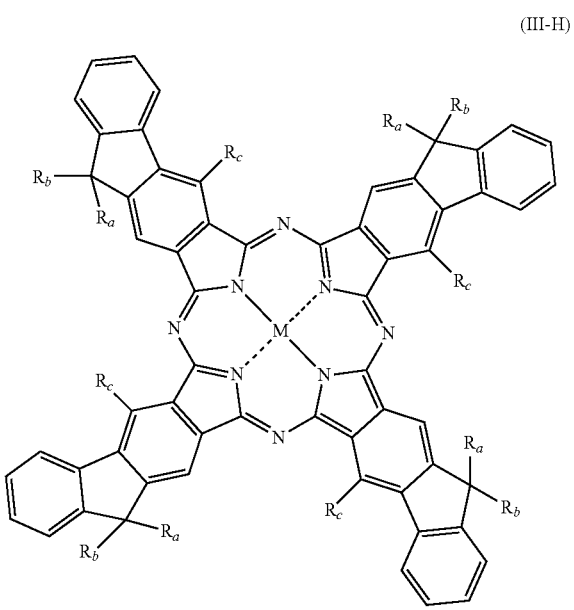
(III-H)

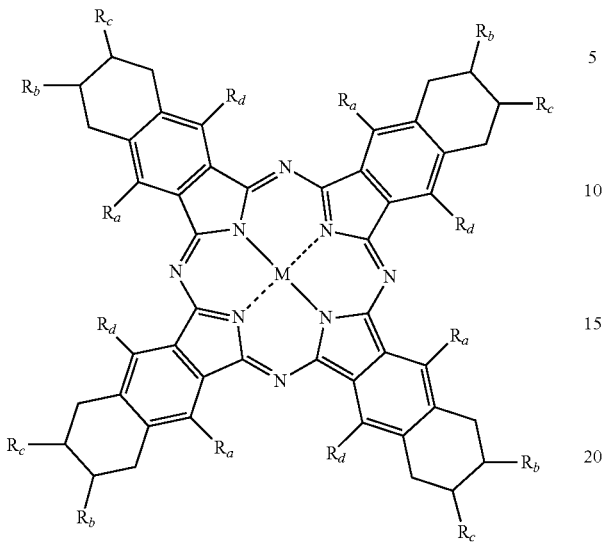
(III-J)

TABLE 5

| Compound | Basic framework | M | $R_{a1}$ | $R_{a2}$ | $R_{a3}$ | $R_{a4}$ |
|---|---|---|---|---|---|---|
| (b-1) | (III-A) | Ni | —O(CH$_2$)$_2$CH$_3$ | —O(CH$_2$)$_2$CH$_3$ | —O(CH$_2$)$_2$CH$_3$ | —O(CH$_2$)$_2$CH$_3$ |
| (b-2) | | Cu | —O(CH$_2$)$_3$CH$_3$ | —O(CH$_2$)$_3$CH$_3$ | —O(CH$_2$)$_3$CH$_3$ | —O(CH$_2$)$_2$CH$_3$ |
| (b-3) | | VO | —O(CH$_2$)$_2$CH$_3$ | —O(CH$_2$)$_2$CH$_3$ | —O(CH$_2$)$_2$CH$_3$ | —O(CH$_2$)$_2$CH$_3$ |
| (b-4) | | VO | —O—C$_6$H$_5$ | —O—C$_6$H$_5$ | —O—C$_6$H$_5$ | —O—C$_6$H$_5$ |
| (b-5) | | Cu | —O—C$_6$H$_5$ | —O—C$_6$H$_5$ | —O—C$_6$H$_5$ | —O—C$_6$H$_5$ |
| (b-5) | | Cu | —S—C$_6$H$_5$ | —S—C$_6$H$_5$ | —S—C$_6$H$_5$ | —S—C$_6$H$_5$ |
| (b-6) | | VO | —S(CH$_2$)$_3$CH$_3$ | —S(CH$_2$)$_3$CH$_3$ | —S(CH$_2$)$_3$CH$_3$ | —S(CH$_2$)$_3$CH$_3$ |
| (b-7) | | Ni | —NH$_2$ | —NH$_2$ | —NH$_2$ | —NH$_2$ |
| (b-8) | | Cu | —NH(CH$_2$)$_3$CH$_3$ | —NH(CH$_2$)$_3$CH$_3$ | —NH(CH$_2$)$_3$CH$_3$ | —NH(CH$_2$)$_3$CH$_3$ |
| (b-9) | | Co | —OH | —OH | —OH | —OH |
| (b-10) | | Cu | t-Bu | t-Bu | t-Bu | t-Bu |
| (b-11) | | VO | t-Bu | t-Bu | t-Bu | t-Bu |
| (b-12) | | VO | —C(CF$_3$)$_3$ | —C(CF$_3$)$_3$ | —C(CF$_3$)$_3$ | —C(CF$_3$)$_3$ |
| (b-13) | | Cu | —O(CF$_2$)$_4$CF$_3$ | —O(CF$_2$)$_4$CF$_3$ | —O(CF$_2$)$_4$CF$_3$ | —O(CF$_2$)$_4$CF$_3$ |
| (b-14) | | Ni | —O—C$_6$H$_4$—C(CH$_3$)(C$_6$H$_5$)—C$_6$H$_4$—O—C$_6$H$_4$—C(CH$_3$)(C$_6$H$_5$)—C$_6$H$_5$ | —O—C$_6$H$_4$—C(CH$_3$)(C$_6$H$_5$)—C$_6$H$_4$—O—C$_6$H$_4$—C(CH$_3$)(C$_6$H$_5$)—C$_6$H$_5$ | —O—C$_6$H$_4$—C(CH$_3$)(C$_6$H$_5$)—C$_6$H$_4$—O—C$_6$H$_4$—C(CH$_3$)(C$_6$H$_5$)—C$_6$H$_5$ | —O—C$_6$H$_4$—C(CH$_3$)(C$_6$H$_5$)—C$_6$H$_4$—O—C$_6$H$_4$—C(CH$_3$)(C$_6$H$_5$)—C$_6$H$_5$ |
| (b-15) | | Cu | —O—C$_6$H$_4$—C(CH$_3$)(C$_6$H$_5$)—C$_6$H$_4$—O—C$_6$H$_4$—C(CH$_3$)(C$_6$H$_5$)—C$_6$H$_5$ | —O—C$_6$H$_4$—C(CH$_3$)(C$_6$H$_5$)—C$_6$H$_4$—O—C$_6$H$_4$—C(CH$_3$)(C$_6$H$_5$)—C$_6$H$_5$ | —O—C$_6$H$_4$—C(CH$_3$)(C$_6$H$_5$)—C$_6$H$_4$—O—C$_6$H$_4$—C(CH$_3$)(C$_6$H$_5$)—C$_6$H$_5$ | —O—C$_6$H$_4$—C(CH$_3$)(C$_6$H$_5$)—C$_6$H$_4$—O—C$_6$H$_4$—C(CH$_3$)(C$_6$H$_5$)—C$_6$H$_5$ |

TABLE 5-continued

| Basic | | Substituents | | | |
|---|---|---|---|---|---|
| Compound | framework M | $R_{a1}$ | $R_{a2}$ | $R_{a3}$ | $R_{a4}$ |
| (b-16) | Cu | pentaphenyl-substituted phenyl | pentaphenyl-substituted phenyl | pentaphenyl-substituted phenyl | pentaphenyl-substituted phenyl |
| (b-17) | VO | pentaphenyl-substituted phenyl | pentaphenyl-substituted phenyl | pentaphenyl-substituted phenyl | pentaphenyl-substituted phenyl |
| (b-18) | Ni | triphenyl-substituted phenyl | triphenyl-substituted phenyl | triphenyl-substituted phenyl | triphenyl-substituted phenyl |

TABLE 5-continued

| Basic | | Substituents | | | |
|---|---|---|---|---|---|
| Compound | framework M | $R_{a1}$ | $R_{a2}$ (—S—Ph) | $R_{a3}$ | $R_{a4}$ (—S—Ph) |
| (b-19) | Cu | F | | F | |
| (b-20) | VO | t-Bu | —O(CH$_2$)$_2$CH$_3$ | —O(CH$_2$)$_2$CH$_3$ | —O(CH$_2$)$_2$CH$_3$ |
| (b-21) | VO | t-Bu | —O(CH$_2$)$_2$CH$_3$ | t-Bu | —O(CH$_2$)$_2$CH$_3$ |
| (b-22) | Co | —C(CF$_3$)$_3$ | —S(CH$_2$)$_3$CH$_3$ | —S(CH$_2$)$_3$CH$_3$ | —S(CH$_2$)$_3$CH$_3$ |

TABLE 6

| Compound | Basic framework | M | Substituents $R_{a1}$ | $R_{a2}$ | $R_{a3}$ | $R_{a4}$ |
|---|---|---|---|---|---|---|
| (b-23) | (III-B) | Co | —NO$_2$ | —NO$_2$ | —NO$_2$ | —NO$_2$ |
| (b-24) | | Cu | —O(CH$_2$)$_3$CH$_3$ | —O(CH$_2$)$_3$CH$_3$ | —O(CH$_2$)$_3$CH$_3$ | —O(CH$_2$)$_3$CH$_3$ |
| (b-25) | | VO | Me | Me | Me | Me |
| (b-26) | | Cu | —O-C$_6$H$_5$ | —O-C$_6$H$_5$ | —O-C$_6$H$_5$ | —O-C$_6$H$_5$ |
| (b-27) | | VO | —OH | —OH | —OH | —OH |
| (b-28) | | Ni | F | F | F | F |
| (b-29) | | Cu | Cl | Cl | Cl | Cl |
| (b-30) | | VO | t-Bu | —OH | t-Bu | —OH |

TABLE 7

| Compound | Basic framework | M | Substituents $R_a$ | $R_b$ | $R_c$ |
|---|---|---|---|---|---|
| (b-31) | (III-C) | VO | Cl | Cl | — |
| (b-32) | | Cu | F | F | — |
| (b-33) | | Ni | —O(CH$_2$)$_3$CH$_3$ | —O(CH$_2$)$_3$CH$_3$ | — |
| (b-34) | | VO | —OH | t-Bu | — |
| (b-35) | (III-D) | Co | —OH | —OH | — |
| (b-36) | | Ni | Et | F | — |
| (b-37) | | Cu | —O(CH$_2$)$_2$CH$_3$ | —O(CH$_2$)$_2$CH$_3$ | — |
| (b-38) | | VO | t-Bu | t-Bu | — |
| (b-39) | (III-E) | VO | Me | Me | t-Bu |
| (b-40) | | Cu | F | F | Et |
| (b-41) | | Co | —NO$_2$ | n-Pr | n-Pr |
| (b-42) | | Ni | —OH | F | —O(CH$_2$)$_4$CH$_3$ |
| (b-43) | (III-F) | VO | —O(CH$_2$)$_3$CH$_3$ | Me | —O(CH$_2$)$_3$CH$_3$ |
| (b-44) | | VO | F | t-Bu | F |
| (b-45) | | Cu | Et | —NH$_2$ | Et |
| (b-46) | | Co | Cl | —O-C$_6$H$_5$ | Cl |

TABLE 8

| Compound | Basic framework | M | Substituents $R_a$ | $R_b$ | $R_c$ | $R_d$ |
|---|---|---|---|---|---|---|
| (b-47) | (III-G) | VO | F | F | F | F |
| (b-48) | | Cu | Cl | —O(CH$_2$)$_3$CH$_3$ | —O(CH$_2$)$_3$CH$_3$ | Cl |
| (b-49) | | VO | F | t-Bu | F | F |
| (b-50) | | Ni | —OH | n-Pr | n-Pr | OH |
| (b-51) | (III-H) | Cu | —C$_6$H$_5$ | —C$_6$H$_5$ | Me | — |
| (b-52) | | Cu | —C$_6$H$_4$-Me | —C$_6$H$_4$-Me | Me | — |
| (b-53) | | VO | —C$_6$H$_4$-n-Bu | —C$_6$H$_4$-Me | Me | — |
| (b-54) | (III-J) | VO | F | t-Bu | t-Bu | F |

TABLE 8-continued

| Basic Compound framework | M | $R_a$ | $R_b$ | $R_c$ | $R_d$ |
|---|---|---|---|---|---|
| (b-55) | Cu | Me | Et | Et | Me |
| (b-56) | Cu | —OH | F | —O(CH$_2$)$_3$CH$_3$ | —OH |

The compound (III) may be synthesized by a generally known method, and, for example, can be synthesized with reference to a method described in Japanese Patent No. 4081149 and "Phthalocyanine-Chemistry and Functions" (IPC, 1997).

<<Cyanine Compound>>

The cyanine compound is not particularly limited, but is preferably a compound represented by any of the following Formulae (IV-1) to (IV-3) (hereinafter referred to as "compounds (IV-1) to (IV-3)")

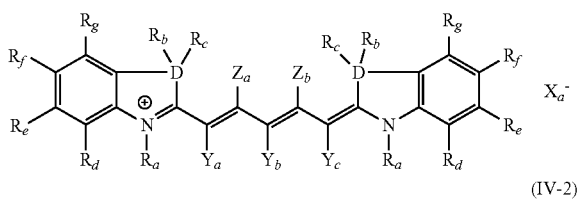

(IV-1)

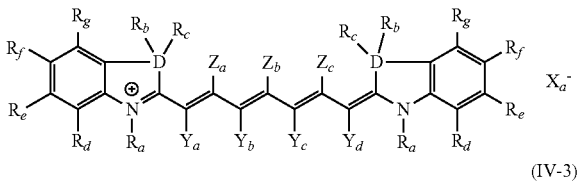

(IV-2)

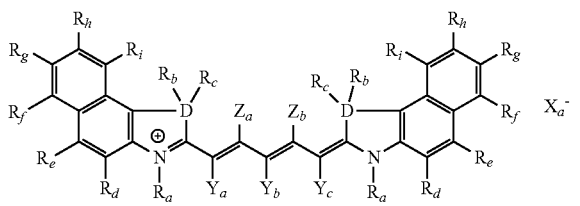

(IV-3)

In Formulae (IV-1) to (IV-3), $X_a^-$ represents a monovalent anion, a plurality of D groups independently represent a carbon atom, a nitrogen atom, an oxygen atom or a sulfur atom, a plurality of $R_a$ groups, $R_b$ groups, $R_c$ groups, $R_d$ groups, $R_e$ groups, $R_f$ groups, $R_g$ groups, $R_h$ groups, and $R_i$ groups each independently represent a hydrogen atom, a halogen atom, a hydroxyl group, a carboxy group, a nitro group, an amino group, an amide group, an imide group, a cyano group, a silyl group, -L$^1$, —S-L$^2$, —SS-L$^3$, —SO$_2$-L$^3$, or —N=N-L$^4$, or at least one group selected from the group consisting of groups represented by Formulae (A) to (H) to which at least one combination of $R_b$ and $R_c$, $R_d$ and $R_e$, $R_e$ and $R_f$, $R_f$ and $R_g$, $R_g$ and $R_h$ and $R_h$ and $R_i$ is bonded, and the amino group, amide group, imide group and silyl group may have the substituent L defined in Formula (I).

$L^1$ is the same as L' defined in Formula (I), $L^2$ represents a hydrogen atom or any of $L^a$ to $L^e$ defined in Formula (I), $L^3$ represents a hydrogen atom or any of $L^a$ to $L^e$, $L^4$ represents any of $L^a$ to $L^e$, $Z_a$ to $Z_c$ and $Y_a$ to $Y_d$ each independently represent a hydrogen atom, a halogen atom, a hydroxyl group, a carboxy group, a nitro group, an amino group, an amide group, an imide group, a cyano group, a silyl group, -L$^1$, —S-L$^2$, —SS-L$^2$, —SO$_2$-L$^3$, and —N=N-L$^4$ ($L^1$ to $L^4$ are the same as $L^1$ to $L^4$ in $R_a$ to $R_i$), or an aromatic hydrocarbon group having 6 to 14 carbon atoms formed by mutual bonding of Z or Y selected from two adjacent elements among them; an alicyclic hydrocarbon group with a 5- to 6-membered ring which may contain at least one nitrogen atom, oxygen atom or sulfur atom; or a heteroaromatic hydrocarbon group having 3 to 14 carbon atoms which contains at least one nitrogen atom, oxygen atom or sulfur atom, and this aromatic hydrocarbon group, alicyclic hydrocarbon group and heteroaromatic hydrocarbon group may include an aliphatic hydrocarbon group having 1 to 9 carbon atoms or a halogen atom.

In $Z_a$ to $Z_c$ and $Y_a$ to $Y_d$, as the aromatic hydrocarbon group having 6 to 14 carbon atoms formed by mutual bonding of Z or Y, for example, a compound exemplified for the aromatic hydrocarbon group in the substituent L is exemplified.

In $Z_a$ to $Z_0$ and $Y_a$ to $Y_d$, as the alicyclic hydrocarbon group with a 5- to 6-membered ring that is formed by mutual bonding of Z or Y and may contain at least one nitrogen atom, oxygen atom or sulfur atom, for example, a compound (excluding the heteroaromatic hydrocarbon group) exemplified for the alicyclic hydrocarbon group and the heterocyclic ring in the substituent L is exemplified.

In $Z_a$ to $Z_c$ and $Y_a$ to $Y_d$, as the heteroaromatic hydrocarbon group having 3 to 14 carbon atoms formed by mutual bonding of Z or Y, for example, a compound (excluding the alicyclic hydrocarbon group containing at least one nitrogen atom, oxygen atom or sulfur atom) exemplified for the heterocyclic group in the substituent L is exemplified.

In Formulae (IV-1) to (IV-3), as —S-L$^2$, —SS-L, —SO$_2$-L$^3$, —N=N-L$^4$, and the amino group, amide group, imide group, and silyl group which may have the substituent L, the same groups as exemplified in Formula (III) is exemplified.

$X_a^-$ is not particularly limited as long as it is a monovalent anion, and I$^-$, Br$^-$, PF$_6^-$, N(SO$_2$CF$_3$)$_2^-$, B(C$_6$F$_5$)$_4^-$, a nickel dithiolate complex, and a copper dithiolate complex are exemplified.

As specific examples of the compounds (IV-1) to (IV-3), (c-1) to (c-24) shown in the following Table 9 can be exemplified.

TABLE 9

| Compound | Basic framework | O | $R_a$ | $R_b$ | $R_c$ | $R_d$ | $R_e$ | $R_f$ | $R_g$ | $R_h$ | $R_i$ | $Y_a$ | $Y_b$ | $Y_c$ | $Y_d$ | $Z_a$ | $Z_b$ | $Z_c$ | $X_a^-$ |
|---|---|---|---|---|---|---|---|---|---|---|---|---|---|---|---|---|---|---|---|
| (c-1) | (IV-1) | C | n-Bu | Me | Me | H | H | H | H | — | — | H | H | H | — | H | H | — | $PF_6^-$ |
| (c-2) | | C | n-Bu | Me | Me | H | H | H | H | — | — | H | Cl | H | — | H | H | — | $PF_6^-$ |
| (c-3) | | S | Et | — | — | H | H | H | H | — | — | H | H | H | — | H | H | — | $I^-$ |
| (c-4) | | C | n-Bu | Me | Me | H | H | H | H | — | — | H | H | H | — | H | H | — | $B(C_6F_5)_4^-$ |
| (c-5) | | C | —(CH$_2$)$_3$CH$_3$ | Me | Me | H | H | H | H | — | — | H | Cl | H | — | H | H | — | 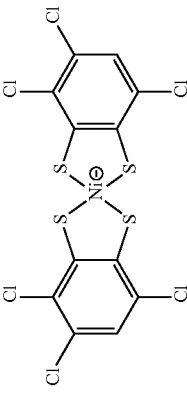 |
| (c-6) | (IV-2) | C | n-Bu | Me | Me | H | H | H | H | — | — | H | H | H | — | H | H | H | $PF_6^-$ |
| (c-7) | | S | Et | — | — | H | H | H | H | — | — | H | H | H | — | H | H | H | $I^-$ |
| (c-8) | | O | n-Bu | Me | Me | H | H | H | H | — | — | H | trimethylene | H | — | H | trimethylene | H | $PF_6^-$ |
| (c-9) | | S | Et | — | — | H | H | H | H | — | — | H | ethylene | H | — | H | Ph | H | $I^-$ |
| (c-10) | | O | n-Bu | Me | Me | H | H | H | H | — | — | H | ethylene | H | — | H | diphenylamino | H | $PF_6^-$ |
| (c-11) | | O | MeCEt | Me | Me | H | H | Cl | H | — | — | H | trimethylene | H | — | H | Cl | H | $PF_6^-$ |
| (c-12) | | O | MeCEt | Me | Me | H | H | Cl | H | — | — | H | H | H | — | H | H | H | $N(SO_2CF_3)_2^-$ |
| (c-13) | | O | MeCEt | Me | Me | H | H | H | H | — | — | H | trimethylene | H | — | H | Cl | H | $N(SO_2CF_3)_2^-$ |
| (c-14) | | O | n-Bu | Me | Me | H | H | H | H | — | — | H | trimethylene | H | — | H | Cl | H | $N(SO_2CF_3)_2^-$ |
| (c-15) | | S | Et | — | — | H | H | H | H | — | — | H | trimethylene | H | — | H | Cl | H | $I^-$ |
| (c-16) | | O | n-Bu | Me | Me | H | H | H | H | — | — | H | ethylene | H | — | H | diphenylamino | H | $I^-$ |
| (c-17) | | O | n-Bu | Me | Me | H | H | H | H | — | — | H | ethylene | H | — | H | diphenylamino | H | $B(C_6F_5)_4^-$ |
| (c-18) | | O | n-Bu | Me | Me | H | H | H | H | — | — | H | ethylene | H | — | H | diphenylamino | H | 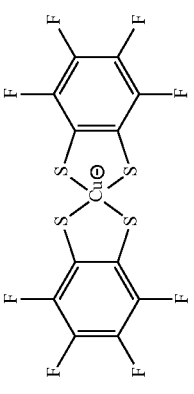 |
| (c-19) | (IV-3) | O | 3-methyl-butyl | Me | Me | H | H | H | H | H | H | H | H | H | — | H | H | — | $PF_6^-$ |
| (c-20) | | O | 3-methyl-butyl | Me | Me | H | H | H | H | H | H | H | Cl | H | — | H | H | — | $PF_6^-$ |
| (c-21) | | O | MeCEt | Me | Me | H | H | H | H | H | H | H | H | H | — | H | H | — | $N(SO_2CF_3)_2^-$ |
| (c-22) | | O | 3-methyl-butyl | Me | Me | H | H | H | H | H | H | H | H | H | — | trimethylene | trimethylene | — | $PF_6^-$ |
| (c-23) | | O | 3-methyl-butyl | Me | Me | H | H | H | H | H | H | H | Ph | H | — | ethylene | ethylene | — | $PF_6^-$ |

TABLE 9-continued
| Compound | Basic framework | $R_a$ | $R_b$ | $R_c$ | $R_d$ | $R_e$ | $R_f$ | $R_g$ | $R_h$ | $R_i$ | $Y_a$ | $Y_b$ | $Y_c$ | $Y_d$ | $Z_a$ | $Z_b$ | $Z_c$ | $X_a^-$ |
|---|---|---|---|---|---|---|---|---|---|---|---|---|---|---|---|---|---|---|
| (c-24) | O | n-Bu | Me | Me | H | H | H | H | H | H | H | Ph | H | — | | ethylene | — | 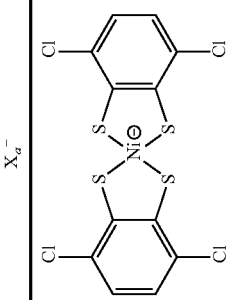 |

The compounds (IV-1) to (IV-3) may be synthesized by a generally known method, and can be synthesized by a method, for example, in Japanese Unexamined Patent Application Publication No. 2009-108267.

An amount of the compound (A) added is appropriately selected according to desired characteristics, and desirably, is generally 0.01 to 20.0 parts by weight, and preferably 0.03 to 10.0 parts by weight with respect to 100 parts by weight of a transparent resin.

<Transparent Resin>

The transparent resin used in the light absorbing layer is not particularly limited as long as the effects of the present invention are not impaired. For example, in order to ensure thermal stability and formability to a film, and obtain a film that can form a dielectric multilayer film by high temperature deposition performed at a vapor deposition temperature of 100° C. or higher, a resin whose glass transition temperature (Tg) is preferably 110 to 380° C., more preferably 110 to 370° C., and most preferably 120 to 360° C. is exemplified. In addition, when the glass transition temperature of the resin is 140° C. or higher, since a film that can be deposited and formed as a dielectric multilayer film at a higher temperature is obtained, this is particularly preferable.

As a transparent resin, when a resin plate with a thickness of 0.1 mm made of the resin is formed, a resin in which the total light transmittance (JIS K7105) of this resin plate is preferably 75 to 95%, more preferably 78 to 95%, and most preferably is 80 to 95% can be used. When a resin having a total light transmittance that is within such a range is used, the obtained substrate exhibits favorable transparency as an optical film.

A weight average molecular weight (Mw) of the transparent resin in terms of polystyrene measured by a gel permeation chromatography (GPC) method is generally 15,000 to 350,000, and preferably 30,000 to 250,000, and a number average molecular weight (Mn) is generally 10,000 to 150,000, and preferably 20,000 to 100,000.

As the transparent resin, for example, a cyclic polyolefin resin, an aromatic polyether resin, a polyimide resin, a fluorene polycarbonate resin, a fluorene polyester resin, a polycarbonate resin, a polyamide (aramid) resin, a polyarylate resin, a polysulfone resin, a polyethersulfone resin, a polyparaphenylene resin, a polyamide imide resin, a polyethylene naphthalate (PEN) resin, a fluorinated aromatic polymer resin, a (modified) acrylic resin, an epoxy resin, an allyl ester curable resin, a silsesquioxane ultraviolet curable resin, an acrylic UV curable resin, a vinyl ultraviolet curable resin, and a resin that contains silica formed by a sol-gel method as a main component can be exemplified. Among them, a cyclic polyolefin resin, an aromatic polyether resin, a fluorene polycarbonate resin, a fluorene polyester resin, a polycarbonate resin, and a polyarylate resin are preferably used because an optical filter having excellent balance in transparency (optical characteristics), heat resistance, and the like is then obtained.

<<Cyclic Polyolefin Resin>>

As the cyclic polyolefin resin, a resin obtained from at least one monomer selected from the group consisting of a monomer represented by the following Formula ($X_0$) and a monomer represented by the following Formula ($Y_0$) and a resin obtained by hydrogenating the resin are preferable.

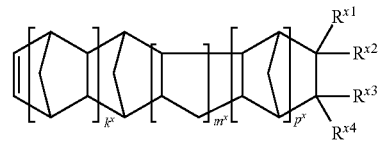

In Formula ($X_0$), $R^{x1}$ to $R^{x4}$ each independently represent an atom or group selected from the following (i') to (ix'), and $k^x$, $m^x$ and $p^x$ each independently represent 0 or a positive integer.

(i') Hydrogen atom (ii') Halogen atom (iii') Trialkylsilyl group (iv') Substituted or unsubstituted hydrocarbon group having 1 to 30 carbon atoms which has a linking group containing an oxygen atom, a sulfur atom, a nitrogen atom or a silicon atom (v') Substituted or unsubstituted hydrocarbon group having 1 to 30 carbon atoms (vi') Polar group (excluding (iv'))

(vii') Alkylidene group formed by mutual bonding of $R^{x1}$ and $R^{x2}$ or $R^{x3}$ and $R^{x4}$ (provided that $R^{x1}$ to $R^{x4}$ not involved in the bonding each independently represent an atom or a group selected from the above (i') to (vi'))

(viii') Monocyclic or polycyclic hydrocarbon ring or heterocyclic ring formed by mutual bonding of $R^{x1}$ and $R^{x2}$ or $R^{x3}$ and $R^{x4}$ (provided that, $R^{x1}$ to $R^{x4}$ not involved in the bonding each independently represent an atom or a group selected from the above (i') to (vi'))

(ix') Monocyclic hydrocarbon ring or heterocyclic ring formed by mutual bonding of $R^{x2}$ and $R^{x3}$ (provided that, $R^{x1}$ and $R^{x4}$ not involved in the bonding each independently represent an atom or a group selected from the above (i') to (vi'))

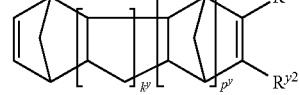

In Formula ($Y_0$), $R^{y1}$ and $R^{y2}$ each independently represent an atom or a group selected from the above (i') to (vi'), represent a monocyclic or polycyclic alicyclic hydrocarbon, aromatic hydrocarbon or heterocyclic ring formed by mutual bonding of $R^{y1}$ and $R^{y2}$, and $k^y$ and $p^y$ each independently represent 0 or a positive integer.

<<Aromatic Polyether Resin>>

The aromatic polyether resin preferably has at least one structural unit selected from the group consisting of a structural unit represented by the following Formula (1) and a structural unit represented by the following Formula (2).

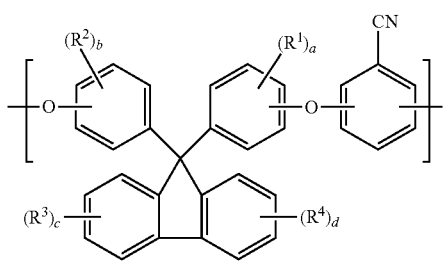

(1)

In Formula (1), $R^1$ to $R^4$ each independently represent a monovalent organic group having 1 to 12 carbon atoms, and a to d each independently represent an integer of 0 to 4.

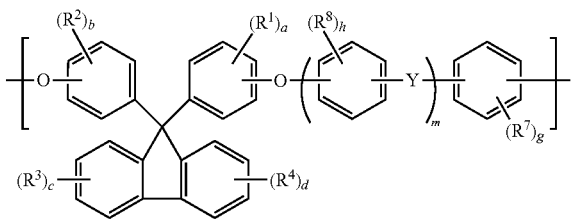

(2)

In Formula (2), $R^1$ to $R^4$ and a to d are each independently the same as $R^1$ to $R^4$ and a to d in Formula (1), Y represents a single bond, —$SO_2$— or >C=O, $R^7$ and $R^8$ each independently represent a halogen atom, a monovalent organic group having 1 to 12 carbon atoms, or a nitro group, g and h each independently represent an integer of 0 to 4, and m represents 0 or 1. Here, when m is 0, $R^7$ is not a cyano group.

In addition, preferably, the aromatic polyether resin further includes at least one structural unit selected from the group consisting of a structural unit represented by the following Formula (3) and a structural unit represented by the following Formula (4).

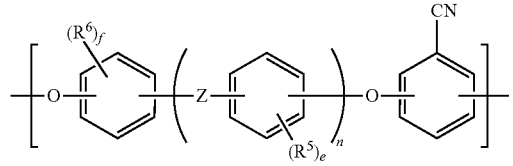

(3)

In Formula (3), $R^5$ and $R^6$ each independently represent a monovalent organic group having 1 to 12 carbon atoms, Z represents a single bond, —O—, —S—, —$SO_2$—, >C=O, —CONH—, —COO— or a divalent organic group having 1 to 12 carbon atoms, e and f each independently represent an integer of 0 to 4, and n represents 0 or 1.

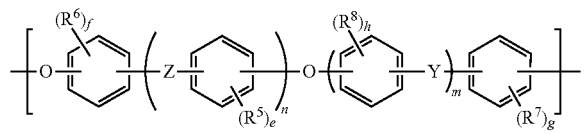

(4)

In Formula (4), $R^7$, $R^8$, Y, m, g and h are each independently the same as $R^7$, $R^8$, Y, m, g and h in Formula (2), and $R^5$, $R^6$, Z, n, e, and f are each independently the same as $R^5$, $R^6$, Z, n, e, and f in Formula (3).

<<Polyimide Resin>>

The polyimide resin is not particularly limited, and may be a polymer compound having an imide bond in a repeating unit, and can be synthesized by a method described, for example, in Japanese Unexamined Patent Application Publication No. 2006-199945, and Japanese Unexamined Patent Application Publication No. 2008-163107.

<<Fluorene Polycarbonate Resin>>

The fluorene polycarbonate resin is not particularly limited, and may be a polycarbonate resin including a fluorene portion, and can be synthesized by a method described, for example, in Japanese Unexamined Patent Application Publication No. 2008-163194.

<<Fluorene Polyester Resin>>

The fluorene polyester resin is not particularly limited, and may be a polyester resin including a fluorene portion, and can be synthesized by a method described, for example, in Japanese Unexamined Patent Application Publication No. 2010-285505 and Japanese Unexamined Patent Application Publication No. 2011-197450.

<<Fluorinated Aromatic Polymer Resin>>

The fluorinated aromatic polymer resin is not particularly limited, but is preferably a polymer having a repeating unit containing an aromatic ring having at least one fluorine atom and at least one bond selected from the group consisting of an ether bond, a ketone bond, a sulfone bond, an amide bond, an imide bond and an ester bond and can be synthesized by a method described, for example, in Japanese Unexamined Patent Application Publication No. 2008-181121.

<<Acrylic UV Curable Resin>>

The acrylic UV curable resin is not particularly limited, and may be a resin synthesized from a resin composition including a compound having at least one acrylic group or methacryl group in a molecule and a compound that is decomposed due to ultraviolet rays and generates active radicals. The acrylic UV curable resin can be particularly suitably used as a curable resin when a base material in which a transparent resin layer (light absorbing layer) containing the compound (S) and the curable resin is laminated on a glass support or a resin support serving as a base or a base material in which a resin layer such as an overcoat layer made of the curable resin is laminated on the transparent resin substrate (ii) containing the compound (S) is used as the base material (i).

<<Resin Containing Silica Formed by Sol-Gel Method as Main Component>>

As the resin containing silica formed by a sol-gel method as a main component, a compound obtained by a sol gel reaction according to hydrolysis of at least one silane selected from a tetraalkoxysilane such as tetramethoxysilane, tetraethoxysilane, dimethoxydiethoxysilane, and methoxytriethoxysilane, and a phenylalkoxysilane such as phenyltrimethoxysilane, phenyltriethoxysilane, diphenyldimethoxysilane, and diphenyldiethoxysilane can be used as the resin.

<<Commercial Products>>

As commercial products of the transparent resin, the following commercial products and the like can be exemplified. As commercial products of the cyclic polyolefin resin, ARTON (commercially available from JSR), ZEONOR (commercially available from Zeon Corporation), APEL (commercially available from Mitsui Chemicals), and TOPAS (commercially available from Polyplastics) can be exemplified. As commercial products of the polyethersulfone resin, SUMIKAEXCEL PES (commercially available from Sumitomo Chemical Company, Limited) can be exemplified. As commercial products of the polyimide resin, NEOPULIM L (commercially available from Mitsubishi Gas Chemical Company, Inc.) can be exemplified. As commercial products of the polycarbonate resin, PURE-ACE (commercially available from Teijin Limited) can be exemplified. As commercial products of the fluorene polycarbonate resin, Lupizeta EP-5000 (commercially available from Mitsubishi Gas Chemical Company, Inc.) can be exemplified. As commercial products of the fluorene polyester resin, OKP4HT (commercially available from Osaka Gas Chemicals Co., Ltd.) can be exemplified. As commercial products of the acrylic resin, Acryviewa (commercially available from Nippon Shokubai Co., Ltd.) can be exemplified. As commercial products of the silsesquioxane ultraviolet curable resin, SILPLUS (commercially available from Nippon Steel & Sumikin Chemical Co., Ltd.) can be exemplified.

<Other Components>

The light absorbing layer may further contain additives such as an antioxidant, a near UV absorber and a fluorescence quencher in a range in which the effects of the present invention are not impaired. Such other components may be used alone or in a mixture of two or more thereof.

As the near UV absorber, for example, an azomethine compound, an indole compound, a benzotriazole compound, and a triazine compound are exemplified.

As the antioxidant, for example, 2,6-di-t-butyl-4-methylphenol, 2,2'-dioxy-3,3'-di-t-butyl-5,5'-dimethyldiphenylmethane, tetrakis[methylene-3-(3,5-di-t-butyl-4-hydroxyphenyl)propionate]methane and tris(2,4-di-t-butylphenyl)phosphite are exemplified.

Here, such additives may be mixed with a resin when the transparent resin is produced, or may be added when a resin is synthesized. In addition, an addition amount is appropriately selected according to desired characteristics, and is generally 0.01 to 5.0 parts by weight, and preferably 0.05 to 2.0 parts by weight with respect to 100 parts by weight of the transparent resin.

<Support>
<<Resin Support>>

As a resin used in the transparent resin substrate or resin support, the same resins as in the transparent resin layer can be used.

<<Glass Support>>

As the glass support, for example, a colorless and transparent glass substrate, a glass substrate containing a copper component, or a flurophosphate glass substrate can be used. In particular, a fluorophosphate glass containing a copper component as an absorber is preferable because it can improve a near infrared cut ability.

<Method of Producing Base Material (i)>

When the base material (i) is a base material including the transparent resin substrate (ii), the transparent resin substrate (ii) can be formed by, for example, melt molding or cast molding, and further, as necessary, after the molding, when a coating agent such as an anti-reflection agent, a hard coating agent and/or an antistatic agent is applied, it is possible to produce a base material in which an overcoat layer is laminated.

When the base material (i) is a base material in which a transparent resin layer (light absorbing layer) such as an overcoat layer made of the curable resin containing the compound (S) or the like is laminated on a glass support or a resin support serving as a base, for example, a resin solution containing the compound (S) is melt-molded or cast-molded on the glass support or the resin support serving as a base. Therefore, preferably, after coating using a spin coating, slit coating, or ink jet method, a solvent is dried and removed, and as necessary, additionally light is emitted and heating is performed. Thereby, it is possible to produce a base material in which the transparent resin layer is formed on the glass support or the resin support serving as a base.

<<Melt Molding>>

As the melt molding, specifically, a method of melt molding pellets obtained by melt kneading a resin, the compound (S), and the like; a method of melt molding a resin composition containing a resin and the compound (S); a method of melt molding pellets obtained by removing a solvent from a resin composition containing the compound (S), a resin and the solvent, and the like are exemplified. As the melt molding method, injection molding, melt extrusion molding, blow molding, and the like can be exemplified.

<<Cast Molding>>

As the cast molding, a method of casting a resin composition containing the compound (S), a resin and a solvent onto an appropriate support and removing the solvent; and a method in which a curable composition containing the compound (S), a photocurable resin and/or a thermosetting resin is cast on an appropriate support, a solvent is removed, and curing is then performed by an appropriate method such as emission of ultraviolet rays or heating can be used for production.

When the base material (i) is a base material formed of the transparent resin substrate (ii) containing the compound (S), the base material (i) can be obtained by separating a coating film from the support after cast molding. In addition, when the base material (i) is a base material in which a transparent resin layer such as an overcoat layer made of a curable resin containing the compound (S) or the like is laminated on a support such as a glass support or a resin support serving as a base, the base material (i) can be obtained without separating a coating film after cast molding.

As the support, supports made of, for example, a glass plate, a steel belt, a steel drum and a transparent resin (for example, a polyester film, and a cyclic olefin resin film) are exemplified.

In addition, according to a method in which the resin composition is applied to an optical component made of a glass plate, or quartz or transparent plastic, and a solvent is dried, or a method in which the curable composition is applied and curing and drying are performed, it is possible to form a transparent resin layer on the optical component.

Preferably, an amount of the residual solvent in the transparent resin layer (the transparent resin substrate (ii)) obtained by the above method is as small as possible. Specifically, the amount of the residual solvent is preferably 3 weight % or less, more preferably 1 weight % or less, and most preferably 0.5 weight % or less with respect to the weight of the transparent resin layer (the transparent resin substrate (ii)). When the amount of the residual solvent is within the above range, it is possible to obtain a transparent resin layer (the transparent resin substrate (ii)) which is unlikely to be deformed and has characteristics that are unlikely to change and can easily exhibit desired functions.

<Dielectric Multilayer Film>

The first optical filter according to the present invention preferably includes a dielectric multilayer film on at least one surface of the base material (i). The dielectric multilayer film in the present invention is a film having an ability to reflect near infrared rays or a film having an antireflection effect in a visible range. When the dielectric multilayer film is included, it is possible to achieve superior visible light transmittance and near infrared ray cut characteristics.

In the present invention, the dielectric multilayer film may be provided on one surface or both surfaces of the base material. When the dielectric multilayer film is provided on one surface, production costs and ease of production are excellent. When the dielectric multilayer film is provided on both surfaces, it is possible to obtain an optical filter which has high strength and in which warping and twisting are unlikely to occur. When the optical filter is applied to a solid-state imaging device application, since an optical filter with less warping and twisting is preferable, the dielectric multilayer film is preferably provided on both surfaces of the resin substrate.

Desirably, the dielectric multilayer film has reflection characteristics over an entire range of preferably a wavelength of 700 to 1,100 nm, more preferably a wavelength of 700 to 1,150 nm, and most preferably 700 to 1,200 nm.

As the dielectric multilayer film, a film obtained by alternately laminating a high refractive index material layer and a low refractive index material layer is exemplified. As a material constituting the high refractive index material layer, a material with a refractive index of 1.7 or more can be used. A material with a refractive index that is generally 1.7 to 2.5 is selected. As such a material, for example, materials that contain titanium oxide, zirconium oxide, tantalum pentoxide, niobium pentoxide, lanthanum oxide, yttrium oxide, zinc oxide, zinc sulfide, indium oxide or the like as a main component and a small amount (for example, 0 to 10 weight % with respect to the main component) of titanium oxide, tin oxide and/or cerium oxide are exemplified.

As a material constituting the low refractive index material layer, a material with a refractive index of 1.6 or less can be used. A material with a refractive index that is generally 1.2 to 1.6 is selected. As such a material, for example, silica, alumina, lanthanum fluoride, magnesium fluoride and sodium aluminum hexafluoride are exemplified.

A method of laminating the high refractive index material layer and the low refractive index material layer is not particularly limited as long as such material layers are laminated to form a dielectric multilayer film. For example, it is possible to form a dielectric multilayer film in which the high refractive index material layer and the low refractive index material layer are alternately laminated on the base material (i) directly according to a CVD method, a sputtering method, a vacuum vapor deposition method, an ion-assisted vapor deposition method or an ion plating method.

Regarding the thickness of each of the high refractive index material layer and the low refractive index material layer, generally, when a near infrared wavelength to be blocked is $\lambda$ (nm), the thickness is preferably $0.1\lambda$ to $0.5\lambda$. A value of $\lambda$ (nm) is, for example, 700 to 1,400 nm, and preferably 750 to 1,300 nm. When the thickness is within this range, an optical film thickness calculated as $\lambda/4$ which is a product (n×d) of a refractive index (n) and a film thickness (d) and the thickness of each of the high refractive index material layer and the low refractive index material layer are almost the same value, and blocking and transmission of a specific wavelength tend to be able to be controlled easily due to a relationship between reflection and refraction optical characteristics.

The total number of laminations of the high refractive index material layer and the low refractive index material layer in the dielectric multilayer film is preferably 16 to 70 layers for the entire optical filter, and more preferably 20 to 60 layers. When the thickness of each layer, the thickness of the dielectric multilayer film as the entire optical filter, and the total number of laminations are within the above ranges, it is possible to ensure sufficient production tolerance and reduce warping of the optical filter and cracks in the dielectric multilayer film.

In the present invention, according to absorption characteristics of the compound (S) or the compound (A), the type of the material constituting the high refractive index material layer and the low refractive index material layer, the thickness of each of the high refractive index material layer and the low refractive index material layer, the order of laminations, and the number of laminations are appropriately selected. Therefore, it is possible to ensure sufficient transmittance in a visible range and obtain sufficient light cut characteristics in a near infrared wavelength range, and it is possible to reduce reflectance when near infrared rays are incident in an oblique direction.

Here, in order to optimize the above conditions, for example, optical thin film design software (for example, Essential Macleod commercially available from Thin Film Center) may be used, and parameters may be set so that it is possible to achieve both an antireflection effect in a visible range and a light cutting effect in a near infrared range. In the case of this software, for example, a parameter setting method in which, when a first optical layer is designed, a target transmittance at a wavelength of 400 to 700 nm is set to 100%, and a value of Target Tolerance is set to 1, and then a target transmittance at a wavelength of 705 to 950 nm is set to 0%, and a value of Target Tolerance is set to 0.5, is exemplified. According to such parameters, a wavelength range is additionally finely divided according to various characteristics of the base material (i) and thus a value of Target Tolerance can be changed.

<Other Functional Films>

In the optical filter of the present invention, in a range in which the effects of the present invention are not impaired, a functional film such as an antireflection film, a hard coating film, and an antistatic film can be appropriately provided between the base material (i) and the dielectric multilayer film, and on a surface of the base material (i) opposite to a surface on which the dielectric multilayer film is provided, or a surface of the dielectric multilayer film opposite to a surface on which the base material (i) is provided, in order to improve surface hardness of the base material (i) and the dielectric multilayer film and improve chemical resistance, and prevent static electricity and scratches.

The optical filter of the present invention may include one layer or two or more layers which are formed of the functional film. When the optical filter of the present invention includes two or more layers formed of the functional film, two or more of the same layer may be included or two or more different layers may be included.

A method of laminating functional films is not particularly limited, and a method in which a coating agent such as an anti-reflection agent, a hard coating agent and/or an anti-static agent is applied to the base material (i) or the dielectric multilayer film according to melt molding or cast molding in the same manner as above and the like can be exemplified.

In addition, after a curable composition containing the coating agent and the like is applied to the base material (i) or the dielectric multilayer film by a bar coater, curing is performed by emitting ultraviolet rays or the like for production.

As the coating agent, an ultraviolet ray (UV)/electron beam (EB) curing type resin, a thermosetting resin, and the like are exemplified. Specifically, vinyl compounds and urethane type, urethane acrylate type, acrylate type, epoxy type and epoxy acrylate type resins are exemplified. As the curable composition containing such a coating agent, vinyl type, urethane type, urethane acrylate type, acrylate type, epoxy type and epoxy acrylate type curable compositions are exemplified.

In addition, the curable composition may contain a polymerization initiator. As the polymerization initiator, a known photopolymerization initiator or thermal polymerization initiator can be used, and a photopolymerization initiator and a thermal polymerization initiator may be used in combination. The polymerization initiators may be used alone or in a mixture of two or more thereof.

In the curable composition, when the total amount of the curable composition is set as 100 weight %, a proportion of the polymerization initiator blended in is preferably 0.1 to 10 weight %, more preferably 0.5 to 10 weight %, and most preferably 1 to 5 weight %. When the proportion of the polymerization initiator blended in is within the above range, the curable composition has excellent curing properties and handling properties, and it is possible to obtain a functional film such as an antireflection film, a hard coating film and an antistatic film having desired hardness.

In addition, an organic solvent may be added to the curable composition as a solvent, and known organic solvents can be used. As specific examples of the organic solvent, alcohols such as methanol, ethanol, isopropanol, butanol, and octanol; ketones such as acetone, methyl ethyl ketone, methyl isobutyl ketone, and cyclohexanone; esters such as ethyl acetate, butyl acetate, ethyl lactate, γ-butyrolactone, propylene glycol monomethyl ether acetate, and propylene glycol monoethyl ether acetate; ethers such as ethylene glycol monomethyl ether, and diethylene glycol monobutyl ether; aromatic hydrocarbons such as benzene, toluene, and xylene; and amides such as dimethylformamide, dimethylacetamide, and N-methylpyrrolidone can be exemplified.

Such solvents may be used alone or in a mixture of two or more thereof.

The thickness of the functional film is preferably 0.1 to 30 μm, more preferably 0.5 to 20 μm, and most preferably 0.7 to 5 μm.

In addition, in order to improve adhesion between the base material (i), and the functional film and/or the dielectric multilayer film, and adhesion between the functional film and the dielectric multilayer film, a surface treatment such as a corona treatment and a plasma treatment may be performed on the surface of the base material (i), the functional film, or the dielectric multilayer film.

[Second Optical Filter]

The second optical filter according to the present invention includes a near infrared absorbing layer (light absorbing layer) and a near infrared reflective layer.

For the near infrared absorbing layer, for example, a form in which a resin layer contains a near infrared absorbing dye and a form in which a fluorophosphate glass layer or a phosphate glass layer contains a copper component are exemplified.

For the second optical filter according to the present invention, for example, a form in which a glass substrate is included and the near infrared absorbing layer is provided on at least one surface of the glass substrate and a form in which a resin substrate is included and the near infrared absorbing layer is provided on at least one surface of the resin substrate are exemplified.

In the second optical filter according to the present invention, the near infrared reflective layer may be a dielectric multilayer film.

Preferably, the second optical filter according to the present invention has a transmittance that satisfies the following conditions (A) to (C).

Condition (A): in a wavelength range of 430 to 580 nm, an average value of transmittance measured in the direction perpendicular to the optical filter is 50% or more, preferably 60% or more, and most preferably 70% or more.

In the present invention, when a transparent resin with a thickness of 0.1 mm having a high total light transmittance and an absorber having no absorption in the wavelength range are used, in such a wavelength of 430 to 580 nm, it is possible to obtain an optical filter having a high transmittance. When an optical filter that satisfies the condition (A) is used, since a sufficient intensity of light incident on the ambient light sensor is obtained, even if the surrounding environment is dark or a dark optical window is used, it is possible to obtain high sensitivity of the ambient light sensor.

Condition (B): in a wavelength range of 800 to 1,000 nm, an average value of transmittance measured in the direction perpendicular to the optical filter is 15% or less, preferably 10% or less, more preferably 5% or less, and most preferably 1% or less.

When an optical filter that satisfies the condition (B) is used, since near infrared rays causing an erroneous operation of the ambient light sensor are cut, it is possible to obtain an ambient light sensor with few erroneous operations. On the other hand, when the transmittance in a wavelength range of 800 to 1,000 nm is high, the optical filter cannot sufficiently cut near infrared rays, and an erroneous operation of the ambient light sensor is caused, which results in degradation of performance of the ambient light sensor.

Condition (C): in a wavelength range of 560 to 800 nm, and preferably 580 to 800 nm, an absolute value ($|Xa-Xb|$) of a difference between a value (Xa) of a wavelength at which a transmittance measured in the direction perpendicular to the optical filter is 50% and a value (Xb) of a wavelength at which a transmittance measured at an angle of 30° with respect to the direction perpendicular to the optical filter is 50% is less than 20 nm, preferably less than 15 nm, and more preferably less than 10 nm.

When an optical filter that satisfies the condition (C) is used, a change in spectral sensitivity characteristics of the ambient light sensor according to an incident angle of incident light is reduced, the sensitivity of the ambient light sensor is lowered, the occurrence of an erroneous operation is prevented, an ambient light sensor sensitivity that is closely related to human vision sensitivity characteristics can be achieved regardless of an incident angle, and high sensor sensitivity characteristics are obtained.

In the present embodiment, an optical filter 104 includes a layer or member that reflects near infrared rays and a layer or member that absorbs near infrared rays. FIG. 1 shows a form in which a near infrared reflective layer 118 and a near infrared absorbing layer 120 are included in the optical filter 104.

The near infrared reflective layer 118 has a characteristic in which light in a near infrared wavelength band is reflected. The near infrared reflective layer 118 is formed of a dielectric multilayer film. The dielectric multilayer film has a structure in which a dielectric film with a relatively high refractive index and a dielectric film with a relatively low refractive index are alternately laminated. The dielectric multilayer film has a characteristic in which light in a visible light band is transmitted according to a light interference effect and light is reflected in a near infrared wavelength band. The dielectric multilayer film exhibits sharp rising (or falling) in spectral transmission characteristics. On the other hand, the dielectric multilayer film has a characteristic in which spectral transmission spectrums differ between vertical incident light and incident light in an oblique direction (oblique incident light). That is, with only the dielectric multilayer film, a spectral transmission spectrum with designed values is obtained with only vertical incident light, but an optical path length varies for oblique incident light, and the spectral transmission spectrum differs from the designed values. Therefore, in an optical filter using only the dielectric multilayer film, when external light is incident at a wide angle, since there is a shift from vision sensitivity characteristics of a photoelectric conversion element 102 in the transmission spectrum of incident light, there is a problem of the occurrence of an erroneous operation.

On the other hand, in the optical filter 104 according to the present embodiment, in addition to the near infrared reflective layer 118, the near infrared absorbing layer 120 is provided. The near infrared absorbing layer 120 has characteristics in which light in a visible light band is transmitted and light in a near infrared wavelength band is absorbed. The near infrared absorbing layer 120 contains a compound that absorbs near infrared rays and has at least one absorption peak in the near infrared wavelength band. The compound that absorbs near infrared rays preferably has an maximum absorption in a wavelength range of 600 nm to 1,500 nm, more preferably has a maximum absorption in a wavelength range of 650 nm to 1,200 nm, still more preferably has a maximum absorption in a wavelength range of 650 nm to 800 nm, and most preferably has a maximum absorption in a wavelength range of 650 nm to 750 nm. When a compound having a maximum absorption in this wavelength range is used, an ambient light sensor with high accuracy and less change in sensor sensitivity according to an incident angle is obtained. For example, as the compound that absorbs near infrared rays, a near infrared absorbing dye can be used.

The near infrared absorbing layer 120 is formed using a compound that absorbs near infrared rays and a near-infrared absorbing composition containing at least one selected from a binder resin and a polymerizable compound. For example, in the near infrared absorbing layer 120, a compound that absorbs near infrared rays may be contained in a resin layer having translucency to visible light.

In the optical filter 104, the near infrared absorbing layer 120 is disposed on a back surface of the near infrared reflective layer 118. The near infrared reflective layer 118 reflects near infrared rays. However, when light in a near infrared wavelength band is included in the transmitted light, the near infrared absorbing layer 120 absorbs light in a near infrared wavelength band included in the transmitted light. For example, light incident in an oblique direction (oblique incident light) to the optical filter 104 changes compared to a case in which the transmission spectrum is based on vertical incidence because the near infrared reflective layer 118 is the dielectric multilayer film. However, even if a light component in a near infrared wavelength band is included in light that passes through the near infrared reflective layer 118 as oblique incident light, the near infrared absorbing layer 120 absorbs the light component. Therefore, it is possible to prevent the light component in a near infrared wavelength band from remaining. In the optical filter 104, the near infrared reflective layer 118 and the near infrared absorbing layer 120 are provided in an overlapping manner, and it is possible to improve performance of blocking near infrared rays. Therefore, when an ambient light sensor 100a measures illuminance, even if light is incident in the oblique direction, it is possible to accurately detect illuminance according to light in a visible light band.

In the present embodiment, preferably, at least one of absorption peak wavelengths of the near infrared absorbing layer 120 has a characteristic in which it overlaps a cutoff wavelength in the near infrared reflective layer 118. Even if a cutoff wavelength of a transmitted light spectrum according to light incident on the near infrared reflective layer 118 in the oblique direction changes, an influence of a shift of the cutoff wavelength can be reduced by the near infrared absorbing layer 120.

The optical filter 104 according to the present embodiment has a transmittance measured in the perpendicular direction that is 50% or more in a wavelength range of 430 nm to 580 nm. In addition, a transmittance measured in the direction perpendicular to the optical filter 104 according to the present embodiment is 15% or less in a wavelength range of 800 nm to 1,000 nm. In the optical filter 104 according to the present embodiment, an absolute value of a difference between a wavelength (Xa) at which a transmittance measured in the perpendicular direction in a wavelength range of 560 nm to 800 nm is 50% and a wavelength (Xb) at which a transmittance measured at an angle of 30° with respect to the direction perpendicular to the optical filter 104 is 50% is less than 20 nm. Desirably, the optical filter 104 according to the present embodiment satisfies the above conditions at the same time.

With such optical characteristics, the optical filter 104 blocks near infrared rays not only for light incident in the perpendicular direction but also light incident in the oblique direction, and it is possible to transmit light in a visible light band with the same optical characteristics regardless of an incident angle.

<Type of Optical Filter>

The second optical filter according to the present invention includes a near infrared reflective layer and a near infrared absorbing layer, but various modifications are allowed as forms thereof.

<<Optical Filter 1>>

Figure 2A:
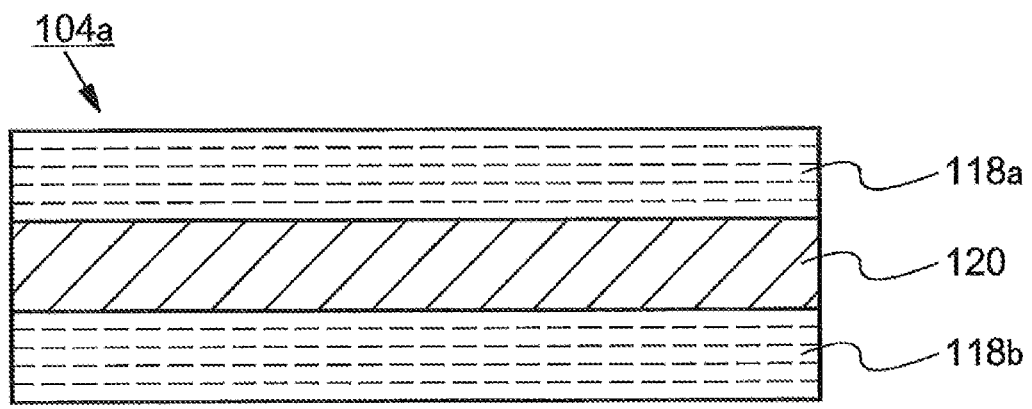
FIGS. 2A and 2B are diagrams showing a configuration of an optical filter according to an embodiment of the present invention.

FIG. 2A shows an optical filter 104a in which a first near infrared reflective layer 118a, the near infrared absorbing layer 120, and a second near infrared reflective layer 118b are provided from a light incident side. The first near infrared reflective layer 118a has a structure in which dielectric films with different refractive indexes are laminated. The second near infrared reflective layer 118b may have the same or a different dielectric multilayer structure from that of the first near infrared reflective layer 118a.

The near infrared absorbing layer 120 contains a compound that absorbs near infrared rays in a translucent resin layer. As the compound that absorbs near infrared rays, for example, a near infrared absorbing dye is exemplified. The near infrared absorbing layer 120 contains a compound that absorbs near infrared rays in the translucent resin layer. In the optical filter 104a, this resin layer may also function as a base material. When the near infrared absorbing layer 120 itself is used as a structural material, it is possible to reduce the thickness of the optical filter 104a.

In the optical filter 104a shown in FIG. 2A, the near infrared absorbing layer 120 is interposed in a structure in which dielectric multilayer films are formed as the first near infrared reflective layer 118a and the second near infrared reflective layer 118b, and it is also possible to prevent variation of the transmitted light spectrum for light incident on the optical filter 104a in the oblique direction.

FIG. 2A shows a form in which a near infrared reflective layer is provided on both surfaces of a near infrared absorbing layer, but the optical filter 104a is not limited to this form. The near infrared reflective layer may be provided on only one surface of the near infrared absorbing layer. For example, the first near infrared reflective layer 118a and the near infrared absorbing layer 120 may constitute the optical filter 104a. Even in such a configuration, a synergistic effect according to the above near infrared reflective layer and near infrared absorbing layer can be exhibited. In addition, a configuration in which either of the first near infrared reflective layer and the second near infrared reflective layer is replaced with an antireflection layer can be used.

<<Optical Filter 2>>

In the optical filter 104a shown in FIG. 2A, glass that absorbs near infrared rays may be used in the near infrared absorbing layer 120. That is, the optical filter 104 may be configured using a glass substrate containing a substance that absorbs near infrared rays in place of a resin layer containing a compound that absorbs near infrared rays. A glass layer may be a fluorophosphate glass layer or phosphate glass layer containing a copper component. Since the glass layer has higher heat resistance and is harder than the resin layer, it is possible to improve heat resistance and structural stability of the optical filter 104.

<<Optical Filter 3>>

Figure 2B:
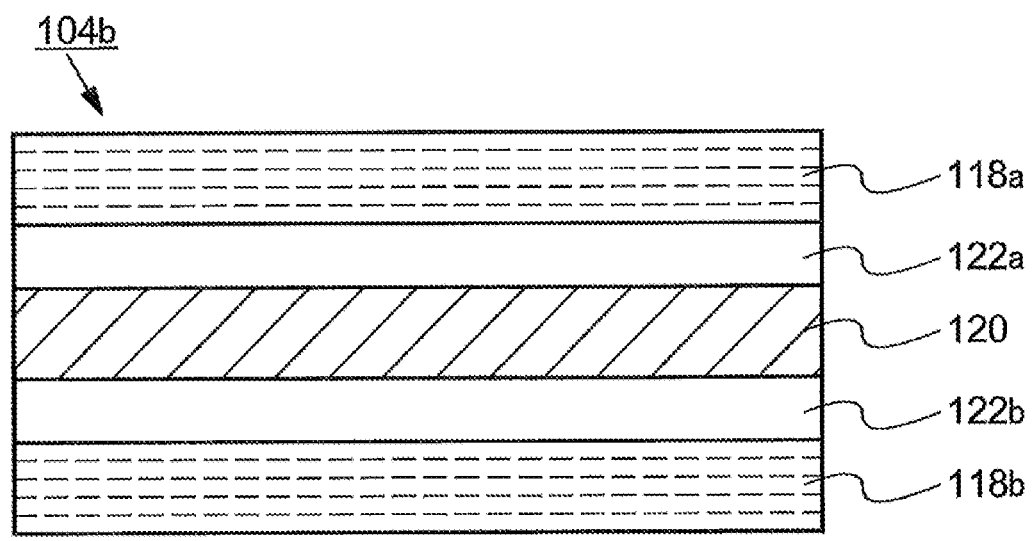

FIG. 2B shows an optical filter 104b in which a first resin layer 122a is provided between the first near infrared reflective layer 118a and the near infrared absorbing layer 120 and a second resin layer 122b is provided between the second near infrared reflective layer 118b and the near infrared absorbing layer 120. When a resin layer is provided between the near infrared reflective layer and the near infrared absorbing layer, it is possible to increase the strength while reducing the thickness of the optical filter 104b. As the near infrared absorbing layer 120, a layer containing a compound that absorbs near infrared rays in the above translucent resin layer or a glass substrate containing a substance that absorbs near infrared rays can be used. Here, in the resin layer 122, only one of the first resin layer 122a and the second resin layer 122b may be provided. In addition, FIG. 2B shows a form in which the near infrared reflective layer is provided on both surfaces of the near infrared absorbing layer, but the optical filter 104b is not limited to this form. The near infrared reflective layer may be provided on only one surface of the near infrared absorbing layer. Here, a near infrared absorber may be contained or not be contained in the resin layers 122a and 122b. In addition, a configuration in which either of the first near infrared reflective layer and the second near infrared reflective layer is replaced with an antireflection layer can be used.

When the optical filter 104b shown in FIG. 2B includes a combination of a near infrared reflective layer and a near infrared absorbing layer, the same operations and effects as in the optical filter 104a shown in FIG. 2A are exhibited.

<<Optical Filter 4>>

Figure 3A:
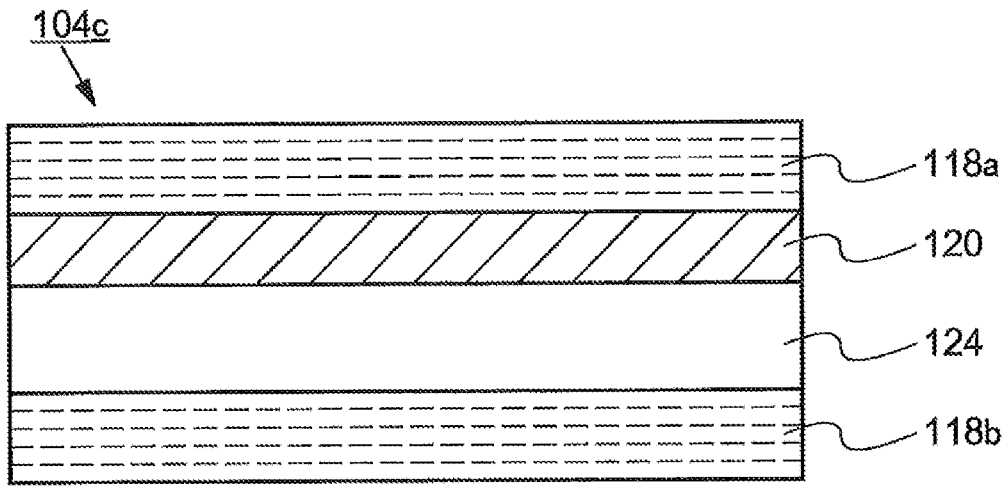
FIGS. 3A and 3B are diagrams showing a configuration of an optical filter according to an embodiment of the present invention.

FIG. 3A shows an optical filter 104c configured using a transparent glass substrate 124. In the optical filter 104c, the near infrared absorbing layer 120 is provided on one surface of the glass substrate 124, and the first near infrared reflective layer 118a is provided thereon. As the near infrared absorbing layer 120, a layer containing a compound that absorbs near infrared rays in the translucent resin layer is used. In addition, the second near infrared reflective layer 118b is provided on the other surface of the glass substrate 124. The transparent glass substrate 124 can be used as a base material of the optical filter 104. When the glass substrate 124 is used as a base material, it is possible to increase the rigidity of the optical filter 104. Here, the second near infrared reflective layer 118b shown in FIG. 3A may be provided between the glass substrate 124 and the near infrared absorbing layer 120.

Here, in the optical filter 104c shown in FIG. 3A, the near infrared absorbing layer 120 may be provided on both surfaces of the glass substrate 124. In addition, a combination of the first near infrared reflective layer 118a and the near infrared absorbing layer 120 may be provided in plural stages. In addition, in place of the transparent glass substrate 124, a glass substrate containing a substance that absorbs near infrared rays may be used. In addition, the near infrared reflective layer may be provided on only one surface of the near infrared absorbing layer. For example, the first near infrared reflective layer 118a, the near infrared absorbing layer 120 and the glass substrate 124 may constitute the optical filter 104c. In addition, a configuration in which either of the first near infrared reflective layer and the second near infrared reflective layer is replaced with an antireflection layer can be used.

The optical filter 104c shown in FIG. 3A has a combination of the near infrared reflective layer and the near infrared absorbing layer and has the same operations and effects as the optical filter 104a shown in FIG. 2A.

<<Optical Filter 5>>

Figure 3B:
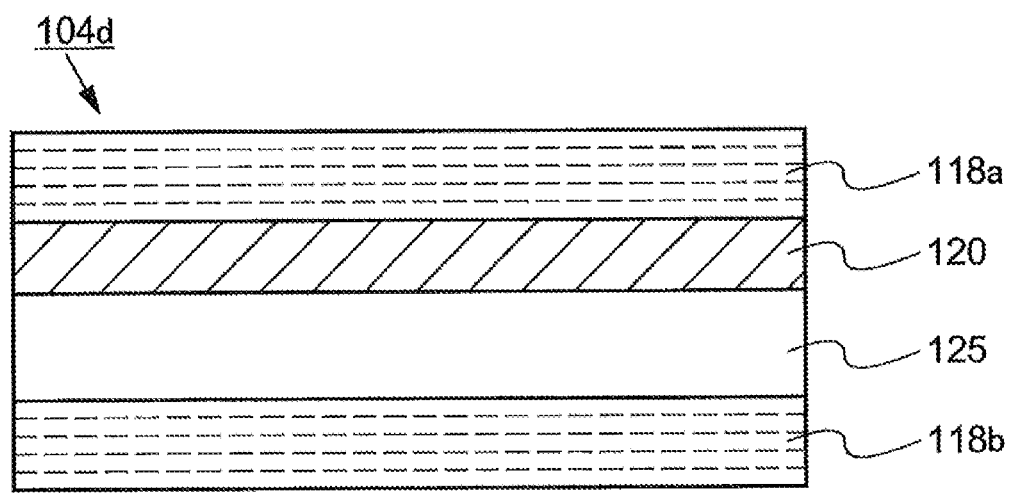

FIG. 3B shows an optical filter 104d configured using a transparent resin substrate 125. In the optical filter 104d, the near infrared absorbing layer 120 is provided on one surface of the resin substrate 125, and the first near infrared reflective layer 118a is provided thereon. In addition, the second near infrared reflective layer 118b is provided on the other surface of the resin substrate 125. The resin substrate 125 can be used as a base material of the optical filter 104. When the resin substrate 125 is used as a base material, it is possible to increase processability and flexibility of the optical filter 104. Here, the second near infrared reflective layer 118b shown in FIG. 3B may be provided between the resin substrate 125 and the near infrared absorbing layer 120. As the near infrared absorbing layer 120, a layer containing a compound that absorbs near infrared rays in the translucent resin layer is used.

Here, in the optical filter 104d shown in FIG. 3B, the near infrared absorbing layer 120 may be provided on both surfaces of the resin substrate 125. In addition, a combination of the first near infrared reflective layer 118a and the near infrared absorbing layer 120 may be provided in plural stages. In addition, the near infrared reflective layer may be provided on only one surface of the near infrared absorbing layer. For example, the first near infrared reflective layer 118a, the near infrared absorbing layer 120 and the resin substrate 125 may constitute the optical filter 104d. In addition, a configuration in which either of the first near infrared reflective layer and the second near infrared reflective layer is replaced with an antireflection layer can be used.

The optical filter 104d shown in FIG. 3B has a combination of the near infrared reflective layer and the near infrared absorbing layer and has the same operations and effects as the optical filter 104a shown in FIG. 2A.

<Near Infrared Reflective Layer>

The near infrared reflective layer 118 is designed to transmit visible light with at least a wavelength band of 400 nm to 600 nm and reflect near infrared rays with at least a wavelength of 750 nm or more. Preferably, the near infrared reflective layer 118 has a high transmittance in a visible range and has an average spectral transmittance of 90% or more in at least a wavelength band of 400 nm to 600 nm. In addition, preferably, the near infrared reflective layer 118 has a spectral transmittance of less than 2% in a near infrared wavelength band of a wavelength of 750 nm or more. This is because near infrared rays are not incident on the photoelectric conversion element 102, and on the other hand, light in a visible light band is detected with high sensitivity.

The near infrared reflective layer 118 preferably has a sharp rising (or falling) characteristic (cutoff characteristic) in the spectral transmission characteristics. When the near infrared reflective layer 118 has a sharp cutoff characteristic, it acts advantageously for an optical design in combination with the near infrared absorbing layer 120. That is, even if the transmission spectrum varies with respect to oblique light incident on the near infrared reflective layer 118, if a cutoff characteristic is sharp, it is easy to adjust a cutoff wavelength to an absorption peak of the near infrared absorbing layer 120.

The near infrared reflective layer 118 is formed of a dielectric multilayer film. Details of the dielectric multilayer film are the same as described in the first optical filter.

The physical film thickness of each of the high refractive index material layer and the low refractive index material layer depends on a refractive index of each layer and preferably, is generally 5 to 500 nm, and a total value of the physical film thickness of the dielectric multilayer film is preferably 1.0 to 8.0 µm for the entire optical filter.

When the optical filter of the present invention is applied in an ambient light sensor application, an optical filter with less warping is preferable. Therefore, preferably, the dielectric multilayer film is provided on both surfaces of the base material, and the dielectric multilayer films provided on both surfaces have the same spectral characteristics or different spectral characteristics. When spectral characteristics of the dielectric multilayer films provided on both surfaces are the same, it is possible to efficiently reduce transmittances in light stop bands Za and Zc in a near infrared wavelength range. When spectral characteristics of the dielectric multilayer films provided on both surfaces are different from each other, the light stop band Zc tends to easily widen toward a longer wavelength side.

<Near Infrared Absorbing Layer and Transparent Resin Substrate>

As a resin containing a near infrared absorbing dye for forming the near infrared absorbing layer 120 and a resin used in the transparent resin substrate 125, a transparent resin can be used. Details of the transparent resins are the same as described in the first optical filter.

When a resin layer containing a near infrared absorbing dye also functions as a resin substrate as in "the optical filter 1" and "the optical filter 3," the thickness of the resin layer containing a near infrared absorbing dye is preferably 10 to 300 µm, more preferably 20 to 200 µm, still more preferably 25 to 150 µm, and most preferably 30 to 120 µm. When the thickness of the resin layer containing a near infrared absorbing dye is within the above range, it is possible to reduce the weight and size of the optical filter and it is possible to achieve a reduction in height of the ambient light sensor. When the thickness of the resin layer is larger than the above range, the original purpose that is a reduction in height of the ambient light sensor cannot be achieved. On the other hand, when the thickness of the resin layer is smaller than the above range, there is a problem of large warping of the optical filter.

In addition, when a resin layer containing a near infrared absorbing dye is provided on a transparent glass substrate or a transparent resin substrate as in "the optical filter 4" and "the optical filter 5," the thickness of the resin layer containing a near infrared absorbing dye is preferably 0.5 to 150 µm, more preferably 0.7 to 100 µm, still more preferably 1 to 50 µm, and most preferably 2 to 30 µm. When the thickness of the resin layer containing a near infrared absorbing dye is within the above range, it is possible to reduce the weight and size of the optical filter and it is possible to achieve a reduction in height of the ambient light sensor. When the thickness of the resin layer is larger than the above range, the original purpose that is a reduction in height of the ambient light sensor cannot be achieved. On the other hand, when the thickness of the resin layer is smaller than the above range, since there is a limitation on solubility of the near infrared absorbing dye in the resin layer, the type and content of a near infrared absorbing dye that can be applied are limited, and it is not possible to obtain sufficient optical characteristics.

The thickness of glass that absorbs near infrared rays used in the near infrared absorbing layer of "the optical filter 2" is preferably 30 to 1,000 µm, more preferably 35 to 500 µm, still more preferably 40 to 300 µm, and most preferably 45 to 210 µm. Near infrared absorbing glass is very brittle. When the thickness of the glass is smaller than the above range, there are problems such as cracking during use, breaking, and large warping, and thus it is difficult to use.

The thickness of the transparent glass substrate used in "the optical filter 4" is preferably 20 to 1,000 µm, more preferably 25 to 500 µm, still more preferably 30 to 300 µm, and most preferably 35 to 210 µm. When the thickness of the transparent glass is within the above range, it is possible to reduce the weight and size of the optical filter and it is possible to achieve a reduction in height of the ambient light sensor. When the thickness of the transparent glass is larger than the above range, the original purpose that is a reduction in height of the ambient light sensor cannot be achieved. On the other hand, when the thickness of the transparent glass is smaller than the above range, warping is larger, and since the glass layer is brittle, there are problems such as cracking and breaking, and thus it is unlikely to be able to be used.

As described above, when the thickness of the glass is thin, since there is a problem of brittleness, in consideration of a reduction in height of the ambient light sensor, the resin substrate is preferably used as in "the optical filters 1, 3, and 5."

Regarding the resin layer containing a near infrared absorbing dye, the resin layer itself can be used as a film substrate, a form in which the present resin layer is coated on another film substrate can be used, and a form in which the present resin layer is coated on a glass substrate can be used. When the resin layer itself is used as a film substrate, it is possible to produce a film substrate by the solution casting method or extrusion molding method described above.

As the film substrate, a resin film made of the transparent resin can be used.

The transparent resin layer may contain additives such as an antioxidant, a near UV absorber, a fluorescence quencher and a metal complex compound in a range in which the effects of the present invention are not impaired in addition to the near infrared absorbing dye. In addition, when a base material is produced by the above cast molding, if a leveling agent or an antifoaming agent is added, it is possible to easily produce the base material. Such components may be used alone or in a mixture of two or more thereof.

The base material may have a single layer or multiple layers. The layer containing a near infrared absorbing dye can be formed by laminating a separate transparent resin layer containing a near infrared absorbing dye in multiple layers or laminating a layer containing a near infrared absorbing dye and a layer containing no near infrared absorbing dye in multiple layers. In addition, a resin layer containing a near infrared absorbing dye can be laminated on a near infrared absorbing glass layer containing a copper component.

In addition, a resin layer such as an overcoat layer containing a curable resin can be laminated on the base material. A near infrared absorbing dye can be incorporated into the curable resin layer.

When the transparent resin layer is used, in consideration of production costs, ease of adjustment of optical characteristics, and additionally, an improvement in scratch resistance of a transparent resin substrate, a base material in which a resin layer such as an overcoat layer made of a curable resin is laminated on the transparent resin substrate containing a near infrared absorbing dye is particularly preferably used.

<Method of Producing Transparent Resin Base Material>

When the base material includes a transparent resin substrate containing a near infrared absorbing dye, the transparent resin substrate can be produced by the method described as in the first optical filter.

<Glass>

As the near infrared absorbing layer, a near infrared absorbing glass containing a copper component (hereinafter referred to as a "Cu-containing glass") can be used. When the Cu-containing glass is used, it has high transmittance properties with respect to visible light and high shielding properties with respect to near infrared rays. Here, the phosphate glass also includes phosphate glass in which a part of a glass framework includes $SiO_2$. As the Cu-containing glass, for example, glasses with the following composition are exemplified.

(GL1) Glass that contains 46 to 70% of $P_2O_5$, 0.2 to 20% of $AlF_3$, 0 to 25% of LiF+NaF+KF, and 1 to 50% of $MgF_2$+CaF+$SrF2$+$BaF_2$+$PbF_2$, where an additional 0.5 to 7 parts by weight of CuO is contained with respect to 100 parts by weight of a base glass containing 0.5 to 32% of F and 26 to 54% of O.

(GL2) Glass that contains 25 to 60% of $P_2O_5$, 1 to 13% of $Al_2OF_3$, 1 to 10% of MgO, 1 to 16% of CaO, 1 to 26% of BaO, 0 to 16% of SrO, 0 to 16% of ZnO, 0 to 13% of $Li_2O$, 0 to 10% of $Na_2O$, 0 to 11% of $K_2O$, 1 to 7% of CuO, 15 to 40% of $\Sigma$RO (R=Mg, Ca, Sr, or Ba), and 3 to 18% of $\Sigma$R'$_2$O (R'=Li, Na, or K) (provided that up to a 39% molar amount of $O^{2-}$ ions are replaced with $F^-$ ions).

(GL3) Glass that contains 5 to 45% of $P_2O_5$, 1 to 35% of $ArF_3$, 0 to 40% of RF (R is Li, Na, or K), 10 to 75% of R'$F_2$ (R' is Mg, Ca, Sr, Ba, Pb, or Zn), 0 to 15% of R"$F_m$ (R" is $L^a$, Y, Cd, Si, B, Zr, or Ta, and m is a number corresponding to the valence of R") (where up to 70% of a total fluoride amount can be replaced with an oxide), and 0.2 to 15% of CuO.

(GL4) Glass that contains, by cation %, 11 to 43% of $P^{5+}$, 1 to 29% of $Al^{3+}$, 14 to 50% of R cations (content of Mg, Ca, Ba, Pb, and Zn ions), 0 to 43% of R' cations (content of Li, Na, and K ions), 0 to 8% of R" cations (content of La, Y, Cd, Si, B, Zr, and Ta ions) and 0.5 to 13% of $Cu^{2+}$, and additionally, by anion %, 17 to 80% of $F^-$.

(GL5) Glass that contains, by cation %, 23 to 41% of $P^{5+}$, 4 to 16% of $Al^{3+}$, 11 to 40% of $Li^+$, 3 to 13% of $Na^+$, 12 to 53% of $R^{2+}$ (content of $Mg^{2+}$, $Ca^{2+}$, $Sr^{2+}$, $Ba^{2+}$, and $Zn^{2+}$) and 2.6 to 4.7% of $Cu^{2+}$, and additionally, by anion %, 25 to 48% of $F^-$ and 52 to 75% of $O^{2-}$.

(GL6) Glass that contains, by mass %, 70 to 85% of $P_2O_5$, 8 to 17% of $Al_2O_3$, 1 to 10% of $B_2O_3$, 0 to 3% of $Li_2O$, 0 to 5% of $Na_2O$, and 0 to 5% of $K_2O$, where an additional 0.1 to 5 parts by weight of CuO is contained with respect to 100 parts by weight of a base glass containing 0.1 to 5% of $Li_2O$+$Na_2O$+$K_2O$ and 0 to 3% of $SiO_2$.

As commercial products, for example, NF50-E and NF50-EX (commercially available from Asahi Glass Co., Ltd.) as (GL1), BG-60 and BG-61 (commercially available from SHOTT) as (GL2), and CD5000 (commercially available from HOYA) as (GL3) are exemplified.

In addition, the Cu-containing glass may further contain a metal oxide. When one or two or more of, for example, $Fe_2O_3$, $MoO_3$, $WO_3$, $CeO_2$, $Sb_2O_3$, and $V_2O_5$ are contained as a metal oxide, the Cu-containing glass has UV absorption characteristics. As contents of the metal oxides, with respect to 100 parts by weight of the Cu-containing glass, with at least one selected from the group consisting of $Fe_2O_3$, $MoO_3$, $WO_3$ and $CeO_2$, preferably, 0.6 to 5 parts by weight of $Fe_2O_3$, 0.5 to 5 parts by weight of $MoO_3$, 1 to 6 parts by weight of $WO_3$, and 2.5 to 6 parts by weight of $CeO_2$, or with two types which are $Fe_2O_3$ and $Sb_2O_3$, 0.6 to 5 parts by weight of $Fe_2O_3$+0.1 to 5 parts by weight of $Sb_2O_3$, or two types which are $V_2O_5$ and $CeO_2$, 0.01 to 0.5 parts by weight of $V_2O_5$+1 to 6 parts by weight of $CeO_2$ are contained.

The thickness of the Cu-containing glass is preferably in a range of 0.03 to 5 mm, and more preferably in a range of 0.05 to 1 mm in consideration of strength, a reduction weight, and a reduction in height.

<Glass Substrate>

A glass substrate without absorption is not particularly limited as long as a substrate contains silicate as a main component, and a quartz glass substrate having a crystal structure and the like are exemplified. In addition, a borosilicate glass substrate, a soda glass substrate, a colored glass substrate and the like can be used. However, particularly, a glass substrate such as an alkali-free glass substrate and a low ca-ray glass substrate is preferable because there is less influence on a sensor element.

<Resin Layer (Adhesive Layer)>

In the present invention, a resin layer may be provided between the near infrared absorbing layer and the near infrared reflective film. In particular, when a glass base material is used as the base material and the near infrared absorbing layer is laminated on the glass substrate, the near infrared absorbing layer and the glass substrate have different chemical compositions and coefficients of linear thermal expansion. Therefore, preferably, an adhesive layer is provided between the near infrared absorbing layer and the glass substrate, and sufficient adhesion therebetween is secured. The adhesive layer used in the present invention is not particularly limited as long as it is made of a material that can ensure adhesion between the near infrared absorbing layer and the glass substrate. For example, when (a) a structural unit derived from a compound having a (meth)acryloyl group, (b) a structural unit derived from a compound having a carboxylic acid group, and (c) a structural unit derived from a compound having an epoxy group are included, this is preferable because adhesion between the near infrared absorbing layer and the glass substrate is improved.

<<(a) Structural Unit Derived from Compound Having a (Meth)Acryloyl Group>>

The structural unit (a) is not particularly limited as long as it is a structural unit derived from a compound having a (meth)acryloyl group. As the compound having a (meth)acryloyl group, for example, monofunctional, bifunctional, trifunctional or higher (meth)acrylic esters are preferable because they have favorable polymerizability. In the present invention, "(meth)acrylic" refers to "acrylic" or "methacrylic."

As the monofunctional (meth)acrylic ester, for example, 2-hydroxyethyl acrylate, 2-hydroxyethyl methacrylate, diethylene glycol monoethyl ether acrylate, diethylene glycol monoethyl ether methacrylate, (2-acryloyloxyethyl)(2-hydroxypropyl) phthalate, (2-methacryloyloxyethyl)(2-hydroxypropyl) phthalate and ω-carboxypolycaprolactone monoacrylate can be exemplified.

As product names of commercial products thereof, for example, ARONIX M-101, ARONIX M-111, ARONIX M-114, and ARONIX M-5300 (all are commercially available from Toagosei Co., Ltd.); KAYARAD TC-110S, and KAYARAD TC-120S (all are commercially available from Nippon Kayaku Co., Ltd.); and Viscoat 158 and Viscoat 2311 (all are commercially available from Osaka Organic Chemical Industry Ltd.) can be exemplified.

As the bifunctional (meth)acrylic ester, for example, ethylene glycol diacrylate, propylene glycol diacrylate, ethylene glycol dimethacrylate, diethylene glycol diacrylate, diethylene glycol dimethacrylate, tetraethylene glycol diacrylate, tetraethylene glycol dimethacrylate, 9,9-bis[4-(2-acryloyloxyethoxy)phenyl]fluorene, 1,6-hexanediol diacrylate, 1,6-hexanediol dimethacrylate, 1,9-nonanediol diacrylate and 1,9-nonanediol dimethacrylate can be exemplified.

As product names of commercial products thereof, for example, ARONIX M-210, ARONIX M-240, and ARONIX M-6200 (all are commercially available from Toagosei Co., Ltd.); KAYARAD HDDA, KAYARAD HDDA HX-220, and KAYARAD HDDA R-604 (all are commercially available from Nippon Kayaku Co., Ltd.); Viscoat 260, Viscoat 312, and Viscoat 335HP (all are commercially available from Osaka Organic Chemical Industry Ltd.); and Light acrylate 1,9-NDA (commercially available from Kyoeisha Chemical Co., Ltd.) can be exemplified.

As the tri- or higher functional (meth)acrylic ester, for example, trimethylolpropane triacrylate, trimethylolpropane trimethacrylate, pentaerythritol triacrylate, pentaerythritol trimethacrylate, pentaerythritol tetraacrylate, pentaerythritol tetramethacrylate, dipentaerythritol pentaacrylate, dipentaerythritol pentamethacrylate, dipentaerythritol hexaacrylate, a mixture of dipentaerythritol pentaacrylate and dipentaerythritol hexaacrylate, dipentaerythritol hexamethacrylate, ethylene oxide-modified dipentaerythritol hexaacrylate, tri(2-acryloyloxyethyl) phosphate, and tri (2-methacryloyloxyethyl) phosphate, and additionally, a multifunctional urethane acrylate compound obtained by reacting a compound that has a linear alkylene group and an alicyclic structure and two or more isocyanate groups with a compound that has one or more hydroxyl groups in a molecule and three, four, or five (meth)acryloyloxy groups can be exemplified.

As product names of commercial products of a tri- or higher functional (meth)acrylic ester, for example, ARONIX M-309, ARONIX M-315, ARONIX M-400, ARONIX M-405, ARONIX M-450, ARONIX M-7100, ARONIX M-8030, ARONIX M-8060, ARONIX TO-1450 (all are commercially available from Toagosei Co., Ltd.); KAYARAD TMPTA, KAYARAD DPHA, KAYARAD DPCA-20, KAYARAD DPCA-30, KAYARAD DPCA-60, KAYARAD DPCA-120, and KAYARAD DPEA-12 (all are commercially available from Nippon Kayaku Co., Ltd.); Viscoat 295, Viscoat 300, Viscoat 360, Viscoat GPT, Viscoat 3PA, and Viscoat 400 (all are commercially available from Osaka Organic Chemical Industry Ltd.); and as a commercial product including a multifunctional urethane acrylate compound, New frontier R-1150 (commercially available from DKS Co. Ltd.); and KAYARAD DPHA-40H (commercially available from Nippon Kayaku Co., Ltd.) can be exemplified.

In the cured layer, such compounds having a (meth) acryloyl group can be used alone or in a mixture of two or more thereof.

<<(b) Structural Unit Derived from Compound Having a Carboxylic Acid Group>>

The structural unit (b) is not particularly limited as long as it is a structural unit derived from a compound having a carboxylic acid group. As the compound having a carboxylic acid group, for example, monocarboxylic acids, dicarboxylic acids, and anhydrides of dicarboxylic acids and a polymer having a carboxylic acid group can be exemplified.

As the monocarboxylic acid, for example, acrylic acid, methacrylic acid, crotonic acid, 2-acryloyloxyethylsuccinic acid, 2-methacryloyloxyethylsuccinic acid, 2-acryloyloxyethylhexahydrophthalic acid and 2-methacryloyloxyethylhexahydrophthalic acid can be exemplified.

As the dicarboxylic acid, for example, maleic acid, fumaric acid and citraconic acid can be exemplified.

As an anhydride of the dicarboxylic acid, an anhydride of a dicarboxylic acid and the like can be exemplified.

In addition, as the polymer having a carboxylic acid group, a polymer including at least one polymerizable compound selected from among, for example, acrylic acid, methacryl acid, maleic acid and maleic anhydride, which is a compound having a carboxylic acid group, or a copolymer of these compounds and a compound having a (meth) acryloyl group can be suitably used.

Among them, in consideration of copolymerization reactivity, acrylic acid, methacryl acid, 2-acyloyloxyethylacetate, 2-methacryloyloxyethylsuccinic acid, or maleic anhydride is preferable.

<<(c) Structural Unit Derived from Compound Having an Epoxy Group>>

The structural unit (c) is not particularly limited as long as it is a structural unit derived from a compound having an epoxy group. As the compound having an epoxy group (oxiranyl group), for example, an unsaturated compound having an oxiranyl group such as a (meth)acrylic acid oxiranyl(cyclo)alkyl ester, an α-alkylacrylic acid oxiranyl (cyclo)alkyl ester, and a glycidyl ether compound having an unsaturated bond; an unsaturated compound having an oxetanyl group such as a (meth)acrylic ester having an oxetanyl group, and the like can be exemplified.

As the (meth)acrylic acid oxiranyl(cyclo)alkyl ester, for example, glycidyl (meth)acrylate, 2-methylglycidyl (meth) acrylate, 4-hydroxybutyl (meth)acrylate glycidyl ether, 3,4-epoxybutyl (meth)acrylate, 6,7-epoxyheptyl (meth)acrylate, 3,4-epoxycyclohexyl (meth)acrylate and 3,4-epoxycyclohexylmethyl (meth)acrylate can be exemplified. As the α-alkylacrylic acid oxiranyl(cyclo)alkyl ester, for example, glycidyl α-ethylacrylate, glycidyl α-n-propylacrylate, glycidyl α-n-butylacrylate, 6,7-epoxyheptyl α-ethyl acrylate and 3,4-epoxycyclohexyl α-ethylacrylate can be exemplified. As the glycidyl ether compound having an unsaturated bond, for example, o-vinylbenzyl glycidyl ether, m-vinylbenzyl glycidyl ether and p-vinylbenzyl glycidyl ether can be exemplified. As the (meth)acrylic ester having an oxetanyl group, for example, 3-((meth)acryloyloxymethyl)oxetane, 3-((meth)acryloyloxymethyl)-3-ethyloxetane, 3-((meth)acryloyloxymethyl)-2-methyloxetane, 3-((meth)acryloyloxyethyl)-3-ethyloxetane, 2-ethyl-3-((meth)acryloyloxyethyl)oxetane, 3-methyl-3-(meth)acryloyloxymethyloxetane and 3-ethyl-3-(meth)acryloyloxymethyloxetane can be exemplified.

Among these, particularly, glycidyl methacrylate, 2-methyl glycidyl methacrylate, 3,4-epoxycyclohexyl methacrylate, 3,4-epoxycyclohexylmethyl methacrylate, 3-methacryloyloxymethyl-3-ethyloxetane, 3-methyl-3-methacryloyloxymethyloxetane or 3-ethyl 3-methacryloyloxymethyloxetane is preferable in consideration of polymerizability.

<<Optional Components>>

In the adhesive layer, in a range in which the effects of the present invention are not impaired, optional components such as an acid generating agent, an adhesion aid, a surfactant, and a polymerization initiator can be added. Addition amounts thereof are appropriately selected according to desired characteristics, but desirably, they are generally 0.01 to 15.0 parts by weight, and preferably 0.05 to 10.0 parts by weight with respect to 100 parts by weight in total of the compound having a (meth)acryloyl group, the compound having a carboxylic acid group and the compound having an epoxy group.

<<Polymerization Initiator>>

The polymerization initiator is a component that generates an active species which can initiate polymerization of a monomer component in response to radiation such as ultraviolet rays and electron beams. The polymerization initiator is not particularly limited, and an O-acyloxime compound, an acetophenone compound, a biimidazole compound, an alkylphenone compound, a benzophenone compound, and the like can be exemplified. As specific examples thereof, ethanone-1-[9-ethyl-6-(2-methylbenzoyl)-9H-carbazol-3-yl]-1-(O-acetyl oxime), 1-[9-ethyl-6-benzoyl-9.H-carbazol-3-yl]-octan-1-one oxime-O-acetate, 1-[9-ethyl-6-(2-methylbenzoyl)-9.H.-carbazol-3-yl]-ethan-1-one oxime-O-benzoate, 1-[9-n-butyl-6-(2-ethylbenzoyl)-9.H.-carbazol-3-yl]-ethan-1-one oxime-O-benzoate, ethanone-1-[9-ethyl-6-(2-methyl-4-tetrahydrofuranylbenzoyl)-9.H-carbazol-3-yl]-1-(O-acetyl oxime), 1,2-octanedione-1-[4-(phenylthio)-2-(O-benzoyloxime)], ethanone-1-[9-ethyl-6-(2-methyl-4-tetrahydropyranylbenzoyl)-9.H.-carbazol-3-yl]-1-(O-acetyl oxime), ethanone-1-[9-ethyl-6-(2-methyl-5-tetrahydrofuranylbenzoyl)-9.H.-carbazol-3-yl]-1-(0-acetyl oxime), ethanone-1-[9-ethyl-6-{2-methyl-4-(2,2-dimethyl-1,3-dioxolane)methoxybenzoyl}-9.H.-carbazol-3-yl]-1-(O-acetyl oxime), 2-benzyl-2-dimethylamino-1-(4-morpholinophenyl)-butan-1-one, 2-dimethylamino-2-(4-methylbenzyl)-1-(4-morpholin-4-yl-phenyl)-butan-1-one, 2-methyl-1-(4-methylthiophenyl)-2-morpholinopropan-1-one, 1-phenyl-2-hydroxy-2-methylpropan-1-one, 1-(4-i-propylphenyl)-2-hydroxy-2-methylpropan-1-one, 4-(2-hydroxyethoxy) phenyl-(2-hydroxy-2-propyl)ketone, 1-hydroxycyclohexylbenzophenone, and 1-hydroxycyclohexyl phenyl ketone can be exemplified. Such polymerization initiators can be used alone or in a mixture of two or more thereof.

The adhesive layer can be produced by, for example, a method of melt molding pellets obtained by melt kneading a composition (G) that contains the compound having a (meth)acryloyl group, the compound having a carboxylic acid group, the compound having an epoxy group and, as necessary, the optional components, a method of melt molding pellets obtained by removing a solvent from a liquid composition containing the composition (G) and the solvent, or a method of casting (cast molding) the above liquid composition. As a melt molding method and a cast molding method, the same methods described above can be exemplified.

An amount of the compound having a (meth)acryloyl group blended in is preferably 30 to 70 parts by weight, and more preferably 40 to 60 parts by weight with respect to 100 parts by weight of the composition (G). An amount of the compound having a carboxylic acid group blended in is preferably 5 to 30 parts by weight, and more preferably 10 to 25 parts by weight with respect to 100 parts by weight of the composition (G). An amount of the compound having an epoxy group blended in is preferably 15 to 50 parts by weight and more preferably 20 to 40 parts by weight with respect to 100 parts by weight of the composition (G).

In addition, an amount of the optional component blended in is appropriately selected according to desired characteristics, and is preferably 0.01 to 15.0 parts by weight and more preferably 0.05 to 10.0 parts by weight with respect to 100 parts by weight of the composition (G).

The thickness of the adhesive layer is not particularly limited as long as the effects of the present invention are not impaired, and is preferably 0.1 to 5.0 µm, and more preferably 0.2 to 3.0 µm.

<Other Functional Films>

Similarly to the first optical filter, in a range in which the effects of the present invention are not impaired, in the second optical filter according to the present invention, a functional film such as an antireflection film, a hard coating film and an antistatic film can be appropriately provided in order to improve surface hardness of the base material and the dielectric multilayer film and improve chemical resistance, and prevent static electricity and scratches.

<Near Infrared Absorbing Dye>

As the near infrared absorbing dye, a squarylium compound, a phthalocyanine compound, a naphthalocyanine compound, a croconium compound, an octaphyrin compound, a hexaphyrin compound, a cyanine compound, a diimmonium compound, an aminium compound, an iminium compound, an anthraquinone compound and the like are exemplified. At least one compound selected from among these compounds can be used, and a mixture of two or more compounds can be used. Among them, in consideration of transmittance characteristics and thermal stability, a squarylium compound, a phthalocyanine compound, or a cyanine compound is suitably used. In addition, the near infrared absorbing dye is preferably the compound (A).

[Application of Optical Filter]

The optical filter of the present invention has an excellent visible transmittance and near infrared cut ability even if an incident angle is large. Therefore, the optical filter is useful for various ambient light sensors such as an illuminance sensor and a color correction sensor. In particular, the optical filter is useful as an ambient light sensor that is mounted in a digital still camera, a smartphone, a tablet terminal, a mobile phone, a wearable device, an automobile, a television, a game machine, or the like. In addition, the optical filter is useful as a thermal radiation cutting filter that is attached to a glass plate for a window of an automobile and a building.

[Ambient Light Sensor]

A combination of the optical filter of the present invention described above and the photoelectric conversion element can be used as the ambient light sensor. Here, the ambient light sensor is a sensor that can detect ambient brightness or a color tone (red is strong in an evening time period) such as an illuminance sensor and a color correction sensor, and can control, for example, an illuminance and hue of a display mounted on a device according to information detected by the ambient light sensor.

<Ambient Light Sensor 1>

FIG. 1 shows the ambient light sensor 100a according to an embodiment of the present invention. The ambient light sensor 100a includes the optical filter 104 and the photoelectric conversion element 102. In the photoelectric conversion element 102, when light is incident on a light receiving unit, a current or a voltage is generated due to a photovoltaic effect. As an example, FIG. 1 shows the photoelectric conversion element 102 including a first electrode 106, a photoelectric conversion layer 108, and a second electrode 114. The photoelectric conversion layer 108 is formed of a semiconductor that exhibits a photoelectric effect. For example, the photoelectric conversion layer 108 is formed using a silicon semiconductor. The optical filter 104 is provided on a light receiving surface side of the photoelectric conversion element 102. Light that has passed through the optical filter 104 is emitted to the light receiving surface of the photoelectric conversion element 102.

By the optical filter 104, light incident on the light receiving surface of the photoelectric conversion element 102 becomes light in a visible light band and light in a near infrared wavelength band (700 nm to 1,200 nm) is blocked. The ambient light sensor 100a is sensitive to light in a visible light band and detects an external light intensity corresponding to vision sensitivity.

The optical filter 104 includes the near infrared reflective layer 118 and the near infrared absorbing layer 120. Light incident on the optical filter 104 is affected by the near infrared reflective layer 118 and the near infrared absorbing layer 120 and a light intensity in a near infrared band is sufficiently reduced. In the optical filter 104, the near infrared reflective layer 118 and the near infrared absorbing layer 120 are provided in an overlapping manner. In other words, the near infrared reflective layer 118 and the near infrared absorbing layer 120 are disposed in series on an optical axis of incident light. According to such disposition, it is possible to block light in a near infrared band not only for light incident on the optical filter 104 in the perpendicular direction but also light incident in the oblique direction. That is, even if light is incident on the optical filter 104 in the oblique direction, a spectral change of transmitted light is prevented.

The ambient light sensor 100a can receive light at a wide angle according to inclusion of the optical filter 104, and even in such a case, it is possible to detect an external light intensity according to vision sensitivity.

Here, in the ambient light sensor 100a, another translucent layer may be interposed between the optical filter 104 and the photoelectric conversion element 102. For example, a translucent resin layer as a sealing material may be provided between the optical filter 104 and the photoelectric conversion element 102.

<Ambient Light Sensor 2>

Figure 4:
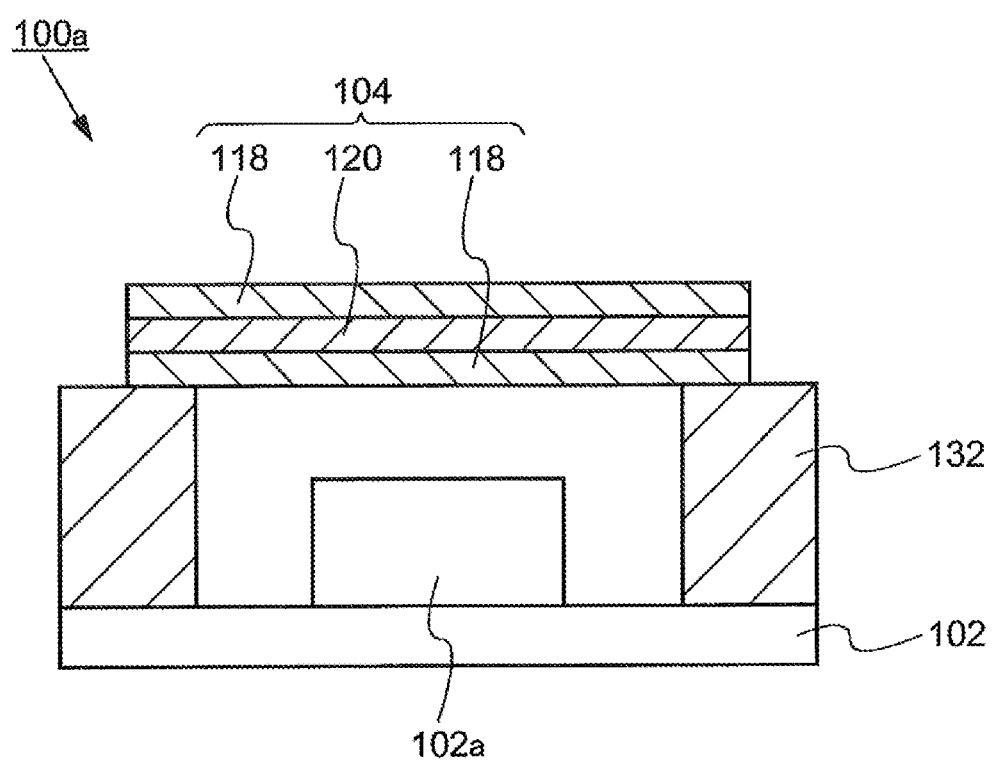
FIG. 4 is a diagram showing a configuration of an ambient light sensor according to an embodiment of the present invention.

FIG. 4 shows an example of a cross-sectional structure of the ambient light sensor 100a including an illuminance sensor light receiving element 102a and the optical filter 104. The ambient light sensor 100a detects an external light intensity by the illuminance sensor light receiving element 102a and functions as an illuminance sensor. The optical filter 104 is provided on the upper surface of the illuminance sensor light receiving element 102a. By the optical filter 104, light in a near infrared wavelength range is blocked from light incident on the light receiving surface of the illuminance sensor light receiving element 102a, and an external light intensity corresponding to vision sensitivity characteristics of the illuminance sensor light receiving element can be detected. When the optical filter 104 including the near infrared reflective layer 118 and the near infrared absorbing layer 120 is used, since light in a visible light band with less change according to an incident angle is incident on the illuminance sensor light receiving element according to vision sensitivity characteristics of the illuminance sensor, an illuminance sensor with few erroneous operations can be obtained.

<Ambient Light Sensor 3>

Figure 5A:
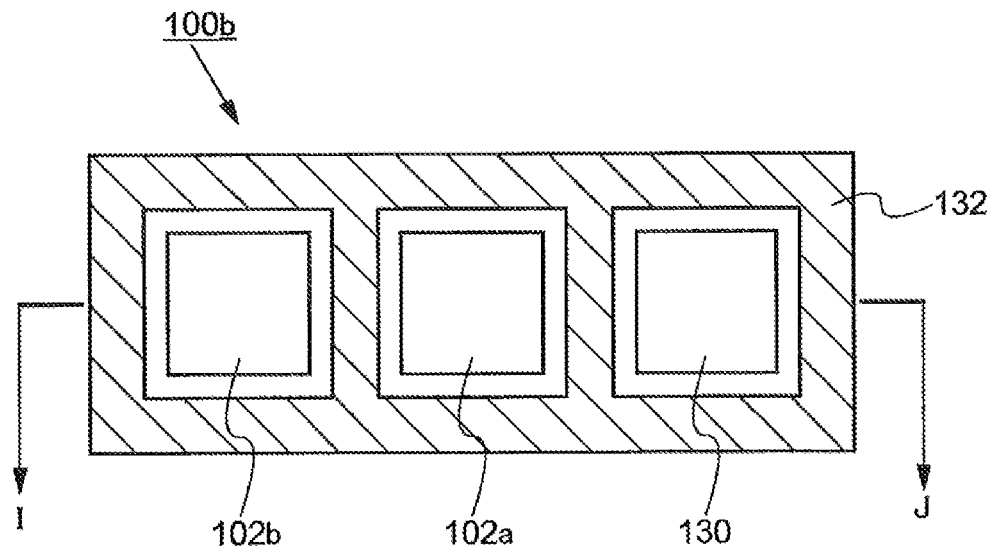
FIGS. 5A and 5B are diagrams showing a configuration of an ambient light sensor according to an embodiment of the present invention.
Figure 5B:
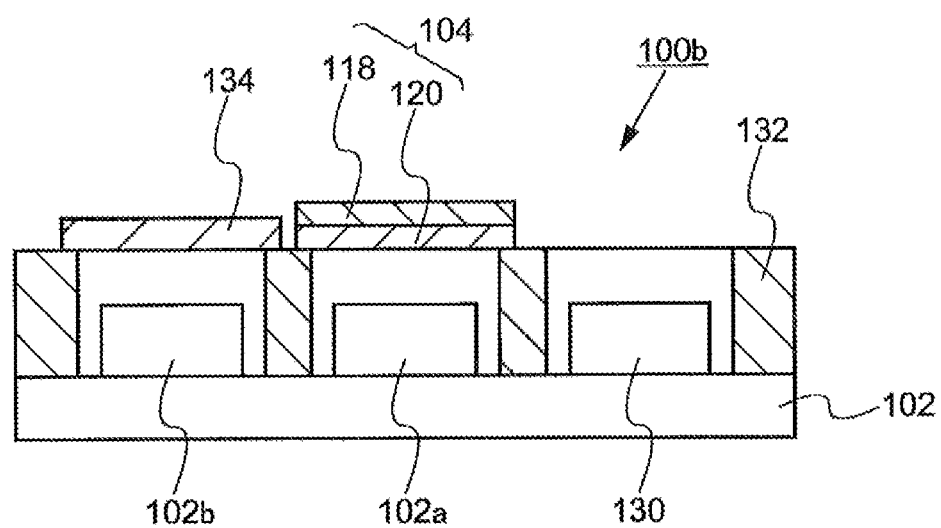

FIGS. 5A and 5B show an example of an ambient light sensor 100b including the illuminance sensor light receiving element 102a, a proximity sensor light receiving element 102b, a light emitting diode 130, and the optical filter 104. Here, FIG. 5A shows a plan view of the ambient light sensor 100b, and FIG. 5B shows a cross-sectional structure taken along the line I-J.

The ambient light sensor 100b detects an external light intensity by the illuminance sensor light receiving element 102a and functions as an illuminance sensor. The light emitting diode 130 emits infrared light and the proximity sensor light receiving element 102b receives the reflected light. That is, the light emitting diode 130 and the proximity sensor light receiving element 102b function as a proximity sensor in cooperation. Gaps between the illuminance sensor light receiving element 102a and the proximity sensor light receiving element 102b, and the light emitting diode 130 are partitioned by a light shielding member 132 so that light emitted from the light emitting diode 130 does not enter as stray light. The light shielding member 132 is made of a curable resin such as an epoxy resin and is formed to surround the illuminance sensor light receiving element 102a, the proximity sensor light receiving element 102b and the light emitting diode 130, and has an upper surface part that is open so that light can enter or light can be emitted.

The optical filter 104 is provided on the upper surface of the illuminance sensor light receiving element 102a. By the optical filter 104, light in a near infrared wavelength range is blocked from light incident on the light receiving surface of the illuminance sensor light receiving element 102a, and an external light intensity can be detected according to vision sensitivity characteristics of the illuminance sensor light receiving element. When the optical filter 104 including the near infrared reflective layer 118 and the near infrared absorbing layer 120 is used, since light in a visible light band with less change according to an incident angle is incident on the illuminance sensor light receiving element according to vision sensitivity characteristics of the illuminance sensor, an illuminance sensor with few erroneous operations can be obtained. In addition, even if reflected light of light emitted from the light emitting diode 130 returns to the illuminance sensor light receiving element 102a, since the light is blocked by the optical filter 104 and does not enter, it is possible to prevent an erroneous operation of the illuminance sensor due to reflected light from a light emitting diode for a proximity sensor. Therefore, the illuminance sensor light receiving element 102a is sensitive to light in a visible light wavelength band within external light and functions as an illuminance sensor.

On the other hand, a near infrared pass filter 134 is provided on a light receiving surface of the proximity sensor light receiving element 102b. The near infrared pass filter 134 is a pass filter configured to transmit light in a near infrared wavelength range. The near infrared pass filter 134 is formed by adding a dye (a pigment or dye) having absorption at a wavelength of a visible light wavelength range, a polymerizable compound, and the like to a binder resin. The near infrared pass filter 134 has spectral transmission characteristics in which light with about less than 700 nm, preferably less than 750 nm, and more preferably less than 800 nm is absorbed (cut), and light with a wavelength of 700 nm or more, preferably 750 nm or more, and more preferably 800 nm or more is transmitted.

The near infrared pass filter 134 blocks light with less than the predetermined wavelength (for example, a wavelength of less than 750 nm) described above and transmits near infrared rays in a predetermined wavelength range (for example, 750 to 950 nm) so that near infrared rays can enter the proximity sensor light receiving element 102*b*. Therefore, the proximity sensor light receiving element 102*b* can detect near infrared rays with high accuracy without being affected by noise due to visible light and the like. The near infrared pass filter 134 can be formed using, for example, a photosensitive composition described in Japanese Unexamined Patent Application Publication No. 2014-130332.

The ambient light sensor 100*b* is mounted on an electronic device, and can detect a brightness of ambient light by a function as an illuminance sensor, and detect an object that approaches a main body of the electronic device by a function as a proximity sensor. According to such functions in the ambient light sensor 100*b*, an electronic device having a touch panel integrated type display screen controls a brightness of a screen according to the brightness of an ambient environment, and turns a display screen off and stops a touch panel function according to a distance from an object, and can support an operation of turning a screen off.

Here, in the ambient light sensor 100*a* shown in FIG. 4, instead of the illuminance sensor light receiving element, a color sensor light receiving element in which an RGB color filter is installed on a photodiode may be provided. Therefore, it is possible to finely control the brightness of a screen and image quality by detecting a spectral intensity ratio (RGB ratio) of ambient light. According to a function as a color sensor, ambient light is spectrally divided into light in a plurality of wavelength bands and can be detected. According to such functions in the ambient light sensor 100*a*, for example, it is possible to support monitoring of maturity of vegetables and fruits in a plant factory.

In the ambient light sensor 100*b* shown in FIGS. 5A and 5B, the optical filter 104 provided on the light receiving surface of the illuminance sensor light receiving element 102*a* can effectively block near infrared rays with respect to light incident in the oblique direction according to a combination of the near infrared reflective layer 118 and the near infrared absorbing layer 120. Therefore, it is possible to realize a proximity sensor integrated type illuminance sensor with less change in sensor sensitivity according to an incident angle and few erroneous operations.

[Sensor Module]

A sensor module can be formed by combining the optical filter of the present invention, another optical filter, a lens, a photoelectric conversion element, and the like.

Figure 17:
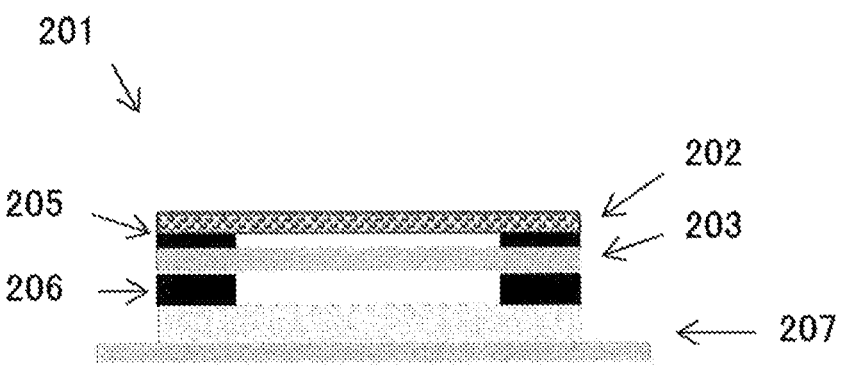
FIG. 17 shows an exemplary form of a light sensor module of the present invention.
Figure 18:
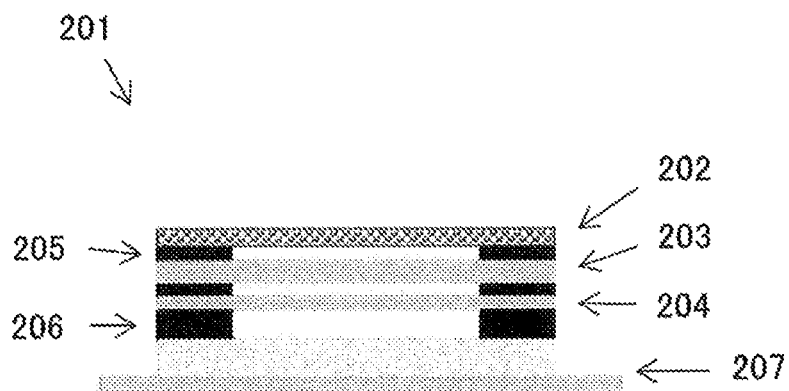
FIG. 18 shows an exemplary form of a light sensor module of the present invention.

FIGS. 17 and 18 show schematic diagrams of a light sensor module 201. In FIG. 17, an optical filter 203 of the present invention is used between a light sensor 207 and a light diffusing film 202. In FIG. 18, in addition to the optical filter 203 of the present invention, an IR cut film 204 having near infrared absorption characteristics is used between the light sensor 207 and the optical filter 203. The light sensor modules 201 in FIGS. 17 and 18 further comprise a light shielding plate 205 and a light shielding spacer 206.

[Electronic Device]

The electronic device of the present invention includes the ambient light sensor of the present invention described above. The electronic device of the present invention will be described below with reference to the drawings.

Figure 6A:
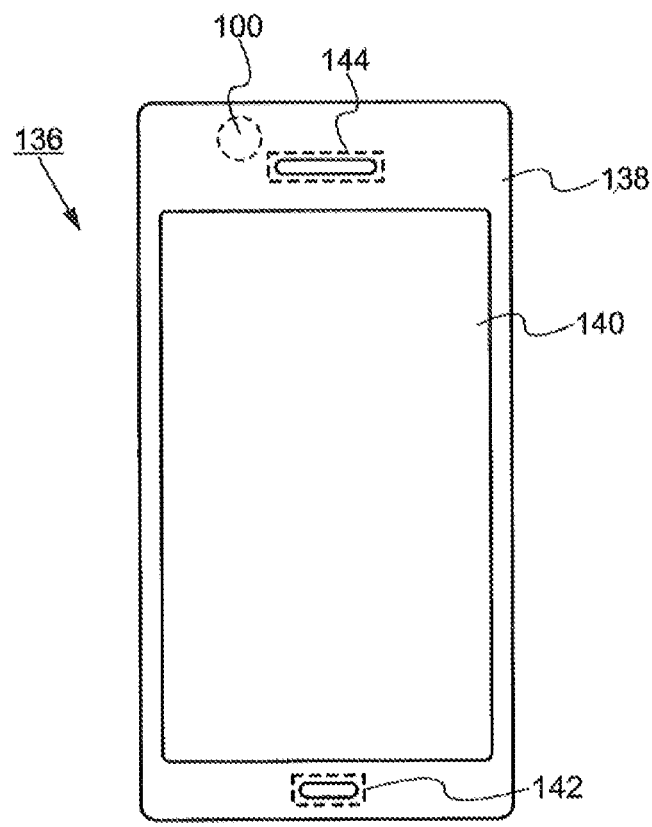
FIGS. 6A to 6C are diagrams showing an example of an electronic device including an ambient light sensor according to an embodiment of the present invention.
Figure 6B:
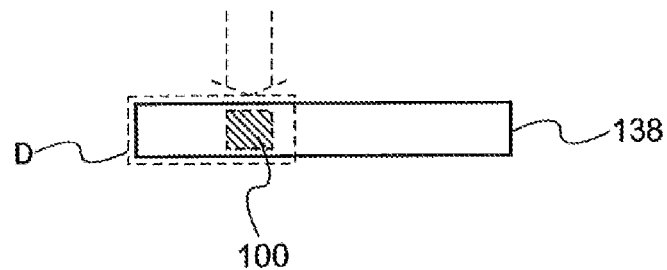
Figure 6C:
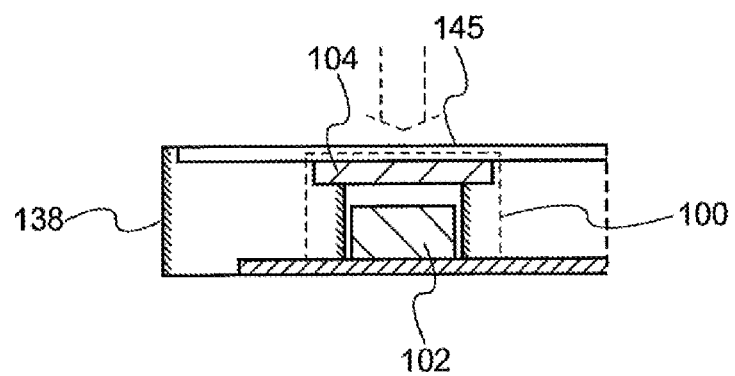

FIGS. 6A to 6C show examples of an electronic device 136. Here, FIG. 6A is a front view of the electronic device 136 and FIG. 6B is a plan view thereof. FIG. 6C is a cross-sectional view showing details of an area D surrounded by a dotted line in FIG. 6B. The electronic device 136 includes a housing 138, a display panel 140, a microphone unit 142, and a speaker unit 144, and additionally, includes the ambient light sensor 100 (the ambient light sensor 100*a* described as "the ambient light sensor 1" or the ambient light sensor 100*b* described as "the ambient light sensor 2"). The ambient light sensor 100 includes the optical filter 104 and the photoelectric conversion element 102. A touch panel is used as the display panel 140, and also has an input function in addition to a display function.

Light is incident on the ambient light sensor 100 through an optical window 145 provided in the housing 138. The ambient light sensor 100 detects an intensity of light of the surroundings in which the electronic device 136 is placed. In addition, when the ambient light sensor 100 has a function of a proximity sensor, in addition to measurement of ambient light, a distance to an object that approaches a surface panel of the electronic device 136 is measured. The electronic device 136 controls the brightness of the display panel 140 by the ambient light sensor 100 and controls on and off of the display panel and on and off of the input function.

The electronic device 136 has a structure in which light is transmitted through the optical window 145 of the housing 138 and hits the ambient light sensor 100 instead of the provision of an aperture through which external light is incident in the ambient light sensor 100 for emphasis of design properties of an external appearance. The optical window 145 is, for example, a member itself used as a surface panel of the electronic device 136 or a part thereof, and has translucency. However, since the surface panel is a member constituting an external appearance of the electronic device 136, it is generally colored. In this case, the optical window 145 has a problem that an amount of transmitted light of visible light decreases and is hidden by information of near infrared rays. However, according to the present embodiment, since the optical filter 104 is provided in the ambient light sensor 100, noise of near infrared rays is excluded and visible light can be detected. Therefore, if the ambient light sensor 100*b* having a function as a color sensor is used, it is possible to prevent a deviation in color tone and detect ambient light accurately.

According to the present embodiment, in the ambient light sensor 100, since the optical filter 104 is provided in the vicinity of a light receiving surface of the photoelectric conversion element 102, it is possible to accurately measure illuminance even for light that is incident at a wide angle.

EXAMPLES

The present invention will be described below with reference to examples, but the present invention is not limited to the examples. Here, unless otherwise specified, "parts" and "%" refer to "parts by weight" and "weight %." In addition, a method of measuring values of physical properties and a method of evaluating physical properties are as follows.

<Molecular Weight>

The molecular weight of a resin was measured by the following (a), (b) or (c) method in consideration of solubility of each resin in a solvent and the like.

(a) A weight average molecular weight (Mw) and a number average molecular weight (Mn) in terms of polystyrene standards were measured using a gel permeation chromatography (GPC) device commercially available from WATERS (150C type, column: H type column commercially available from Tosoh Corporation, eluting solvent: o-dichlorobenzene).

(b) A weight average molecular weight (Mw) and a number average molecular weight (Mn) in terms of polystyrene standards were measured using a GPC device commercially available from Tosoh Corporation (HLC-8220 type, column: TSKgelα-M, eluting solvent: THF).

(c) A part of a polyimide resin solution was added to anhydrous methanol, and a polyimide resin was precipitated and separated from unreacted monomers by filtration. 0.1 g of a polyimide obtained by vacuum drying at 80° C. for 12 hours was dissolved in 20 mL of N-methyl-2-pyrrolidone, and a logarithmic viscosity (μ) at 30° C. was obtained using a Cannon-Fenske viscometer by the following formula.

μ={ln(ts/t0)}/C t0: flow time of solvent
ts: flow time of diluted polymer solution
C: 0.5 g/dL <Glass Transition Temperature (Tg)>

A glass transition temperature (Tg) was measured using a differential scanning calorimeter (DSC6200) (commercially available from Seiko Instruments Inc.) at a heating rate: 20° C. per minute under a nitrogen flow.

<Saturated Water Absorption Rate>

According to ASTM D570, a test piece was immersed in water at 23° C. for 1 week, and a water absorption rate was then measured from a change in weight of the test piece.

<Spectral Transmittance>

Various transmittances, a wavelength, and the like were measured using a spectrophotometer (V-7200) (commercially available from JASCO Corporation).

Figure 7A:
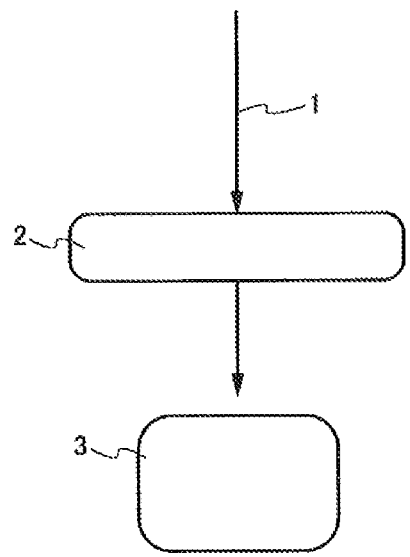
FIGS. 7A to 7C are diagrams showing a configuration in which a transmission spectrum is measured in a perpendicular direction, an oblique direction of 30 degrees, and an oblique direction of 60 degrees.
Figure 7B:
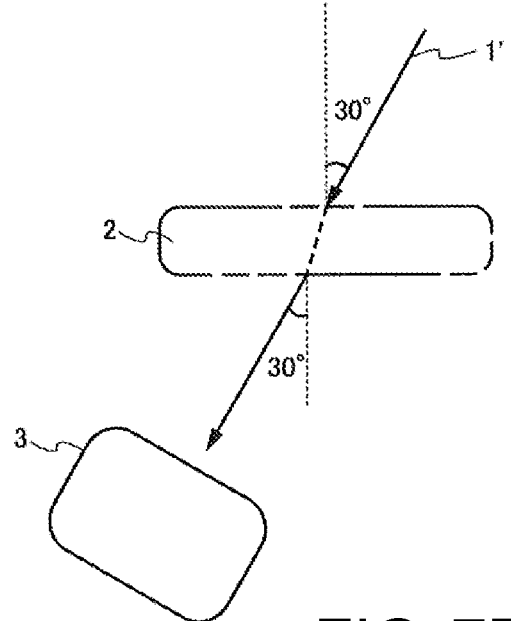
Figure 7C:
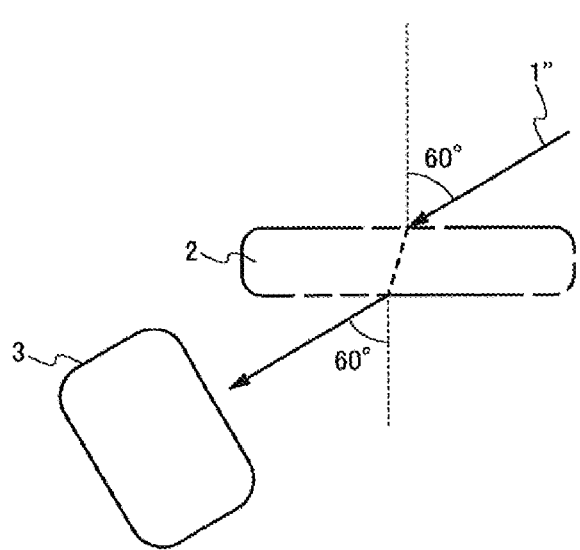

Here, in the transmittance measured in the direction perpendicular to the optical filter, as shown in FIG. 7A, light 1 that was transmitted perpendicular to the optical filter 2 was measured using a spectrophotometer 3. In the transmittance measured at an angle of 30° with respect to the direction perpendicular to the optical filter, as shown in FIG. 7B, light 1' that was transmitted at an angle of 30° with respect to the direction perpendicular to the optical filter 2 was measured using the spectrophotometer 3. In the transmittance measured at an angle of 60° with respect to the direction perpendicular to the optical filter, as shown in FIG. 7C, light 1" that was transmitted at an angle of 60° with respect to the direction perpendicular to the optical filter 2 was measured using the spectrophotometer 3.

Here, the transmittance was measured using the spectrophotometer under conditions in which light was incident perpendicular to the substrate and the optical filter except for measurement of the $(T_B)$, $(T_C)$, $(OD_B)$, $(OD_D)$ and (Xb). When the $(T_C)$ and $(OD_B)$ were measured, measurement was performed using the spectrophotometer under conditions in which light was incident at an angle of 60° with respect to the direction perpendicular to the optical filter. When the $(T_B)$, $(OD_D)$ and (Xb) were measured, measurement was performed using the spectrophotometer under conditions in which light was incident at an angle of 30° with respect to the direction perpendicular to the optical filter.

<Illuminance Sensor Sensitivity Characteristics>

Optical characteristics (optical characteristics of light that passes through the optical filter) of the optical filter and illuminance sensor and human vision sensitivity characteristics were compared. Illuminance sensor sensitivity characteristics when the illuminance sensor having the same configuration as in FIG. 4 was prepared were evaluated. Evaluation and determination were performed on the basis of the following criteria.

A: regardless of an incident angle, light incident on the illuminance sensor could become light that was close to that for human vision sensitivity characteristics, and high sensor sensitivity characteristics were obtained.

B: Since optical characteristics of light incident on the illuminance sensor varied according to an incident angle, there was an error with respect to human vision sensitivity characteristics, and low sensor sensitivity characteristics were obtained.

C: Since optical characteristics of light of incident on the illuminance sensor varied according to an incident angle, there was an error with respect to human vision sensitivity characteristics, and low sensor sensitivity characteristics were obtained. In addition, since the obtained optical filter had a high transmittance at 800 to 1,000 nm, near infrared rays were insufficiently cut by the optical filter, incident light deviated significantly from that for human vision sensitivity characteristics, and an erroneous operation of the illuminance sensor was caused.

Synthesis Examples

The compound (A) used in the following example and comparative examples was synthesized by a generally known method. As the general synthesis method, for example, methods described in Japanese Patent No. 3366697, Japanese Patent No. 2846091, Japanese Patent No. 2864475, Japanese Patent No. 3703869, Japanese Unexamined Patent Application Publication No. S60-228448, Japanese Unexamined Patent Application Publication No. H1-146846, Japanese Unexamined Patent Application Publication No. H1-228960, Japanese Patent No. 4081149, Japanese Unexamined Patent Application Publication No. S63-124054, "Phthalocyanine-Chemistry and Functions" (IPC, 1997), Japanese Unexamined Patent Application Publication No. 2007-169315, Japanese Unexamined Patent Application Publication No. 2009-108267, Japanese Unexamined Patent Application Publication No. 2010-241873, Japanese Patent No. 3699464, and Japanese Patent No. 4740631 can be exemplified.

Resin Synthesis Example 1

100 parts of 8-methyl-8-methoxycarbonyltetracyclo[4.4.0.12,5.17,10]dodeca-3-ene (hereinafter referred to as "DNM") represented by the following Formula (2), 18 parts of 1-hexene (molecular weight regulator), and 300 parts of toluene (solvent for a ring-opening polymerization reaction) were put into a nitrogen-purged reaction container and this solution was heated at 80° C. Next, in the solution in the reaction container, 0.2 parts of a toluene solution of a triethylaluminum (0.6 mol/liter) as a polymerization catalyst and 0.9 parts of a toluene solution of a methanol-modified tungsten hexachloride (concentration 0.025 mol/liter) were added thereto, this solution was heated and stirred at 80° C. for 3 hours, and thus a ring-opening polymerization reaction was caused to obtain a ring-opening polymer solution. A polymerization conversion rate in the polymerization reaction was 97%.

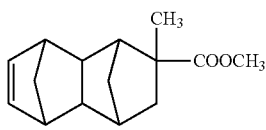
(2)

1,000 parts of a ring-opening polymer solution obtained in this manner was put into an autoclave, 0.12 parts of RuHCl(CO)[P(C$_6$H$_5$)$_3$]$_3$ was added to the ring-opening polymer solution, and this mixture was heated and stirred under conditions of a hydrogen gas pressure of 100 kg/cm$^2$ and a reaction temperature of 165° C. for 3 hours and a hydrogenation reaction was caused.

The obtained reaction solution (hydrogenated polymer solution) was cooled and hydrogen gas was then released. The reaction solution was added to a large amount of methanol, and coagulated substances were separated out and collected and dried to obtain a hydrogenated polymer (hereinafter referred to as "a resin A"). Regarding the molecular weight of the resin A, a number average molecular weight (Mn) was 32,000, and a weight average molecular weight (Mw) was 137,000, and a glass transition temperature (Tg) was 165° C.

Resin Synthesis Example 2

Dehydrated cyclohexane with a water content of 6 ppm; 420.4 g, p-xylene; 180.2 g, 5-trimethoxysilyl-bicyclo[2.2.1]hept-2-ene; 48.75 mmol (10.43 g), and bicyclo[2.2.1]hept-2-ene; 1,425 mmol (134.1 g) were put into a 1 liter autoclave made of stainless steel that was sufficiently dried and purged with nitrogen, and gaseous ethylene was added so that an internal pressure of the autoclave was 0.1 MPa.

The autoclave was heated at 75° C., the total amount of a solution in which 0.003 milligram-atoms of palladium 2-ethylhexanoate (as Pd atoms) as a catalyst component and 0.0015 mmol of tricyclohexylphosphine were reacted in 10 ml of toluene at 25° C. for 1 hour, and 0.00315 mmol of triphenylcarbenium pentafluorophenyl borate were added in that order and polymerization was initiated.

90 minutes after polymerization was initiated, 5-trimethoxysilyl-bicyclo[2.2.1]hept-2-ene; 11.25 mmol (2.41 g) was added, and then 7.5 mmol (1.61 g), 3.75 mmol (0.80 g), and 3.75 mmol were added every 30 minutes a total of four times.

After a polymerization reaction was caused at 75° C. for 4 hours, 1 ml of tributylamine was added to stop polymerization and a solution of an addition polymer B with a solid content of 19.9 weight % was obtained. A part of the solution of the addition polymer B was added to isopropanol, coagulated, and additionally dried to obtain an addition polymer B (hereinafter referred to as a "resin B").

The results of 270 MHz-nuclear magnetic resonance analysis (1H-NMR analysis) of the polymer B was that a proportion of the structural unit derived from 5-trimethoxysilyl-bicyclo[2.2.1]hept-2-ene in the polymer B was 4.8 mol %, regarding the molecular weight, the number average molecular weight (Mn) was 74,000, and the weight average molecular weight (Mw) was 185,000, the glass transition temperature (Tg) was 360° C., and the saturated water absorption rate was 0.35%.

Resin Synthesis Example 3

10.0 parts by weight (0.05 mol) of 4,4'-diaminodiphenyl ether and 85 parts by weight of N-methyl-2-pyrrolidone as a solvent were put into a 500 mL 5-necked flask including a thermometer, a stirrer, a nitrogen inlet tube, a dropping funnel with a side tube, a Dean-Stark tube, and a cooling tube, under a nitrogen flow, and the mixture was dissolved. Then, 11.2 parts by weight (0.05 mol) of 1,2,4,5-cyclohexanetetracarboxylic dianhydride as a solid was added at room temperature over 1 hour in a divided manner, and the mixture was stirred at room temperature for 2 hours.

Next, 30.0 parts by weight of xylene as an azeotropic dehydrating solvent was added, and the temperature was raised to 180° C., reaction was caused for 3 hours, xylene was refluxed using the Dean-Stark tube, and azeotropically generated water was separated out. After 3 hours, it was confirmed that distillation off of water was completed, xylene was distilled off over 1 hour while the temperature was raised to 190° C., 29.0 parts by weight were collected, and air-cooling was then performed until the internal temperature was 60° C., and thereby 105.4 parts by weight of a polyimide N-methyl-2-pyrrolidone solution (hereinafter referred to as a polyimide solution C) was obtained.

Resin Synthesis Example 4

35.12 g (0.253 mol) of 2,6-difluorobenzonitrile, 87.60 g (0.250 mol) of 9,9-bis(4-hydroxyphenyl)fluorene, 41.46 g (0.300 mol) of potassium carbonate, 443 g of N,N-dimethylacetamide (hereinafter referred to as "DMAc") and 111 g of toluene were added to a 3 L 4-necked flask. Subsequently, a thermometer, a stirrer, a 3-way cock with a nitrogen inlet tube, a Dean-Stark tube and a cooling tube were attached to the 4-necked flask. Next, after the inside of the flask was purged with nitrogen, the obtained solution was reacted at 140° C. for 3 hours, and generated water was removed from the Dean-Stark tube at all times. When generation of water was observed no longer, the temperature was gradually raised to 160° C., and reaction was caused for 6 hours at that temperature. After cooling was performed to room temperature (25° C.), the generated salt was removed using filter paper, a filtrate was added to methanol and re-precipitated, and a filtered substance (residue) was isolated by filtration. The obtained filtered substance was vacuum-dried at 60° C. overnight and thereby a white powder (hereinafter referred to as a "resin D") was obtained (yield 95%). The obtained resin D had a number average molecular weight (Mn) of 75,000, a weight average molecular weight (Mw) of 188,000, and a glass transition temperature (Tg) of 285° C.

Resin Synthesis Example 5

27.66 g (0.08 mol) of 1,4-bis(4-amino-α,α-dimethylbenzyl)benzene and 7.38 g (0.02 mol) of 4,4'-bis(4-aminophenoxy)biphenyl were put into a 500 mL 5-necked flask including a thermometer, a stirrer, a nitrogen inlet tube, a dropping funnel with a side tube, a Dean-Stark tube and a cooling tube, under a nitrogen flow, and the mixture was dissolved in 68.65 g of γ-butyrolactone and 17.16 g of N,N-dimethylacetamide. The obtained solution was cooled to 5° C. using an ice water bath, and 22.62 g (0.1 mol) of 1,2,4,5-cyclohexanetetracarboxylic dianhydride and 0.50 g (0.005 mol) of trimethylamine which was an imidization catalyst were added at once while the same temperature was maintained. After the addition was completed, the temperature was raised to 180° C., and the mixture was refluxed for 6 hours while distilling off a distillate at all times. After the reaction was completed, air cooling was performed until the internal temperature was 100° C. Then, 143.6 g of N,N-dimethylacetamide was added for dilution, and cooling was performed with stirring, and thereby 264.16 g of a polyimide resin solution with a solid content concentration of 20 weight % was obtained. A part of the polyimide resin solution was added to 1 L methanol, and a polyimide was precipitated. The filtered off polyimide was washed with methanol, and then dried for 24 hours in a vacuum dryer at 100° C., and thereby a white powder (hereinafter referred to as a "resin E") was obtained. When an IR spectrum of the obtained resin E was obtained, absorption at 1,704 cm$^{-1}$, and 1,770 cm$^1$ specific to an imide group was observed. The resin E had a glass transition temperature (Tg) of 310° C. and a measured logarithmic viscosity was 0.87.

Example A1

With respect to 100 parts by weight of the resin A obtained in the resin synthesis example 1, 0.050 parts by weight of a compound (x) having the following structure (maximum absorption wavelength; 704 nm), 0.056 parts by weight of a compound (y) having the following structure (maximum absorption wavelength; 737 nm), and 0.6 parts by weight of a light absorber "CIR-RL" (commercially available from Japan Carlit Co., Ltd.) (maximum absorption wavelength; 1,095 nm) were added, and additionally, toluene was added and the mixture was dissolved, and thereby a solution with a solid content of 30% was obtained. Next, the solution was cast on a smooth glass plate and dried at 60° C. for 8 hours and at 100° C. for 8 hours, and a resin was then separated from the glass plate. The separated resin was additionally dried at 100° C. for 8 hours under reduced pressure, and thereby a base material with a thickness of 0.1 mm and a side of 60 mm was obtained.

An average OD value ($OD_C$) in 850 to 1,050 nm of the obtained base material was 2.1. The results are shown in Table 11.

Subsequently, a dielectric multilayer film (III) was formed on one surface of the obtained base material, and a dielectric multilayer film (IV) was formed on the other surface of the base material, and thereby an optical filter with a thickness of about 0.104 mm was obtained.

The dielectric multilayer film (III) was obtained by alternately laminating silica ($SiO_2$) layers and titania ($TiO_2$) layers at a vapor deposition temperature of 100° C. (total number of layers of 26). The dielectric multilayer film (IV) was obtained by alternately laminating silica ($SiO_2$) layers and titania ($TiO_2$) layers at a vapor deposition temperature of 100° C. (total number of layers of 20). In both the dielectric multilayer films (III) and (IV), the silica layers and the titania layers were alternately laminated in the order of titania layer, silica layer, titania layer, . . . silica layer, titania layer, and silica layer from the side of the base material, and the outermost layer of the optical filter was a silica layer.

The dielectric multilayer films (III) and (IV) were designed as follows.

The thickness and the number of layers were optimized using optical thin film design software (Essential Macleod commercially available from Thin Film Center) according to wavelength dependent characteristics of a base material refractive index at which an antireflection effect in a visible range and selective transmission and reflection performance in a near infrared range could be achieved and absorption characteristics of the compound (S) and the like applied. When optimization was performed, in the present example, software input parameters (Target value) were set as shown in the following Table 10.

TABLE 10

|  | Wavelength | Incident angle | Required value | Target tolerance | Type |
| --- | --- | --- | --- | --- | --- |
| (III) | 500 to 550 | 30 | 100 | 1 | Transmittance |
|  | 400 to 410 | 0 | 0 | 1 | Transmittance |
|  | 415 | 0 | 50 | 1 | Transmittance |
|  | 420 to 840 | 0 | 100 | 1 | Transmittance |
|  | 950 to 1,260 | 0 | 0 | 1 | Transmittance |
| (IV) | 500 to 550 | 30 | 100 | 1 | Transmittance |
|  | 400 to 410 | 0 | 0 | 1 | Transmittance |
|  | 415 | 0 | 50 | 1 | Transmittance |
|  | 420 to 840 | 0 | 100 | 1 | Transmittance |
|  | 950 to 1,260 | 0 | 0 | 1 | Transmittance |

An average value ($T_A$) of transmittances at a wavelength of 430 to 580 nm in the obtained optical filter was 67%, and an average OD value ($OD_A$) at a wavelength of 850 to 1,050 nm was 4.7. In addition, at a wavelength of 430 to 580 nm, an average transmittance ($T_B$) measured at an angle of 30° with respect to the direction perpendicular to the optical filter was 66%, and an average transmittance ($T_C$) measured at an angle of 60° with respect to the direction perpendicular to the optical filter was 51%. At a wavelength of 850 to 1,050 nm, an average OD value ($OD_D$) measured at an angle of 30° with respect to the direction perpendicular to the optical filter was 4.9, and an average OD value ($OD_B$) measured at an angle of 60° with respect to the direction perpendicular to the optical filter was 3.9. In addition, a ratio of change in the proportion of the R transmittance in the case of 0°→30° was 1.0, a ratio of change in the proportion of the G transmittance in the case of 0°→30° was 1.0, a ratio of change in the proportion of the B transmittance in the case of 0°→30° was 1.0, a ratio of change in the proportion of the R transmittance

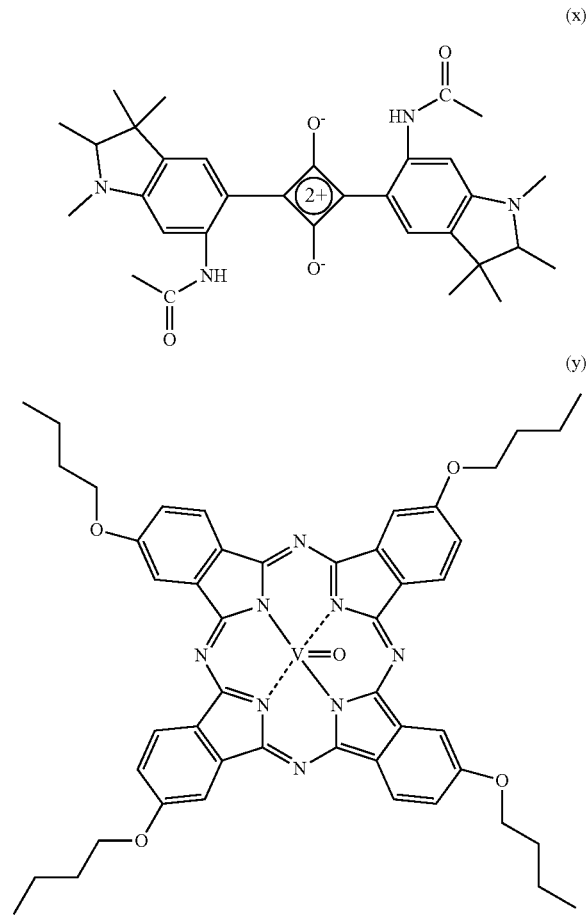

in the case of 0°→60° as 0.6, a ratio of change in the proportion of the G transmittance in the case of 0°→60° was 1.3, and a ratio of change in the proportion of the B transmittance in the case of 0°→60° was 1.0. The results are shown in Table 11.

Example A2

A base material with a thickness of 0.1 mm and a side of 60 mm was obtained in the same manner as in Example A1 except that 0.6 parts by weight of a light absorber "CIR-RL" (commercially available from Japan Carlit Co., Ltd.) was used as the light absorber, and 0.3 parts by weight of a dye "S2058" (maximum absorption wavelength; 980 nm, commercially available from DKSH) was used. In addition, an optical filter with a thickness of 0.105 mm was obtained using the obtained base material in the same manner as in Example A1. Spectral transmittances of the obtained base material and optical filter were measured in the same manner as in Example A1 and optical characteristics were evaluated. The results are shown in Table 11.

Example A3

A base material with a thickness of 0.1 mm and a side of 60 mm was obtained in the same manner as in Example A1 except that the resin B obtained in the resin synthesis example 2 was used in place of the resin A and cyclohexane was used in place of toluene. In addition, an optical filter with a thickness of 0.105 mm was obtained using the obtained base material in the same manner as in Example A1. Spectral transmittances of the obtained base material and optical filter were measured in the same manner as in Example A1 and optical characteristics were evaluated. The results are shown in Table 11.

Example A4

With respect to 100 parts by weight of a norbornene resin "ARTONG" (commercially available from JSR Corporation), 0.050 parts by weight of the compound (x), 0.056 parts by weight of the compound (y), and 0.6 parts by weight of a light absorber "CIR-RL" (commercially available from Japan Carlit Co., Ltd.) were added, and additionally, methylene chloride was added and the mixture was dissolved, and thereby a solution with a solid content of 20% was obtained. Next, the solution was cast on a smooth glass plate and dried at 20° C. for 8 hours, and a resin was then separated from the glass plate. The separated resin was additionally dried at 100° C. for 8 hours under reduced pressure, and thereby a base material with a thickness of 0.1 mm and a side of 60 mm was obtained. In addition, an optical filter with a thickness of 0.105 mm was obtained using the obtained base material in the same manner as in Example A1. Spectral transmittances of the obtained base material and optical filter were measured in the same manner as in Example A1 and optical characteristics were evaluated. The results are shown in Table 11.

Example A5

With respect to 100 parts by weight of a norbornene resin "ZEONOR 1400R" (commercially available from Zeon Corporation), 0.050 parts by weight of the compound (x), 0.056 parts by weight of the compound (y), and 0.6 parts by weight of a light absorber "CIR-RL" (commercially available from Japan Carlit Co., Ltd.) were added, and additionally, a solution in which cyclohexane and xylene were mixed at a ratio of 7:3 was added and the mixture was dissolved, and thereby a solution with a solid content of 20% was obtained. Next, the solution was cast on a smooth glass plate and dried at 60° C. for 8 hours and at 80° C. for 8 hours and a resin was then separated from the glass plate. The separated resin was additionally dried at 100° C. for 24 hours under reduced pressure, and thereby a base material with a thickness of 0.1 mm and a side of 60 mm was obtained. In addition, an optical filter with a thickness of 0.105 mm was obtained using the obtained base material in the same manner as in Example A1. Spectral transmittances of the obtained base material and optical filter were measured in the same manner as in Example A1 and optical characteristics were evaluated. The results are shown in Table 11.

Example A6

With respect to 100 parts by weight of a norbornene resin "APEL#6015" (commercially available from Mitsui Chemicals, Inc.), 0.050 parts by weight of the compound (x), 0.056 parts by weight of the compound (y), and 0.6 parts by weight of a light absorber "CIR-RL" (commercially available from Japan Carlit Co., Ltd.) were added, and additionally, a solution in which cyclohexane and methylene chloride were mixed at a ratio of 99:1 was added and the mixture was dissolved, and thereby a solution with a solid content of 20% was obtained. Next, the solution was cast on a smooth glass plate and dried at 40° C. for 4 hours and at 60° C. for 4 hours and a resin was then separated from the glass plate. The separated resin was additionally dried at 100° C. for 8 hours under reduced pressure, and thereby a base material with a thickness of 0.1 mm and a side of 60 mm was obtained. In addition, an optical filter with a thickness of 0.105 mm was obtained using the obtained base material in the same manner as in Example A1. Spectral transmittances of the obtained base material and optical filter were measured in the same manner as in Example A1 and optical characteristics were evaluated. The results are shown in Table 11.

Example A7

With respect to 100 parts by weight of a polycarbonate resin "PURE-ACE" (commercially available from Teijin Limited), 0.050 parts by weight of the compound (x), 0.056 parts by weight of the compound (y), and 0.6 parts by weight of a light absorber "CIR-RL" (commercially available from Japan Carlit Co., Ltd.) were added, and additionally, methylene chloride was added and the mixture was dissolved, and thereby a solution with a solid content of 20% was obtained. Next, the solution was cast on a smooth glass plate and dried at 20° C. for 8 hours, and a resin was then separated from the glass plate. The separated resin was additionally dried at 100° C. for 8 hours under reduced pressure, and thereby a base material with a thickness of 0.1 mm and a side of 60 mm was obtained. In addition, an optical filter with a thickness of 0.105 mm was obtained using the obtained base material in the same manner as in Example A1. Spectral transmittances of the obtained base material and optical filter were measured in the same manner as in Example A1 and optical characteristics were evaluated. The results are shown in Table 11.

Example A8

With respect to 100 parts by weight of polyethersulfone "FS-1300" (commercially available from Sumitomo Bakelite Co., Ltd.), 0.050 parts by weight of the compound (x), 0.056 parts by weight of the compound (y), and 0.6 parts by weight of a light absorber "CIR-RL" (commercially available from Japan Carlit Co., Ltd.) were added, and additionally, N-methyl-2-pyrrolidone was added and the mixture was dissolved, and thereby a solution with a solid content of 20% was obtained. Next, the solution was cast on a smooth glass plate and dried at 60° C. for 4 hours and at 80° C. for 4 hours, and a resin was then separated from the glass plate. The separated resin was additionally dried at 120° C. for 8 hours under reduced pressure and thereby a base material with a thickness of 0.1 mm and a side of 60 mm was obtained. In addition, an optical filter with a thickness of 0.105 mm was obtained using the obtained base material in the same manner as in Example A1. Spectral transmittances of the obtained base material and optical filter were measured in the same manner as in Example A1 and optical characteristics were evaluated. The results are shown in Table 11.

Example A9

With respect to 100 parts by weight of the polyimide solution C obtained in the resin synthesis example 3, 0.050 parts by weight of the compound (x), 0.056 parts by weight of the compound (y), and 0.6 parts by weight of a light absorber "CIR-RL" (commercially available from Japan Carlit Co., Ltd.) were added, and thereby a solution with a solid content of 20% was obtained. Next, the solution was cast on a smooth glass plate and dried at 60° C. for 4 hours and at 80° C. for 4 hours, and a resin was then separated from the glass plate. The separated resin was additionally dried at 120° C. for 8 hours under reduced pressure and thereby a base material with a thickness of 0.1 mm and a side of 60 mm was obtained. In addition, an optical filter with a thickness of 0.105 mm was obtained using the obtained base material in the same manner as in Example A1. Spectral transmittances of the obtained base material and optical filter were measured in the same manner as in Example A1 and optical characteristics were evaluated. The results are shown in Table 11.

Example A10

With respect to 100 parts by weight of a norbornene resin "ARTONG" (commercially available from JSR Corporation), 0.050 parts by weight of the compound (x), 0.056 parts by weight of the compound (y), and 0.9 parts by weight of a light absorber "CIR-RL" (commercially available from Japan Carlit Co., Ltd.) were added, and additionally, methylene chloride was added and the mixture was dissolved, and thereby a solution with a solid content of 20% was obtained. Next, the solution was cast on a smooth glass plate and dried at 20° C. for 8 hours, and a resin was then separated from the glass plate. The separated resin was additionally dried at 100° C. for 8 hours under reduced pressure, and thereby a base material with a thickness of 0.1 mm and a side of 60 mm was obtained. In addition, an optical filter with a thickness of 0.105 mm was obtained using the obtained base material in the same manner as in Example A1. Spectral transmittances of the obtained base material and optical filter were measured in the same manner as in Example A1 and optical characteristics were evaluated. The results are shown in Table 11.

Example A11

With respect to 100 parts by weight of a norbornene resin "ARTONG" (commercially available from JSR Corporation), 0.050 parts by weight of the compound (x), 0.056 parts by weight of the compound (y), 0.3 parts by weight of a dye "S2058" (commercially available from DKSH), and 3.2 parts by weight of cesium tungsten oxide ($Cs_{0.33}WO_3$) were added, and additionally, methylene chloride was added and the mixture was dissolved, and thereby a solution with a solid content of 20% was obtained. Next, the solution was cast on a smooth glass plate and dried at 20° C. for 8 hours, and a resin was then separated from the glass plate. The separated resin was additionally dried at 100° C. for 8 hours under reduced pressure, and thereby a base material with a thickness of 0.1 mm and a side of 60 mm was obtained. In addition, an optical filter with a thickness of 0.105 mm was obtained using the obtained base material in the same manner as in Example A1. Spectral transmittances of the obtained base material and optical filter were measured in the same manner as in Example A1 and optical characteristics were evaluated. The results are shown in Table 11.

Example A12

In a container, a solution with a resin concentration of 20 weight % was prepared by adding 100 parts of the resin A obtained in the resin synthesis example 1 and methylene chloride. The obtained solution was cast on a smooth glass plate and dried at 20° C. for 8 hours and a coating film was then separated from the glass plate. The separated coating film was additionally dried at 100° C. for 8 hours under reduced pressure, and thereby a transparent resin support with a thickness of 0.1 mm, a length of 60 mm and a width of 60 mm was obtained.

A resin composition (1) having the following composition was applied to one surface of the obtained transparent resin support using a bar coater and heated in an oven at 70° C. for 2 minutes, and the solvent was volatilized and removed. In this case, coating conditions of the bar coater were adjusted so that the thickness after drying was 2 μm. Next, exposing (exposure amount of 500 mJ/cm$^2$, 200 mW) was performed using a conveyor type exposure machine, the resin composition (1) was cured, and a resin layer was formed on the transparent resin support. Similarly, a resin layer made of the resin composition (1) was formed on the other surface of the transparent resin support, and thereby a base material having the resin layer on both surfaces of the transparent resin support was obtained. In addition, an optical filter with a thickness of 0.107 mm was obtained in the same manner as in Example A1 using the obtained base material. Spectral transmittances of the obtained base material and optical filter were measured, and optical characteristics were evaluated. The results are shown in Table 11.

Resin composition (1): 60 parts by weight of tricyclodecanedimethanol acrylate, 40 parts by weight of dipentaerythritol hexaacrylate, 5 parts by weight of 1-hydroxycyclohexyl phenyl ketone, 2.5 parts by weight of the compound (x), 2.8 parts by weight of the compound (y), 30 parts by weight of a light absorber "CIR-RL" (commercially available from Japan Carlit Co., Ltd.), and methyl ethyl ketone (solvent, solid content concentration (TSC): 30%).

Example A13

In a container, a solution with a resin concentration of 20 weight % was prepared by adding 100 parts of the resin A obtained in the resin synthesis example 1, 2.5 parts by weight of the compound (x), 2.8 parts by weight of the compound (y), and 30 parts by weight of a light absorber "CIR-RL" (commercially available from Japan Carlit Co., Ltd.), and adding methylene chloride. The obtained solution was cast on a transparent glass substrate "OA-10G" (thickness of 200 μm, commercially available from Nippon Electric Glass Co., Ltd.) that was cut to a size of 60 mm in length and 60 mm in width and dried at 20° C. for 8 hours, and was then additionally dried at 100° C. for 8 hours under reduced pressure, and thereby a base material having a transparent resin layer with a thickness of 0.202 mm, a length of 60 mm and a width of 60 mm and a glass support was obtained. In addition, an optical filter with a thickness of 0.207 mm was obtained in the same manner as in Example A1 using the obtained base material. Spectral transmittances of the obtained base material and optical filter were measured in the same manner as in Example A1 and optical characteristics were evaluated. The results are shown in Table 11.

Example A14

In a container, a solution with a resin concentration of 20 weight % was prepared by adding 100 parts of the resin A obtained in the resin synthesis example 1, 6.5 parts by weight of a dye "S2058" (commercially available from DKSH), and methylene chloride. The obtained solution was cast on a blue plate glass substrate "BS-6" (thickness of 210 μm, commercially available from Matsunami Glass Ind., Ltd.) that was cut to a size of 60 mm in length and 60 mm in width and dried at 20° C. for 8 hours, and was then additionally dried at 100° C. for 8 hours under reduced pressure, and thereby a base material having a transparent resin layer with a thickness of 0.216 mm, a length of 60 mm and a width of 60 mm and a glass support was obtained. In addition, an optical filter with a thickness of 0.220 mm was obtained using the obtained base material, in the same manner as in Example A1. Spectral transmittances of the obtained base material and optical filter were measured in the same manner as in Example A1 and optical characteristics were evaluated. The results are shown in Table 11.

Example A15

With respect to 100 parts by weight of a norbornene resin "ARTONG" (commercially available from JSR Corporation), 0.075 parts by weight of the compound (x), 0.085 parts by weight of the compound (y), 0.9 parts by weight of a light absorber "CIR-RL" (commercially available from Japan Carlit Co., Ltd.), and 0.10 parts by weight of a compound (z) having the following structure were added, and additionally, methylene chloride was added, and the mixture was dissolved, and thereby a solution with a solid content of 20% was obtained.

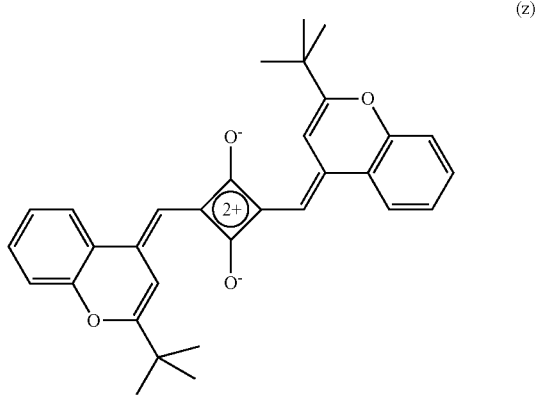
(z)

Next, the solution was cast on a smooth glass plate and dried at 20° C. for 8 hours, and a resin was then separated from the glass plate. The separated resin was additionally dried at 100° C. for 8 hours under reduced pressure, and thereby a transparent resin substrate with a thickness of 0.1 mm and a side of 60 mm was obtained. The spectral transmittance of the obtained transparent resin substrate was measured in the same manner as in Example A1 and optical characteristics were evaluated. The results are shown in Table 11.

Example A16

An optical filter with a thickness of 0.214 mm was obtained in the same manner as in Example A1 except that a blue plate glass substrate "BS-6" (thickness of 210 μm, commercially available from Matsunami Glass Ind., Ltd.) was used as a base material. Spectral transmittances of the base material and the obtained optical filter were measured in the same manner as in Example A1, and optical characteristics were evaluated. The results are shown in Table 11.

Comparative Example A1

In a container, a solution with a resin concentration of 20 weight % was prepared by adding 100 parts of the resin A obtained in the resin synthesis example 1 and methylene chloride. The obtained solution was cast on a smooth glass plate and dried at 20° C. for 8 hours and a coating film was then separated from the glass plate. The separated coating film was additionally dried at 100° C. for 8 hours under reduced pressure, and thereby a base material with a thickness of 0.1 mm, a length of 60 mm and a width of 60 mm was obtained. The spectral transmittance of the obtained base material was measured in the same manner as in Example A1 and optical characteristics were evaluated. The results are shown in Table 11.

Subsequently, a multilayer vapor deposited film [silica ($SiO_2$: film thickness of 120 to 190 nm) layers and titania ($TiO_2$: film thickness of 70 to 120 nm) layers were alternately laminated, and the number of laminations of 52] that reflects near infrared rays at a vapor deposition temperature of 150° C. was formed on one surface of the base material, and thereby an optical filter with a thickness of 0.105 mm was obtained. The spectral transmittance of the obtained optical filter was measured in the same manner as in Example A1 and optical characteristics were evaluated. The results are shown in Table 11.

Comparative Example A2

A base material with a thickness of 0.1 mm and a side of 60 mm was obtained in the same manner as in Example A1 except that 0.6 parts by weight of a light absorber "CIR-RL" (commercially available from Japan Carlit Co., Ltd.) was changed to 0.05 parts by weight. In addition, an optical filter with a thickness of 0.105 mm was obtained using the obtained base material in the same manner as in Example A1. Spectral transmittances of the obtained base material and optical filter were measured in the same manner as in Example A1 and optical characteristics were evaluated. The results are shown in Table 11.

Comparative Example A3

A base material with a thickness of 0.1 mm and a side of 60 mm was obtained in the same manner as in Example A1 except that no light absorber "CIR-RL" (commercially available from Japan Carlit Co., Ltd.) was used. In addition, an optical filter with a thickness of 0.106 mm was obtained using the obtained base material, in the same manner as in Comparative Example A1. Spectral transmittances of the obtained base material and optical filter were measured in the same manner as in Example A1 and optical characteristics were evaluated. The results are shown in Table 11.

TABLE 11

| | Transmittance of visible light | | | OD value of base | Average OD value in 850 to 1,050 nm | | | Case of 0°→30° | | | Case of 0°→60° | | |
|---|---|---|---|---|---|---|---|---|---|---|---|---|---|
| | | | | | | | | Ratio of change in proportion | Ratio of change in proportion | Ratio of change in proportion | Ratio of change in proportion | Ratio of change in proportion | Ratio of change in proportion |
| | $T_A$ (%) (0°) | $T_B$ (%) (30°) | $T_C$ (%) (60°) | material $OD_C$ | $OD_A$ (0°) | $OD_D$ (30°) | $OD_B$ (60°) | of R transmittance | of G transmittance | of B transmittance | of R transmittance | of G transmittance | of B transmittance |
| Example A1 | 67 | 66 | 51 | 2.1 | 4.7 | 4.9 | 3.9 | 1.0 | 1.0 | 1.0 | 0.6 | 1.3 | 1.0 |
| Example A2 | 35 | 33 | 23 | 1.4 | 3.3 | 3.5 | 2.2 | 1.0 | 1.0 | 1.0 | 0.7 | 1.3 | 1.0 |
| Example A3 | 66 | 63 | 48 | 2.1 | 6.0 | 6.4 | 4.5 | 1.0 | 1.0 | 1.0 | 0.9 | 1.2 | 0.8 |
| Example A4 | 67 | 66 | 51 | 2.1 | 4.7 | 4.9 | 3.9 | 1.0 | 1.0 | 1.0 | 0.6 | 1.3 | .0 |
| Example A5 | 68 | 67 | 52 | 2.1 | 4.7 | 4.9 | 3.9 | 1.0 | 1.0 | 1.0 | 0.7 | 1.3 | .0 |
| Example A6 | 67 | 66 | 52 | 2.1 | 4.7 | 4.9 | 3.9 | 0.9 | 1.1 | 1.0 | 0.7 | 1.3 | .0 |
| Example A7 | 63 | 64 | 65 | 2.1 | 4.7 | 4.9 | 3.9 | 0.9 | 1.1 | 1.0 | 0.6 | 1.3 | .0 |
| Example A8 | 66 | 65 | 50 | 2.1 | 4.7 | 4.9 | 3.9 | 0.9 | 1.1 | 1.0 | 0.6 | 1.3 | .0 |
| Example A9 | 66 | 65 | 50 | 2.1 | 4.7 | 4.9 | 3.9 | 1.0 | 1.0 | 1.0 | 0.6 | 1.3 | .0 |
| Example A10 | 59 | 58 | 44 | 2.6 | 5.2 | 5.5 | 4.5 | 1.0 | 1.0 | 1.0 | 0.7 | 1.2 | .0 |
| Example A11 | 40 | 38 | 27 | 1.1 | 3.3 | 3.5 | 2.2 | 1.0 | 1.0 | 1.0 | 0.7 | 1.3 | 1.0 |
| Example A12 | 65 | 63 | 47 | 2.1 | 6.0 | 6.4 | 4.5 | 1.0 | 1.0 | 1.0 | 0.9 | 1.2 | 0.8 |
| Example A13 | 65 | 62 | 47 | 2.1 | 6.0 | 6.4 | 4.5 | 0.9 | 1.1 | 1.0 | 0.9 | 1.2 | 0.8 |
| Example A14 | 90 | 88 | 71 | 1.1 | 3.6 | 3.4 | 2.1 | 1.0 | 1.0 | 1.0 | 0.6 | 1.3 | 1.0 |
| Example A15 | 49 | 44 | 31 | 2.6 | 2.9 | 3.3 | 4.6 | 1.0 | 1.0 | 1.0 | 0.9 | 1.2 | 0.9 |
| Example A16 | 92 | 92 | 75 | 1.1 | 3.5 | 3.3 | 2.3 | 1.0 | 1.0 | 1.0 | 0.6 | 1.2 | 1.0 |
| Comparative Example A1 | 94 | 92 | 73 | 0 | 3.3 | 3.0 | 1.2 | 1.0 | 1.0 | 1.0 | 0.9 | 1.2 | 0.9 |
| Comparative Example A2 | 89 | 88 | 71 | 0.2 | 2.7 | 2.5 | 1.4 | 1.0 | 1.0 | 1.0 | 0.6 | 1.2 | 1.0 |
| Comparative Example A3 | 91 | 91 | 74 | 0 | 2.0 | 1.9 | 1.1 | 1.0 | 1.0 | 1.0 | 0.6 | 1.2 | 1.0 |
| Comparative Example A4 | 57 | 61 | 48 | 0 | 3.1 | 3.3 | 2.1 | 0.9 | 1.0 | 1.6 | 1.0 | 0.7 | 2.3 |

Example B1

In Example B1, an optical filter having a base material formed of a transparent resin substrate was prepared according to the following procedures and conditions.

Figure 8:
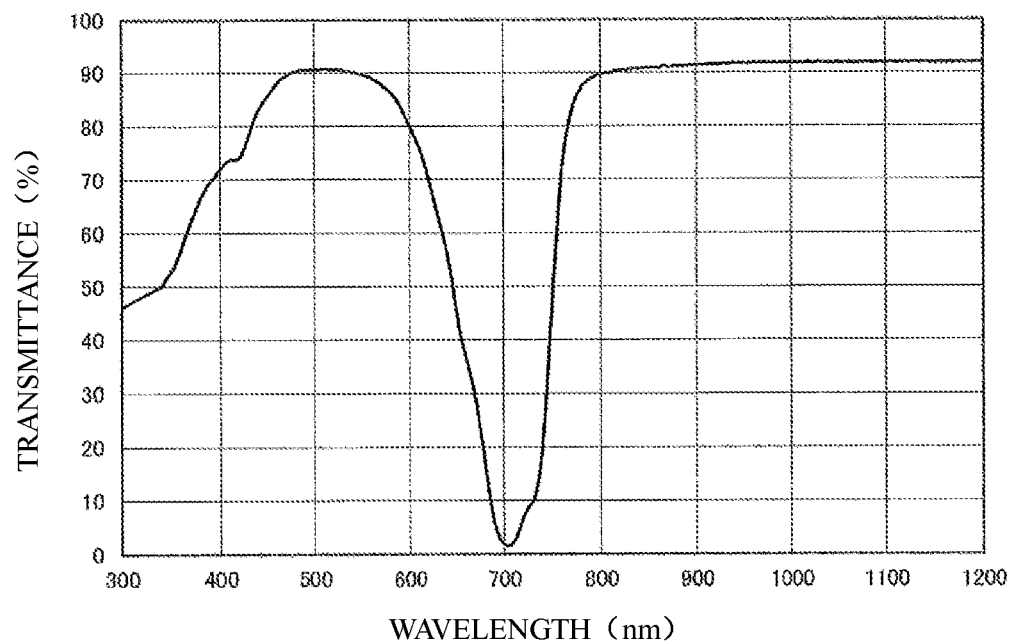
FIG. 8 is a graph showing a spectral transmittance of a base material formed of a transparent resin substrate in Example B1.

In a container, a solution with a resin concentration of 20 weight % was prepared by adding 100 parts of the resin A obtained in the resin synthesis example 1, 0.03 parts of a compound (a-1) (a maximum absorption wavelength of 698 nm in dichloromethane) represented by the following Formula (a-1) as the compound (A), 0.03 parts of a compound (a-2) (a maximum absorption wavelength of 733 nm in dichloromethane) represented by the following Formula (a-2) and methylene chloride. The obtained solution was cast on a smooth glass plate and dried at 20° C. for 8 hours, and a coating film was then separated from the glass plate. The separated coating film was additionally dried at 100° C. for 8 hours under reduced pressure, and thereby a base material formed of a transparent resin substrate with a thickness of 0.1 mm, a length of 60 mm and a width of 60 mm was obtained. The spectral transmittance of the base material was measured. In a wavelength range of 600 nm or more and less than 750 nm, the lowest transmittance (Ta) measured in the direction perpendicular to the optical filter was obtained. In a wavelength range of 600 nm or more, the shortest wavelength (Xc) at which the transmittance measured in the direction perpendicular to the base material changed from more than 50% to 50% or less was obtained. The results are shown in FIG. 8 and Table 13.

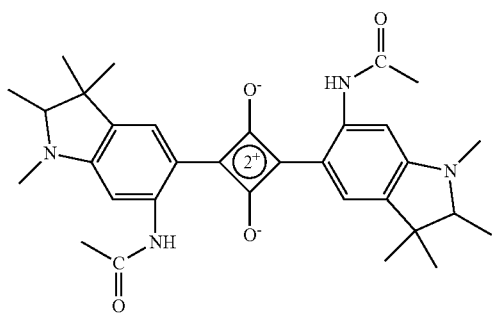

(a-1)

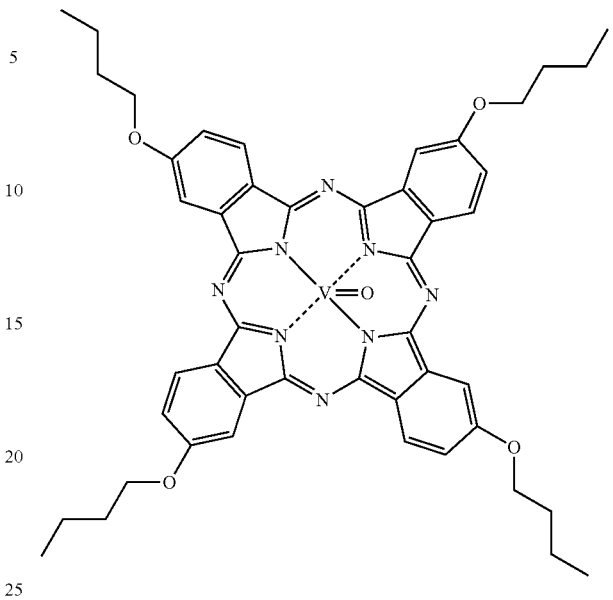

(a-2)

Subsequently, a dielectric multilayer film (I) was formed on one surface of the obtained base material, and additionally, a dielectric multilayer film (II) was formed on the other surface of the base material, and thereby an optical filter with a thickness of about 0.104 mm was obtained.

The dielectric multilayer film (I) was obtained by alternately laminating silica ($SiO_2$) layers and titania ($TiO_2$) layers at a vapor deposition temperature of 100° C. (total number of layers of 26). The dielectric multilayer film (II) was obtained by alternately laminating silica ($SiO_2$) layers and titania ($TiO_2$) layers at a vapor deposition temperature of 100° C. (total number of layers of 20). In both the dielectric multilayer films (I) and (II), the silica layers and the titania layers were alternately laminated in the order of titania layer, silica layer, titania layer, . . . silica layer, titania layer, and silica layer from the side of the base material, and the outermost layer of the optical filter was a silica layer. The dielectric multilayer films (I) and (II) were designed as follows.

The thickness and the number of layers were optimized using optical thin film design software (Essential Macleod commercially available from Thin Film Center) according to wavelength dependent characteristics of a base material refractive index at which an antireflection effect in a visible range and selective transmission and reflection performance in a near infrared range could be achieved and absorption characteristics of the compound (A) and the like applied. When optimization was performed, in the present example, software input parameters (Target value) were set as shown in the following Table 12.

TABLE 12

| Dielectric multilayer film | Wavelength (nm) | Software input parameters | | | |
|---|---|---|---|---|---|
| | | Incident angle | Required value | Target tolerance | Type |
| (I) | 390 to 700 | 0 | 100 | 1 | Transmittance |
| | 705 to 900 | 0 | 0 | 1 | Transmittance |
| | 905 to 950 | 0 | 0 | 0.5 | Transmittance |
| (II) | 410 to 700 | 0 | 100 | 1 | Transmittance |
| | 950 to 1,100 | 0 | 0 | 1 | Transmittance |
| | 1,105 to 1,200 | 0 | 0 | 0.5 | Transmittance |

Figure 9:
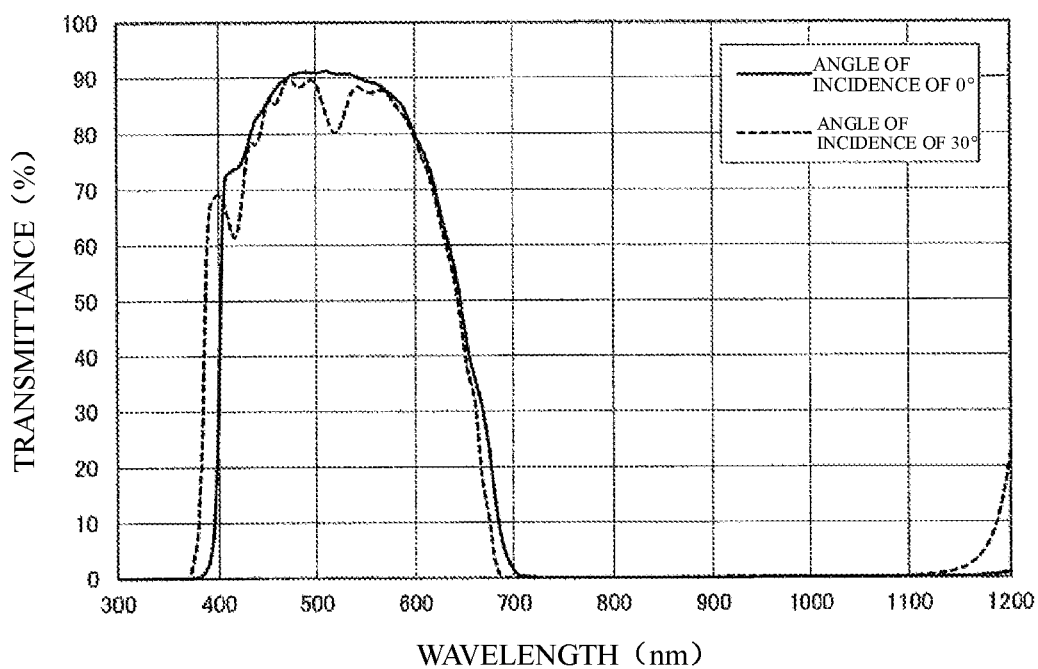
FIG. 9 is a graph showing spectral transmittances measured in a direction perpendicular to an optical filter obtained in Example B1 and at an angle of 30° with respect to the perpendicular direction.
Figure 15:
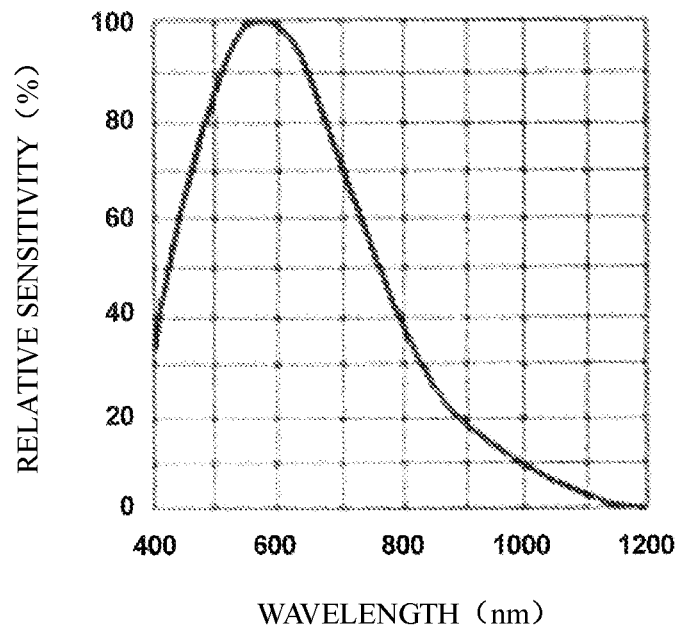
FIG. 15 is a graph showing an example of spectral sensitivity characteristics of an illuminance sensor.
Figure 16:
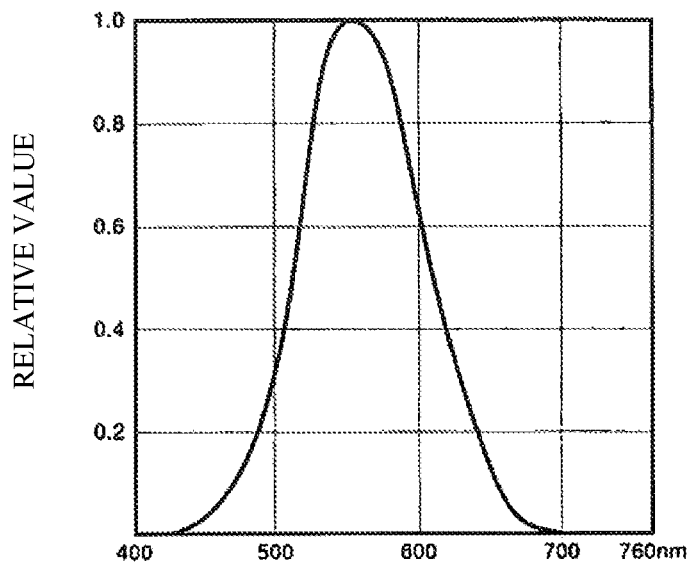
FIG. 16 is a graph showing human vision sensitivity characteristics.

Spectral transmittances were measured in the direction perpendicular to the obtained optical filter and at an angle of 30° with respect to the perpendicular direction, and optical characteristics in wavelength ranges were evaluated. The results are shown in FIG. 9 and Table 13. An average value of transmittance at a wavelength of 430 to 580 nm was 90%, an average value of transmittance at a wavelength of 800 to 1,000 nm was 1% or less, and an absolute value |Xa–Xb| was 3 nm. In addition, FIG. 15 shows spectral sensitivity characteristics of a general illuminance sensor and FIG. 16 shows human vision sensitivity characteristics. As can be understood from FIG. 9 and Table 13, the obtained optical filter had less change in optical characteristics according to an incident angle and was able to cut near infrared rays at a wavelength of 700 nm or more. Therefore, when the present optical filter was provided on an upper part (light incident side) of the illuminance sensor, light incident on the illuminance sensor was able to become light that was close to that for human vision sensitivity characteristics regardless of an incident angle, and a high sensor sensitivity characteristic was obtained.

Example B2

In Example B2, an optical filter having a base material formed of a transparent resin substrate having a resin layer on both surfaces was prepared according to the following procedures and conditions.

In Example B1, a base material formed of a transparent resin substrate containing the compound (A) was obtained in the same procedures and conditions as in Example B1 except that 0.03 parts of a compound (a-3) (maximum absorption wavelength of 703 nm in dichloromethane) represented by the following Formula (a-3) and 0.07 parts of a compound (a-4) (maximum absorption wavelength of 736 nm in dichloromethane) represented by the following Formula (a-4) were used as the compound (A).

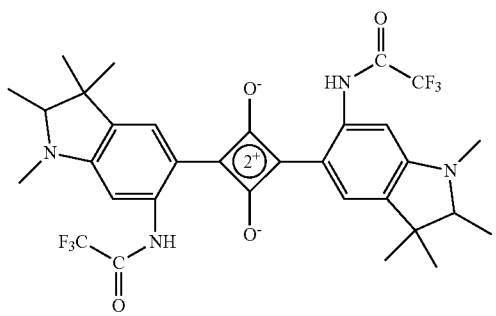

(a-3)

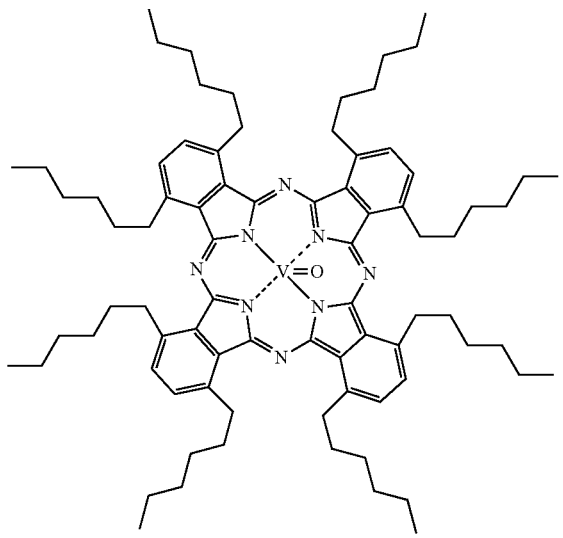

(a-4)

Figure 10:
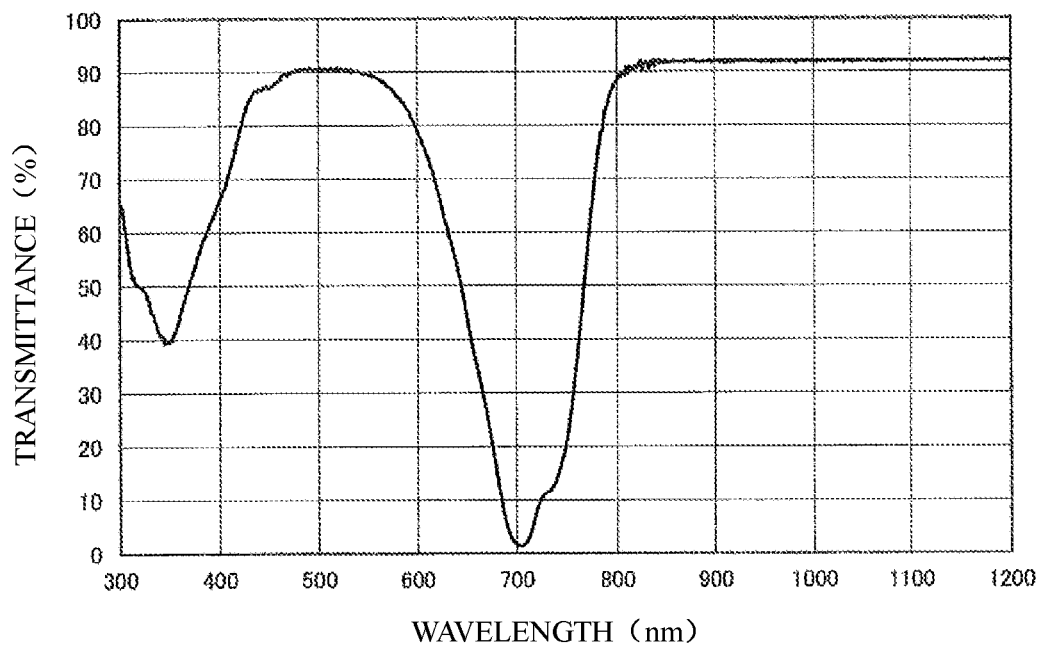
FIG. 10 is a graph showing a spectral transmittance of a base material formed of a transparent resin substrate in Example B2.

A resin composition (G-1) having the following composition was applied to one surface of the obtained transparent resin substrate using a bar coater and heated in an oven at 70° C. for 2 minutes, and the solvent was volatilized and removed. In this case, coating conditions of the bar coater were adjusted so that the thickness after drying was 2 μm. Next, exposing (exposure amount of 500 mJ/cm², 200 mW) was performed using a conveyor type exposure machine, the resin composition (G-1) was cured, and a resin layer was formed on the transparent resin substrate. Similarly, a resin layer made of the resin composition (G-1) was formed on the other surface of the transparent resin substrate, and thereby a base material having the resin layer on both surfaces of the transparent resin substrate containing the compound (A) was obtained. The spectral transmittance of the base material was measured, and (Ta) and (Xc) were obtained. The results are shown in FIG. 10 and Table 13.

Resin composition (G-1): 60 parts by weight of tricyclodecanedimethanol acrylate, 40 parts by weight of dipentaerythritol hexaacrylate, 5 parts by weight of 1-hydroxycyclohexyl phenyl ketone, and methyl ethyl ketone (solvent, solid content concentration (TSC): 30%).

Subsequently, in the same manner as in Example B1, a dielectric multilayer film (total number of layers of 26) obtained by alternately laminating silica (SiO₂) layers and titania (TiO₂) layers was formed on one surface of the obtained base material, and additionally, a dielectric multilayer film (total number of layers of 20) obtained by alternately laminating silica (SiO₂) layers and titania (TiO₂)

layers was formed on the other surface of the base material, and thereby an optical filter with a thickness of about 0.104 mm was obtained. The dielectric multilayer film was designed using the same design parameters as in Example B1 in consideration of wavelength dependence of a base material refractive index. The spectral transmittance of the obtained optical filter was measured and optical characteristics in wavelength ranges were evaluated. The results are shown in FIG. 11 and Table 13.

Figure 11:
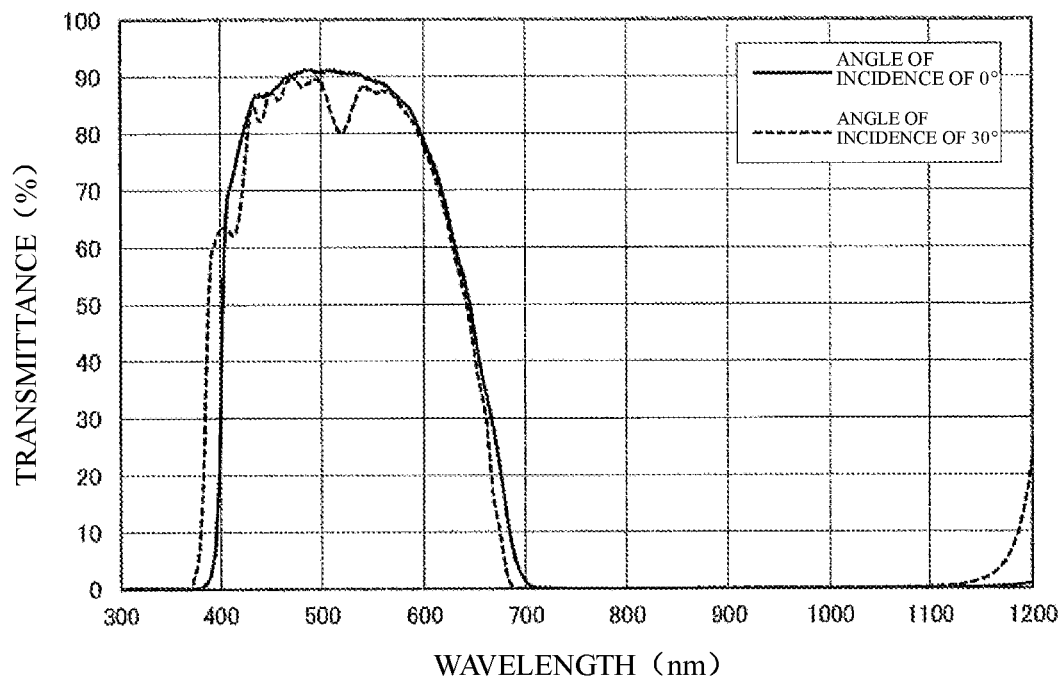
FIG. 11 is a graph showing spectral transmittances measured in a direction perpendicular to an optical filter obtained in Example B2 and at an angle of 30° with respect to the perpendicular direction.

As can be understood from FIG. 11 and Table 13, the obtained optical filter had less change in optical characteristics according to an incident angle and was able to cut near infrared rays at a wavelength of 700 nm or more. Therefore, when the present optical filter was provided on an upper part (light incident side) of the illuminance sensor, light incident on the illuminance sensor was able to become light that was close to that for human vision sensitivity characteristics regardless of an incident angle, and a high sensor sensitivity characteristic was obtained.

Example B3

In Example B3, an optical filter having a base material formed of a near infrared absorbing glass substrate was prepared according to the following procedures and conditions.

A dielectric multilayer film (total number of layers of 26) obtained by alternately laminating silica ($SiO_2$) layers and titania ($TiO_2$) layers was formed on one surface of the base material, and additionally, a dielectric multilayer film (total number of layers of 20) obtained by alternately laminating silica ($SiO_2$) layers and titania ($TiO_2$) layers was formed on the other surface of the base material, and thereby an optical filter with a thickness of about 0.216 mm was obtained in the same manner as in Example B1 except that a near infrared absorbing glass substrate "BS-6" (thickness of 210 μm, commercially available from Matsunami Glass Ind., Ltd.) was used as a base material. The dielectric multilayer film was designed using the same design parameters as in Example B1 in consideration of wavelength dependence of a base material refractive index. The spectral transmittance of the optical filter was measured and optical characteristics in wavelength ranges were evaluated. The results are shown in FIG. 12 and Table 13.

Figure 12:
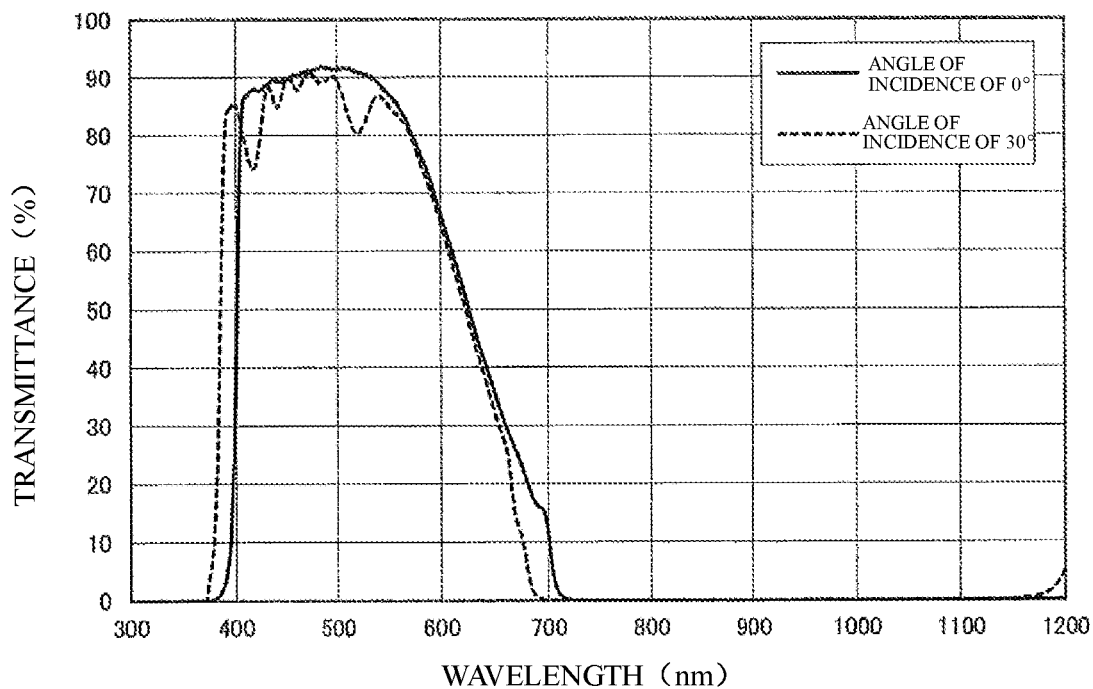
FIG. 12 is a graph showing spectral transmittances measured in a direction perpendicular to an optical filter obtained in Example B3 and at an angle of 30° with respect to the perpendicular direction.

As can be understood from FIG. 12 and Table 13, the obtained optical filter had lower incident angle dependence in a range of 650 to 700 nm than the optical filters of Example B1 and Example B2, and had less change in optical characteristics according to an incident angle, and was able to cut near infrared rays at a wavelength of 700 nm or more. Therefore, when the present optical filter was provided on an upper part (light incident side) of the illuminance sensor, light incident on the illuminance sensor was able to become light that was close to that for human vision sensitivity characteristics regardless of an incident angle, and a high sensor sensitivity characteristic was obtained.

Example B4

In Example B4, an optical filter having a base material formed of a transparent glass substrate having a transparent resin layer containing the compound (A) on one surface was prepared according to the following procedures and conditions.

A resin composition (G-2) having the following composition was applied to a transparent glass substrate "OA-10G" (thickness of 200 μm, commercially available from Nippon Electric Glass Co., Ltd.) that was cut to a size of 60 mm in length and 60 mm in width using a spin coater, and heated on a hot plate at 80° C. for 2 minutes, and the solvent was volatilized and removed. In this case, coating conditions of the spin coater were adjusted so that the thickness after drying was 2 m. Next, exposing (exposure amount of 500 mJ/cm², 200 mW) was performed using a conveyor type exposure machine, the resin composition (G-2) was cured, and a base material formed of a transparent glass substrate having the transparent resin layer containing the compound (A) was obtained. The spectral transmittance of the base material was measured, and (Ta) and (Xc) were obtained. The results are shown in Table 13.

Resin composition (G-2): 20 parts by weight of tricyclodecanedimethanol acrylate, 80 parts by weight of dipentaerythritol hexaacrylate, 4 parts by weight of 1-hydroxycyclohexyl phenyl ketone, 1.5 parts by weight of compound (a-1), 1.5 parts by weight of compound (a-2), methyl ethyl ketone (solvent, TSC: 35%)

Subsequently, in the same manner as in Example B1, a dielectric multilayer film (total number of layers of 26) obtained by alternately laminating silica ($SiO_2$) layers and titania ($TiO_2$) layers was formed on one surface of the obtained base material, and additionally, a dielectric multilayer film (total number of layers of 20) obtained by alternately laminating silica ($SiO_2$) layers and titania ($TiO_2$) layers was formed on the other surface of the base material, and thereby an optical filter with a thickness of about 0.108 mm was obtained. The dielectric multilayer film was designed using the same design parameters as in Example B1 in consideration of wavelength dependence of a base material refractive index and the like as in Example B1. The spectral transmittance of the optical filter was measured and optical characteristics in wavelength ranges were evaluated. The results are shown in Table 13.

As can be understood from Table 13, the obtained optical filter had less change in optical characteristics according to an incident angle and was able to cut near infrared rays at a wavelength of 700 nm or more. Therefore, when the present optical filter was provided on an upper part (light incident side) of the illuminance sensor, light incident on the illuminance sensor was able to become light that was close to that for human vision sensitivity characteristics regardless of an incident angle, and a high sensor sensitivity characteristic was obtained.

Examples B5 to B7

Base materials and optical filters were prepared in the same manner as in Example B2 except that a transparent resin type and the compound (A) were changed as shown in Table 13. Optical characteristics of the obtained base material and optical filter are shown in Table 13.

As can be understood from Table 13, the optical filters obtained in Examples B5 to B7, had less change in optical characteristics according to an incident angle and were able to cut near infrared rays at a wavelength of 700 run or more. Therefore, when the present optical filter was provided on an upper part (light incident side) of the illuminance sensor, light incident on the illuminance sensor was able to become light that was close to that for human vision sensitivity characteristics regardless of an incident angle, and a high sensor sensitivity characteristic was obtained.

Comparative Example B1

In Example B1, a base material and an optical filter were prepared in the same manner as in Example B1 except that no compound (A) was used. Optical characteristics of the obtained optical filter are shown in FIG. 13 and Table 13.

Figure 13:
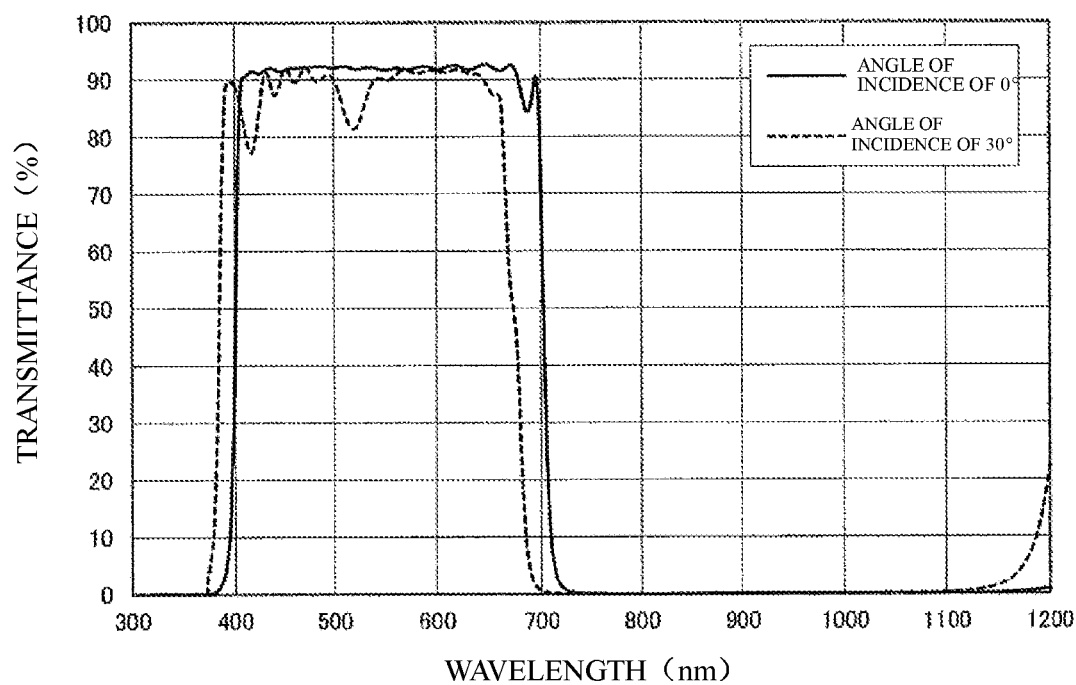
FIG. 13 is a graph showing spectral transmittances measured in a direction perpendicular to an optical filter obtained in Comparative Example B1 and at an angle of 30° with respect to the perpendicular direction.

As can be understood from FIG. 13 and Table 13, the obtained optical filter had greater change in optical characteristics according to an incident angle. When the present optical filter was provided on an upper part (light incident side) of the illuminance sensor, optical characteristics of light incident on the illuminance sensor varied according to the incident angle. Therefore, there was an error with respect to human vision sensitivity characteristics, and low sensor sensitivity characteristic were obtained.

Comparative Example B2

An optical filter was prepared in the same manner as in Example B1 except that a transparent glass substrate "OA-10G" (thickness of 200 μm, commercially available from Nippon Electric Glass Co., Ltd.) was used in place of a transparent resin base material. Optical characteristics of the obtained optical filter are shown in Table 13.

The obtained optical filter had greater change in optical characteristics according to an incident angle. When the present optical filter was provided on an upper part (light incident side) of the illuminance sensor, optical characteristics of light incident on the illuminance sensor varied according to the incident angle. Therefore, there was an error with respect to human vision sensitivity characteristics, and low sensor sensitivity characteristics were obtained.

Comparative Example B3

In Example B1, a base material and an optical filter were prepared in the same manner as in Example B1 except that no compound (A) was used, a dielectric multilayer film (total number of layers of 6) obtained by alternately laminating silica ($SiO_2$) layers and titania ($TiO_2$) layers at a vapor deposition temperature of 100° C. was used in place of the dielectric multilayer film (I), and a dielectric multilayer film (total number of layers of 6) obtained by alternately laminating silica ($SiO_2$) layers and titania ($TiO_2$) layers at a vapor deposition temperature of 100° C. was used in place of the dielectric multilayer film (II). Optical characteristics of the obtained optical filter are shown in FIG. 14 and Table 13.

Figure 14:
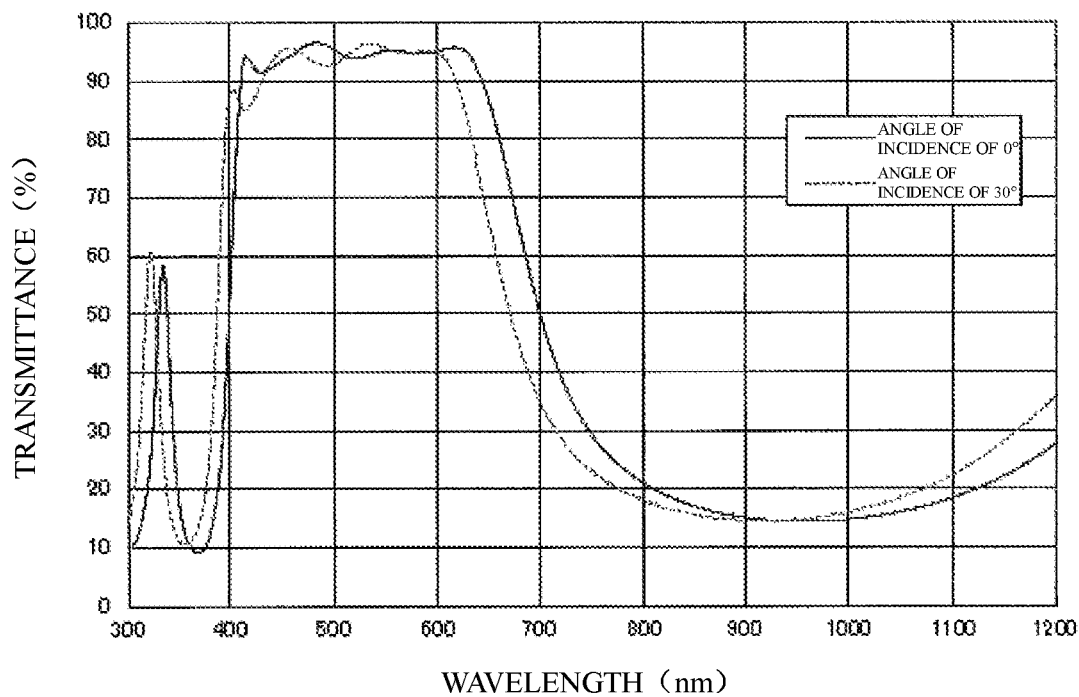
FIG. 14 is a graph showing spectral transmittances measured in a direction perpendicular to an optical filter obtained in Comparative Example B3 and at an angle of 30° with respect to the perpendicular direction.

As can be understood from FIG. 14 and Table 13, the obtained optical filters had greater change in optical characteristics according to an incident angle. When the present optical filters were provided on an upper part (light incident side) of the illuminance sensor, optical characteristics of light incident on the illuminance sensor varied according to the incident angle. Therefore, there was an error with respect to human vision sensitivity characteristics, and low sensor sensitivity characteristics were obtained. In addition, since the obtained optical filters had a high transmittance at 800 to 1,000 nm, insufficient near infrared rays were cut by the optical filter. When the present optical filters were placed on an upper part of the illuminance sensor, since the incident light deviated significantly from that for human vision sensitivity characteristics, an erroneous operation of the illuminance sensor was caused.

The configuration of the base materials, various compounds, and the like applied to the examples and comparative examples were as follows.
<Forms of Base Materials>
Form (1): transparent resin substrate containing the compound (A)
Form (2): resin layer was provided on both surfaces of the transparent resin substrate containing the compound (A)
Form (3): near infrared absorbing glass substrate
Form (4): transparent resin layer containing the compound (A) was provided on one surface of the glass substrate
Form (5): transparent resin substrate containing no compound (A) (comparative example)
Form (6): glass substrate (comparative example)
<Transparent Resins>
Resin A: cyclic olefin resin (resin synthesis example 1)
Resin D: aromatic polyether resin (resin synthesis example 4)
Resin E: polyimide resin (resin synthesis example 5)
Resin F: cyclic olefin resin "ZEONOR 1420R" (commercially available from Zeon Corporation)
<Glass Substrates>
Glass substrate (1): near infrared absorbing glass substrate "BS-6" (thickness of 210 μm, commercially available from Matsunami Glass Ind., Ltd.) cut to size of 60 mm in length and 60 mm in width
Glass substrate (2): transparent glass substrate "OA-10G" (thickness of 200 μm, commercially available from Nippon Electric Glass Co., Ltd.) cut to size of 60 mm in length and 60 mm in width
<Near Infrared Absorbing Dye>
<<Compounds (A)>>
Compound (a-1): the above compound (a-1) (maximum absorption wavelength of 698 nm in dichloromethane)
Compound (a-2): the above compound (a-2) (maximum absorption wavelength of 733 nm in dichloromethane)
Compound (a-3): the above compound (a-3) (maximum absorption wavelength of 703 nm in dichloromethane)
Compound (a-4): the above compound (a-4) (maximum absorption wavelength of 736 nm in dichloromethane)
<Solvents>
Solvent (1): methylene chloride
Solvent (2): N,N-dimethylacetamide
Solvent (3): cyclohexane/xylene (weight ratio: 7/3)

The (transparent) resin substrate drying conditions in the examples and comparative examples in Table 13 were as follows. Here, before drying under reduced pressure, the coating film was separated from the glass plate.
<Film Drying Conditions>
Condition (1): 20° C./8 hr→under reduced pressure 100° C./8 hr
Condition (2): 60° C./8 hr→80° C./8 hr→under reduced pressure 140° C./8 hr
Condition (3): 60° C./8 hr→80° C./8 hr→under reduced pressure 100° C./24 hr

TABLE 13

| | | | | Example B1 | Example B2 | Example B3 | Example B4 | Example B5 | Example B6 |
|---|---|---|---|---|---|---|---|---|---|
| Configuration of base material | Form of base material | | | (1) | (2) | (3) | (4) | (2) | (2) |
| | Composition of transparent resin substrate or transparent | Transparent resin (parts by weight) | Resin A | 100 | 100 | | | | |
| | | | Resin D | | | | | 100 | |
| | | | Resin E | | | | | | 100 |
| | | | Resin F | | | | | | |

TABLE 13-continued

| | | | | | | | | | |
|---|---|---|---|---|---|---|---|---|---|
| | resin layer | Transparent resin layer (parts by weight) | Composition (G-2) | | | | 104 | | |
| | | Compound (A) (parts by weight) | a-1 | 0.03 | | | 1.5 | 0.03 | 0.03 |
| | | | a-2 | 0.03 | | | 1.5 | 0.03 | 0.03 |
| | | | a-3 | | 0.03 | | | | |
| | | | a-4 | | 0.07 | | | | |
| | | Solvent | | (1) | (1) | — | — | (2) | (2) |
| | Drying conditions | | | (1) | (1) | — | — | (2) | (2) |
| | Glass substrate | | | — | — | (1) | (2) | — | — |
| | Composition for forming (transparent) resin layer | | | — | (G-1) | — | — | (G-1) | (G-1) |
| Optical characteristics of base material | Ta(%) | | | 2 | 1 | 10 | 2 | 1 | 1 |
| | Xc(nm) | | | 646 | 645 | 625 | 645 | 642 | 641 |
| Dielectric multilayer film (on both surfaces in configuration) | | Number of one surface layers | | 26 | 26 | 26 | 26 | 26 | 26 |
| | | Number of one surface layers | | 20 | 20 | 20 | 20 | 20 | 20 |
| Optical characteristics of optical filter | Average value of transmittance in wavelength of 430 to 580 nm (%) | | | 90 | 90 | 90 | 89 | 89 | 89 |
| | Average value of transmittance in wavelength of 800 to 1,000 nm (%) | | | 1% or less | 1% or less | 1% or less | 1% or less | 1% or less | 1% or less |
| | \|Xa − Xb\| (nm) | | | 3 | 3 | 3 | 4 | 3 | 4 |
| Illuminance sensor sensitivity characteristics | | | | A | A | A | A | A | A |

| | | | | Example B7 | Comparative Example B1 | Comparative Example B2 | Comparative Example B3 |
|---|---|---|---|---|---|---|---|
| Configuration of base material | Form of base material | | | (2) | (5) | (6) | (5) |
| | Composition of transparent resin substrate or transparent resin layer | Transparent resin (parts by weight) | Resin A | | 100 | | 100 |
| | | | Resin D | | | | |
| | | | Resin E | | | | |
| | | | Resin F | 100 | | | |
| | | Transparent resin layer (parts by weight) | Composition (G-2) | | | | |
| | | Compound (A) (parts by weight) | a-1 | 0.03 | | | |
| | | | a-2 | 0.03 | | | |
| | | | a-3 | | | | |
| | | | a-4 | | | | |
| | | Solvent | | (3) | (1) | — | (1) |
| | Drying conditions | | | (3) | (1) | — | (1) |
| | Glass substrate | | | — | — | (2) | — |
| | Composition for forming (transparent) resin layer | | | (G-1) | — | — | — |
| Optical characteristics of base material | Ta(%) | | | 2 | 91 | 91 | 91 |
| | Xc(nm) | | | 647 | — | — | — |
| Dielectric multilayer film (on both surfaces in configuration) | | Number of one surface layers | | 26 | 26 | 26 | 6 |
| | | Number of one surface layers | | 20 | 20 | 20 | 6 |
| Optical characteristics of optical filter | Average value of transmittance in wavelength of 430 to 580 nm (%) | | | 90 | 92 | 91 | 94 |
| | Average value of transmittance in wavelength of 800 to 1,000 nm (%) | | | 1% or less | 1% or less | 1% or less | 16% |
| | \|Xa − Xb\| (nm) | | | 3 | 28 | 29 | 29 |
| Illuminance sensor sensitivity characteristics | | | | A | B | B | C |

The invention claimed is:

1. An optical filter that includes a base material (i) having a light absorbing layer and transmits visible light, wherein the light absorbing layer contains a compound (S) that has a maximum absorption in a wavelength range of 750 to 1,095 nm and a compound (A) that has a maximum absorption in a wavelength range of 650 to 750 nm, wherein a weight ratio of compound (S) to compound (A) is in a range of 2.83:1 to 8.49:1, and has a maximum absorption in a wavelength range of 650 to 1,095 nm, and wherein, in a wavelength range of 850 to 1,050 nm, an average optical density value measured in a direction perpendicular to the optical filter is 2.0 or more, and an average optical density value measured at an angle of 60° with respect to the direction perpendicular to the optical filter is 2.0 or more.

2. The optical filter according to claim 1,
wherein, in a wavelength range of 430 to 580 nm, an average value of transmittance measured in the direction perpendicular to the optical filter is 30% or more and 80% or less.

3. The optical filter according to claim 1,
wherein the compound (S) is at least one compound selected from the group consisting of a squarylium compound, a phthalocyanine compound, a naphthalocyanine compound, a croconium compound, a cyanine compound, a diimmonium compound, a metal dithiolate compound, a copper phosphate complex-based compound and a pyrrolopyrrole compound.

4. The optical filter according to claim 1,
wherein, in a wavelength range of 850 to 1,050 nm, an average optical density value measured in a direction perpendicular to the base material (i) is 1.0 or more.

5. The optical filter according to claim 1,
wherein the compound (A) is at least one compound selected from the group consisting of a squarylium compound, a phthalocyanine compound, a naphthalocyanine compound, a croconium compound and a cyanine compound.

6. The optical filter according to claim 1,
wherein the light absorbing layer contains at least one resin selected from the group consisting of a cyclic polyolefin resin, an aromatic polyether resin, a polyimide resin, a fluorene polycarbonate resin, a fluorene polyester resin, a polycarbonate resin, a polyamide resin, a polyarylate resin, a polysulfone resin, a polyethersulfone resin, a polyparaphenylene resin, a polyamide imide resin, a polyethylene naphthalate resin, a fluorinated aromatic polymer resin, a (modified) acrylic resin, an epoxy resin, an allyl ester curable resin, a silsesquioxane ultraviolet curable resin, an acrylic ultraviolet curable resin, a vinyl ultraviolet curable resin and a resin containing silica formed by a sol-gel method as a main component.

7. The optical filter according to claim 1,
wherein a dielectric multilayer film is provided on at least one surface of the base material (i).

8. The optical filter according to claim 1,
wherein the optical filter is for an ambient light sensor.

9. An ambient light sensor comprising the optical filter according to claim 1.

10. An ambient light sensor comprising:
a photoelectric conversion element configured to generate a photocurrent according to light incident on a light receiving surface and measure an illuminance and a color temperature; and
the optical filter according to claim 1 that is disposed on the side of the light receiving surface of the photoelectric conversion element.

11. The ambient light sensor according to claim 10, further comprising
a proximity sensor that includes a light emitting element configured to emit near infrared rays and a second photoelectric conversion element configured to detect near infrared rays.

12. The ambient light sensor according to claim 9, further comprising a light scattering film.

13. A sensor module comprising the optical filter according to claim 1.

14. An electronic device comprising the ambient light sensor according to claim 9.

15. The ambient light sensor according to claim 10, further comprising a light scattering film.

16. An electronic device comprising the ambient light sensor according to claim 10.

17. An ambient light sensor comprising:
a photoelectric conversion element configured to generate a photocurrent according to light incident on a light receiving surface and measure an illuminance and a color temperature; and
an optical filter that is disposed on the side of the light receiving surface of the photoelectric conversion element,
wherein the optical filter includes a near infrared absorbing layer and a near infrared reflective layer,
wherein the near infrared absorbing layer contains a compound (S) that has a maximum absorption in a wavelength range of 750 to 1,095 nm and a compound (A) that has a maximum absorption in a wavelength range of 650 to 750 nm, and
a weight ratio of compound (S) to compound (A) is in a range of 2.83:1 to 8.49:1.

18. The ambient light sensor according to claim 17,
wherein the near infrared absorbing layer is a resin layer containing a near infrared absorbing dye.

19. The ambient light sensor according to claim 18,
wherein a resin of the resin layer contains at least one resin selected from the group consisting of a cyclic polyolefin resin, an aromatic polyether resin, a polyimide resin, a fluorene polycarbonate resin, a fluorene polyester resin, a polycarbonate resin, a polyamide resin, a polyarylate resin, a polysulfone resin, a polyethersulfone resin, a polyparaphenylene resin, a polyamide imide resin, a polyethylene naphthalate resin, a fluorinated aromatic polymer resin, a (modified) acrylic resin, an epoxy resin, an allyl ester curable resin, a silsesquioxane ultraviolet curable resin, an acrylic ultraviolet curable resin, a vinyl ultraviolet curable resin and a resin containing silica formed by a sol-gel method as a main component.

20. The ambient light sensor according to claim 17,
wherein the near infrared absorbing layer is a fluorophosphate glass layer or a phosphate glass layer that contains a copper component.

21. The ambient light sensor according to claim 17,
wherein the optical filter includes a glass substrate, and the near infrared absorbing layer is provided on at least one surface of the glass substrate.

22. The ambient light sensor according to claim 17,
wherein the optical filter includes a resin substrate and the near infrared absorbing layer is provided on at least one surface of the resin substrate.

23. The ambient light sensor according to claim 17,
wherein the near infrared reflective layer is a dielectric multilayer film.

24. The ambient light sensor according to claim 17, in which the optical filter has a transmittance that satisfies the following conditions (A) to (C):
(A) in a wavelength range of 430 to 580 nm, an average value of transmittance measured in a direction perpendicular to the optical filter is 50% or more;
(B) in a wavelength range of 800 to 1,000 nm, an average value of transmittance measured in the direction perpendicular to the optical filter is 15% or less; and
(C) in a wavelength range of 560 to 800 nm, an absolute value |Xa−Xb| of a difference between a value Xa of a wavelength at which a transmittance measured in the direction perpendicular to the optical filter becomes 50% and a value Xb of a wavelength at which a transmittance measured at an angle of 30° with respect to the direction perpendicular to the optical filter becomes 50% is less than 20 nm.

25. The ambient light sensor according to claim 17, wherein the optical filter has a structure in which the near infrared reflective layer and the near infrared absorbing layer are disposed in that order from the side of a light incident surface.

26. The ambient light sensor according to claim 17, wherein the near infrared absorbing layer has a maximum absorption in a wavelength range of 650 to 1,095 nm, and wherein, in a wavelength range of 850 to 1,050 nm, an average optical density value measured in the direction perpendicular to the optical filter is 2.0 or more, and an average optical density value measured at an angle of 60° with respect to the direction perpendicular to the optical filter is 2.0 or more.

27. The ambient light sensor according to claim 17, further comprising a proximity sensor that includes a light emitting element configured to emit near infrared rays and a second photoelectric conversion element configured to detect near infrared rays.

28. The ambient light sensor according to claim 17, further comprising a light scattering film.

29. An electronic device comprising the ambient light sensor according to claim 17.

* * * * *